(12) United States Patent
Hidaka

(10) Patent No.: US 6,404,661 B2
(45) Date of Patent: *Jun. 11, 2002

(54) SEMICONDUCTOR STORAGE DEVICE HAVING ARRANGEMENT FOR CONTROLLING ACTIVATION OF SENSE AMPLIFIERS

(75) Inventor: Hideto Hidaka, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/464,793

(22) Filed: Dec. 16, 1999

Related U.S. Application Data

(62) Division of application No. 09/197,764, filed on Nov. 23, 1998, now Pat. No. 6,104,630, which is a division of application No. 08/650,538, filed on May 20, 1996, now Pat. No. 5,867,440.

(30) Foreign Application Priority Data

Jun. 8, 1995 (JP) .............................................. 7-142279
Oct. 30, 1995 (JP) .............................................. 7-281874

(51) Int. Cl.[7] ................................................. G11C 5/06
(52) U.S. Cl. ........................... 365/63; 365/51; 365/205; 365/207
(58) Field of Search ........................... 365/63, 51, 207, 365/189.01, 205

(56) References Cited

U.S. PATENT DOCUMENTS

| | | | |
|---|---|---|---|
| RE32,993 E | 7/1989 | Anami et al. | 365/230.06 |
| RE33,280 E | 7/1990 | Yoshimoto et al. | 365/230.06 |
| 5,231,607 A | 7/1993 | Yoshida et al. | 365/226 |
| 5,293,559 A | 3/1994 | Kim et al. | 365/63 |
| 5,321,646 A | 6/1994 | Tomishima et al. | 365/51 |
| 5,325,336 A | 6/1994 | Tomishima et al. | 365/207 |
| 5,416,748 A | 5/1995 | Fujita | 365/230.06 |
| 5,581,508 A | 12/1996 | Sasaki et al. | 365/200 |
| 5,708,620 A | 1/1998 | Jeong | 365/230.06 |
| 5,719,815 A * | 2/1998 | Takahashi et al. | 365/222 |

FOREIGN PATENT DOCUMENTS

JP 4-212454 8/1992

* cited by examiner

*Primary Examiner*—Hoai V. Ho
(74) *Attorney, Agent, or Firm*—McDermott, Will & Emery

(57) ABSTRACT

A memory cell array includes a plurality of memory cells that are arranged in the row and column directions. Power supply lines and grounding lines are arranged on the memory cell array so as to extend in the column direction. The grounding lines are so arrayed that a plurality of power supply lines are interposed therebetween or, conversely, the power supply lines are so arranged that a plurality of grounding lines are interposed therebetween. By connecting together adjacent power supply lines (or grounding lines) of the same potential on a column decoder to form a single power line, the number of power supply lines extending in the column direction on the column decoder can be reduced, whereby an effective element forming region of the column decoder can be expanded.

4 Claims, 44 Drawing Sheets

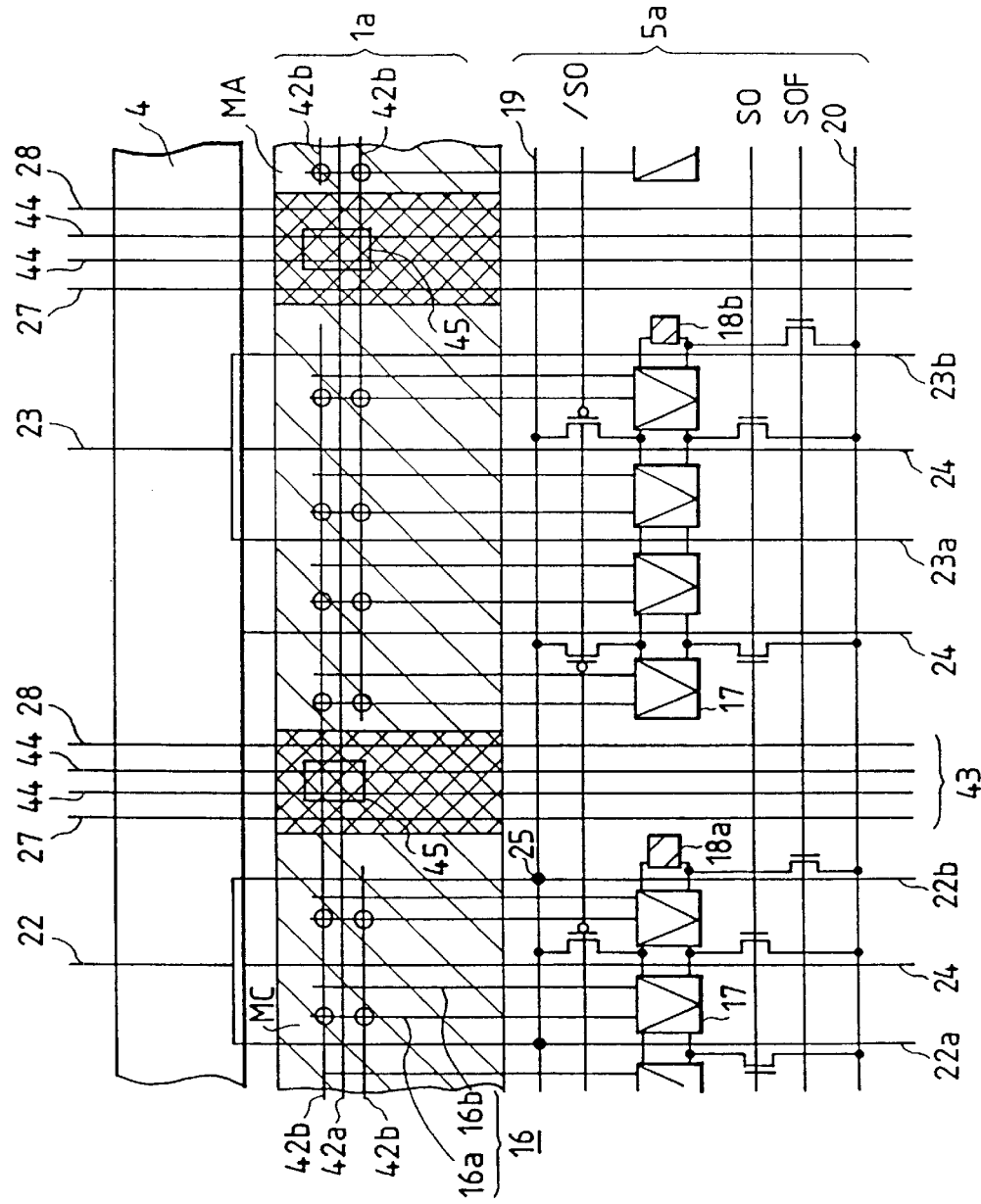

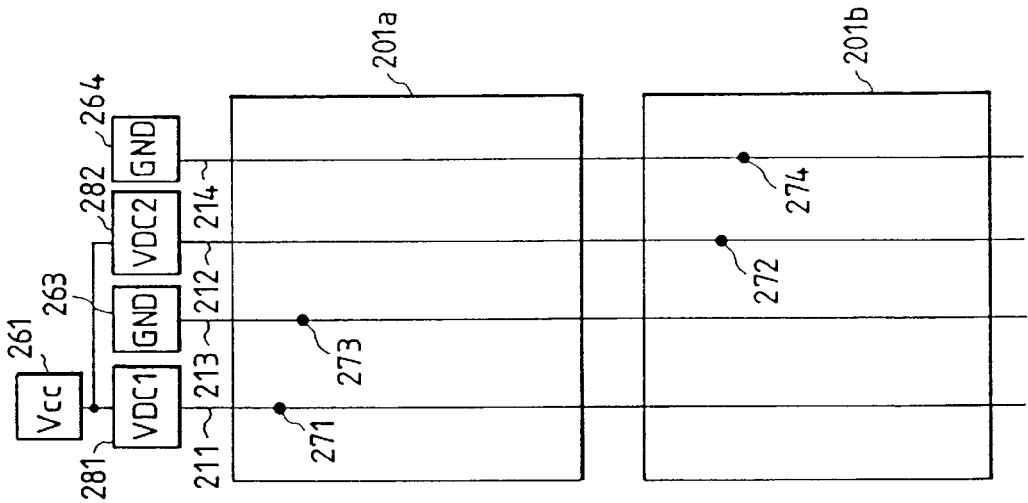
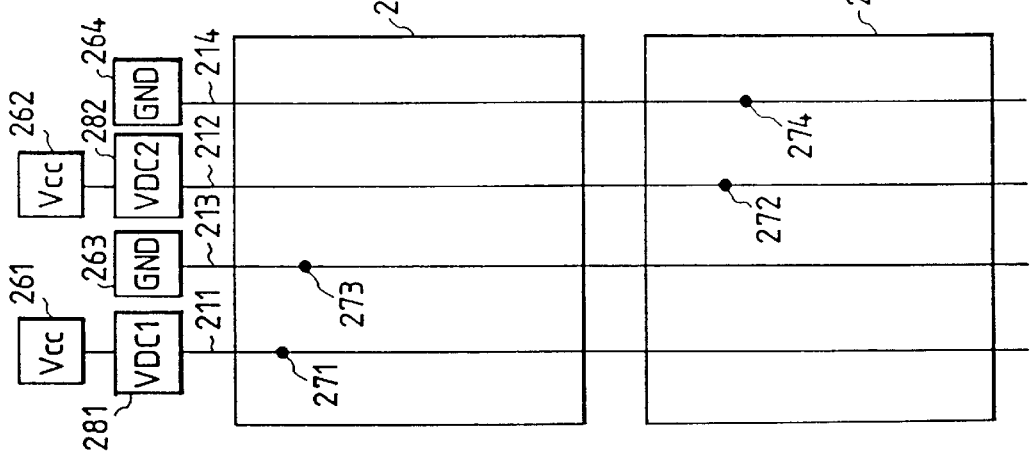
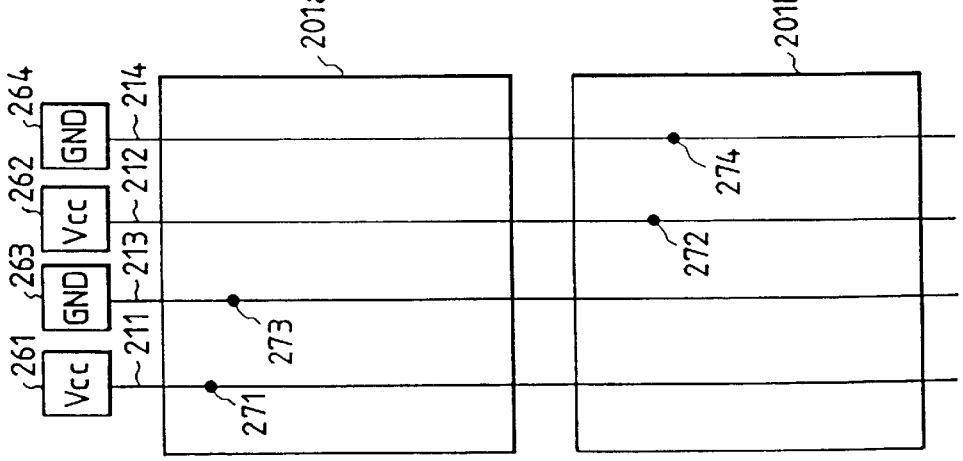

US 6,404,661 B2

SEMICONDUCTOR STORAGE DEVICE HAVING ARRANGEMENT FOR CONTROLLING ACTIVATION OF SENSE AMPLIFIERS

This application is a Divisional of application Ser. No. 09/197,764 filed Nov. 23, 1998, now U.S. Pat. No. 6,104, 630, which is a Divisional of application Ser. No. 08/650, 538, filed May 20, 1996, now U.S. Pat. No. 5,867,440.

BACKGROUND OF THE INVENTION

1. Field of the Invention

The present invention relates to a semiconductor storage device, and more particularly to the layout of power supply lines in a semiconductor storage device.

2. Description of the Related Art

FIG. 46 is a plan view illustrating a dynamic random access memory (DRAM) which is a conventional semiconductor storage device disclosed in, for instance, Japanese Unexamined Patent Publication No. Hei. 4-212454. In the drawing, reference numeral 101 denotes a region in which sense amplifiers are arrayed in a row (sense-amplifier forming region), 102 denotes a region in which a group of storage elements are arrayed (memory cell array), 103 denotes a region in which the sense-amplifier forming region 101 on the one hand, and a word-line backing region 104 for connecting a relatively high-resistance wiring and a low-resistance metal wiring formed in a layer separate from that wiring on the other hand, intersect each other. In addition, FIG. 47 is an enlarged view of the region denoted by a character X in FIG. 46, and illustrates the detail of the wiring of the power supply lines. In FIG. 47, numeral 105 denotes a power supply line for supplying power supply potential, 106 denotes a grounding line for supplying ground potential; and 107 and 108 denote through holes for connecting the power supply line 105 and the grounding line 106 extending in the horizontal direction (in this drawing) to the power supply line 105 and the grounding line 106 extending in the vertical direction (in this drawing).

Thus, in accordance with the prior art, as shown in FIG. 47, the power supply lines 105 and the grounding lines 106, extending in the vertical and horizontal directions in the sense-amplifier forming regions 101, are respectively connected to each other via the through holes 107 and 108, and are thereby arranged in mesh form. As the power supply lines 105 and the grounding lines 106 are thus arranged in mesh form, the supply of power to drive circuits for driving the sense amplifiers is effected speedily so as to speed up the operations of reading and writing information with respect to the memory cells.

In addition, if an assembly of the memory cells is denoted by memory portions 109a to 109d, an actual DRAM chip can be shown in FIG. 48. In this arrangement, row decoders 110a and 110b and column decoders 111a and 111b necessary for the designation of memory cells are arranged. The two memory portions 109a and 109c are disposed on both sides of the column decoder 111a extending in the direction of the rows, the memory portions 109b and 109d are disposed on both sides of the column decoder 111b, the memory portions 109a and 109b are disposed on both sides of the row decoder 110a extending in the direction of the columns, and the memory portions 109c and 109d are disposed on both sides of the row decoder 110b.

Next, an enlarged view of a portion of FIG. 48, i.e., 111a a region including a boundary between the column decoder 111a and the memory portion 109c, is shown in FIG. 49. As already described, the power supply lines 105 and the grounding lines 106 are arranged on the memory portions 109a to 109d in mesh form, and extension lines of these wirings (105, 106) are also arranged on an adjacent column decoder 111a.

Since the wirings (105, 106) are thus arranged in the region where the column decoder 111a is formed, the region where the column decoder 111a is effectively formed becomes small, so that it has been difficult to secure a space necessary for forming the column decoder 111a having a complicated configuration. In addition, since the power supply lines 105 and the grounding lines 106 are generally formed in an identical plane in the same process, it has been difficult to form a single power supply line by combining the plurality of power supply lines 105 (or grounding lines 106) without short-circuiting the power supply lines 105 and the grounding lines 106 or increasing the number of processes involved.

In addition, in the sense-amplifier forming regions 101 in the memory portions 109a to 109d, the power supply lines 105 extending in the direction of the columns and the power supply lines 105 extending in the direction of the rows, as well as the grounding lines 106 extending in the direction of the rows and the grounding lines 106 extending in the direction of the columns, are respectively connected together via the through holes 107 and 108. However, since these through holes require relatively large areas for formation, if an attempt is made to form a through hole at the respective intersections of the power supply lines 105 and the grounding lines 106, restrictions occur in the interval between the power supply line and the grounding line.

Meanwhile, in a synchronous DRAM, which is a type of DRAM, a plurality of banks which are assemblies of memory cells capable of operating independently are provided in a single semiconductor chip, and the banks operate simultaneously. The inputting and outputting of data to and from the banks for the inputting and outputting of external data are effected at high speed. While the operation of accessing a designated address X1, Y1 of one of the banks is being carried out, the operation of accessing a designated address X2, Y2 of another bank is carried out, and the inputting and outputting of external data by the two banks are effected by being delayed by one cycle each, thereby making a high-speed operation possible. In this synchronous DRAM, since the plurality of banks operate simultaneously, in a case where two banks operate simultaneously, power consumption twice that necessary for the operation of one bank is required, so that the supply of sufficient power is necessary.

The conventional semiconductor storage devices are configured as described above, and since the wirings including the power supply lines and the grounding lines are disposed on the column decoder, there has been a drawback in that the area where the column decoder is effectively formed becomes small.

In addition, in the case where the through holes are formed at the respective intersections of the power supply lines (or grounding lines) extending in the direction of the columns of the memory cells and the power supply lines (or grounding lines) extending in the direction of the rows thereof, there has been a problem in that restrictions occur in the interval between the power supply line and the grounding line.

Further, the power supply wiring for strengthening the power supplying capability is not formed in regions (shunt regions) for connecting a relatively high-resistance wiring and a low-resistance wiring, such as a metal wiring, via through holes in the case of a semiconductor storage device using a word line shunt system, and in regions for connecting main word lines and sub-word lines (regions where sub-decoding circuits are formed) in the case of a semiconductor storage device using a word line division system.

Furthermore, if there is a region where power consumption is large partially in a memory cell array, it is necessary to strengthen the power supplying capability with respect to the particular region. With the conventional methods, however, it has been difficult to improve the power supplying capability of a particular region. Further, since the conventional synchronous DRAM is formed as described above, power consumption twice that necessary for the operation of one bank is required. Consequently, there has been a drawback in that operations of banks, which should be independent of each other, affect each other due to a decline in the power supply potential depending on the method of supplying power to the memory cell array, resulting in the loss of leeway in the operation of the memory cell array.

SUMMARY OF THE INVENTION

The present invention has been devised to overcome the above-described drawbacks, and it is an object of the present invention to provide a semiconductor storage device which is capable of securing a column-decoder forming region without an increase in the number of manufacturing steps and which has sufficient power supplying capability.

According to a first aspect of the invention, there is provided a semiconductor storage device comprising:

a memory cell array including a plurality of memory cell sub-arrays in each of which a plurality of memory cells are arranged along row and column directions;

power supply lines extending along the row direction and arranged between the memory cell sub-arrays in a region where the memory cell array is formed; and power supply lines extending along the column direction in the region where the memory cell array is formed, and including first power supplying lines for supplying a first potential and second power supplying lines for supplying a second potential, the second power supplying lines being so arranged that plural, adjacent ones of the first power supplying lines are interposed between the second power supplying lines.

According to a second aspect of the invention, there is provided a semiconductor storage device comprising:

a memory cell array including a plurality of memory cell sub-arrays in each of which a plurality of memory cells are arranged along row and column directions;

power supply lines extending along the row direction and arranged between the memory cell sub-arrays in a region where the memory cell array is formed; and power supply lines extending along the column direction in the region where the memory cell array is formed, and including first power supplying lines for supplying a first potential and second power supplying lines for supplying a second potential, the power supply lines being arranged such that plural, adjacent ones of the first power supplying lines and plural, adjacent ones of the second power supplying lines are arranged alternately.

According to a third aspect of the invention, there is provided a semiconductor storage device comprising:

a memory cell array including a plurality of memory cell sub-arrays in each of which a plurality of memory cells are arranged along row and column directions;

power supply lines extending in the row direction and arranged between the memory cell sub-arrays in a region where the memory cell array is formed; and power supply lines extending along the column direction in the region where the memory cell array is formed, and including first power supplying lines for supplying a first potential and second power supplying lines for supplying a second potential, the first power supplying lines and the second power supplying lines being arranged alternately, and at least one of the first power supplying lines and the second power supplying lines being formed such that a plurality of lines branch off at an end of the memory cell array and are arranged on the memory cell array.

According to a fourth aspect of the invention, there is provided a semiconductor storage device comprising:

a memory cell array including a plurality of memory cell sub-arrays each having a plurality of memory cell blocks in each of which a plurality of memory cells are arranged along row and column directions;

power supply lines extending along the row direction and arranged between the memory cell sub-arrays in a region where the memory cell array is formed; and power supply lines extending along the column direction in the region where the memory cell array is formed, and including first power supplying lines for supplying a first potential and second power supplying lines for supplying a second potential, the first power supplying lines and the second power supplying lines being arranged alternately, and either the first power supplying lines or the second power supplying lines including lines that extend along the column direction on one of the memory cell blocks.

According to a fifth aspect of the invention, there is provided a semiconductor storage device comprising:

a memory cell array including a plurality of memory cell sub-arrays each having a plurality of memory cell blocks in each of which a plurality of memory cells are arranged along row and column directions;

power supply lines extending along the row direction and arranged between the memory cell sub-arrays in a region where the memory cell array is formed; and power supply lines extending along the column direction in the region where the memory cell array is formed, and including first power supplying lines for supplying a first potential and second power supplying lines for supplying a second potential, the first power supplying lines and the second power supplying lines being arranged alternately, and at least one of the first power supplying lines and the second power supplying lines being formed such that a plurality of lines branch off at an end of the memory cell array and extend along the column direction on at least one of the memory cell blocks so as to be adjacent to each other.

According to a sixth aspect of the invention, there is provided a semiconductor storage device comprising:

a memory cell array including a plurality of memory cell sub-arrays in each of which a plurality of memory cells are arranged along row and column directions;

power supply lines extending along the row direction and arranged between the memory cell sub-arrays in a region where the memory cell array is formed;

power supply lines extending along the column direction in the region where the memory cell array is formed; and signal lines so arranged that plural, adjacent ones of the power supply lines along the column direction are interposed between the signal lines.

According to a seventh aspect of the invention, there is providedf a semiconductor storage device comprising:
- a memory cell array in which a plurality of memory cells are arranged in row and column directions;
- sense amplifiers for sensing a state of each of the memory cells;
- a sense amplifier block including plural ones of the sense amplifiers on which writing is performed simultaneously; and
- a driver transistor formed in the sense amplifier block and connected to either of power supply lines extending along the row direction,
- wherein of plural ones of the sense amplifiers connected to the power line along the row direction via the driver transistor, only one sense amplifier is subjected to writing simultaneously with the other sense amplifiers.

According to an eighth aspect of the invention, there is provided a semiconductor storage device comprising:
- a memory cell array including a plurality of memory cell sub-arrays in each of which a plurality of memory cells are arranged along row and column directions, the memory cell array including a plurality of memory cell sub-arrays that are activated simultaneously;
- power supply lines extending along the row direction and arranged between the memory cell sub-arrays in a region where the memory cell array is formed;
- power supply lines extending along the column direction in the region where the memory cell array is formed, and including first power supplying lines for supplying a first potential and second power supplying lines for supplying a second potential; and
- a through hole for connecting a power supply line along the row direction and a power supply line along the column direction, the through hole being formed at a position which is closest to the memory cell sub-arrays that are activated simultaneously and at which a power supply line along the row direction and a power supply line along the column direction have the same potential cross each other.

According to a ninth aspect of the invention, there is provided a semiconductor storage device comprising:
- a memory cell array including a plurality of banks each having a plurality of memory cell sub-arrays in each of which a plurality of memory cells are arranged along row and column directions, and means for activating memory cells by designating addresses that are different for the respective banks;
- a plurality of first power supplying lines extending along the row direction and arranged between the memory cell sub-arrays in the bank, for supplying a given potential; and
- a plurality of second power supplying lines extending along the column direction, for supplying a given potential,
- wherein at least one of the second power supplying lines is connected to the first power supplying line on a predetermined one of the banks, and supplies a potential to the predetermined bank.

According to a tenth aspect of the invention, there is provide a semiconductor storage device comprising:
- a memory cell array in which a plurality of memory cells are arranged along row and column directions;
- main word lines having at least two kinds of length, and extending in the row direction on the memory cell array; and
- a spare main word line extending along the same direction as the main word lines, and having the same length as a longest one of the main word lines.

According to an eleventh aspect of the invention, there is provided a semiconductor storage device comprising:
- a memory cell array in which a plurality of memory cells are arranged along row and column directions;
- main word lines which extend along a row direction on the memory cell array, and one of which is selectively activated;
- at least one sub-word line that branches off from the main word line;
- at least one spare main word line extending along the same direction as the main word lines, and having the same length as a longest one of the main word lines; and
- at least one spare sub-word line that branches off from the spare main word line.

According to a twelfth aspect of the invention, there is provided a semiconductor storage device comprising:
- a memory cell array in which a plurality of memory cells are arranged along row and column directions;
- main word lines which extend along a row direction on the memory cell array, and one of which is selectively activated;
- at least one sub-word line that branches off from the main word line;
- at least one spare main word line extending along the same direction as the main word lines;
- at least one spare sub-word line that branches off from the spare main word line;
- word line driver circuits formed at one predetermined ends of the respective main word lines, and arranged along the column direction in at least two columns; and
- a spare word line driver circuit formed at one predetermined end of the spare main word line, and located at least in a column farthest from the memory cell array among the columns in which the word line driver circuits are arranged.

According to a thirteenth aspect of the invention, there is provided a semiconductor storage device comprising:
- a memory cell array including a plurality of memory cell sub-arrays in each of which a plurality of memory cells are arranged in row and column directions;
- main word lines which extend in the row direction on the memory cell sub-array, and one of which is selectively activated;
- a dummy main word line which is activated at the same time as at least the main word line in the same memory cell sub-array is activated;
- a dummy sub-word line that branches off from the dummy main word line;
- a sense amplifier signal generating circuit formed at an end of the dummy sub-word line, for generating a sense amplifier activation signal at a time point when the end of the dummy sub-word line is activated, to thereby allow reading of information in the memory cell;
- bit lines extending along the column direction, the memory cells being formed at positions where the bit lines cross the dummy sub-word line; and
- sense amplifiers formed at ends of the bit lines.

According to a fourteenth aspect of the invention, there is provided a semiconductor storage device comprising:

a memory cell array in which a plurality of memory cells are arranged in row and column directions;

main word lines extending along the row direction on the memory cell array;

at least one spare main word line extending along the same direction as the main word lines;

a plurality of spare sub-word lines that extend in parallel with the main word lines and branch off from one of the spare main word lines; and a dummy sub-word line that extends in parallel with at least one of the spare sub-word lines and to branches off from the spare main word line, for sensing a word line delay.

According to a fifteenth aspect of the invention, there is provided a semiconductor storage device comprising:

a memory cell array including a plurality of banks each having a plurality of memory cell sub-arrays in each of which a plurality of memory cells are arranged along row and column directions, and means for activating memory cells by designating addresses that are different for the respective banks;

main word lines extending in the row direction on the banks;

at least one spare main word line extending along the same direction as the main word lines;

a plurality of spare sub-word lines that branch off from the main word lines; and a dummy sub-word line that extends in parallel with at least one of the spare sub-word lines and branches off from the spare main word line, for sensing a word line delay.

BRIEF DESCRIPTION OF THE DRAWINGS

FIGS. 20A–22 show semiconductor storage devices according to a sixth embodiment of the invention;

FIGS. 35–39 show semiconductor storage devices according to a tenth embodiment of the invention;

DESCRIPTION OF THE PREFERRED EMBODIMENTS

First Embodiment

Figure 1:
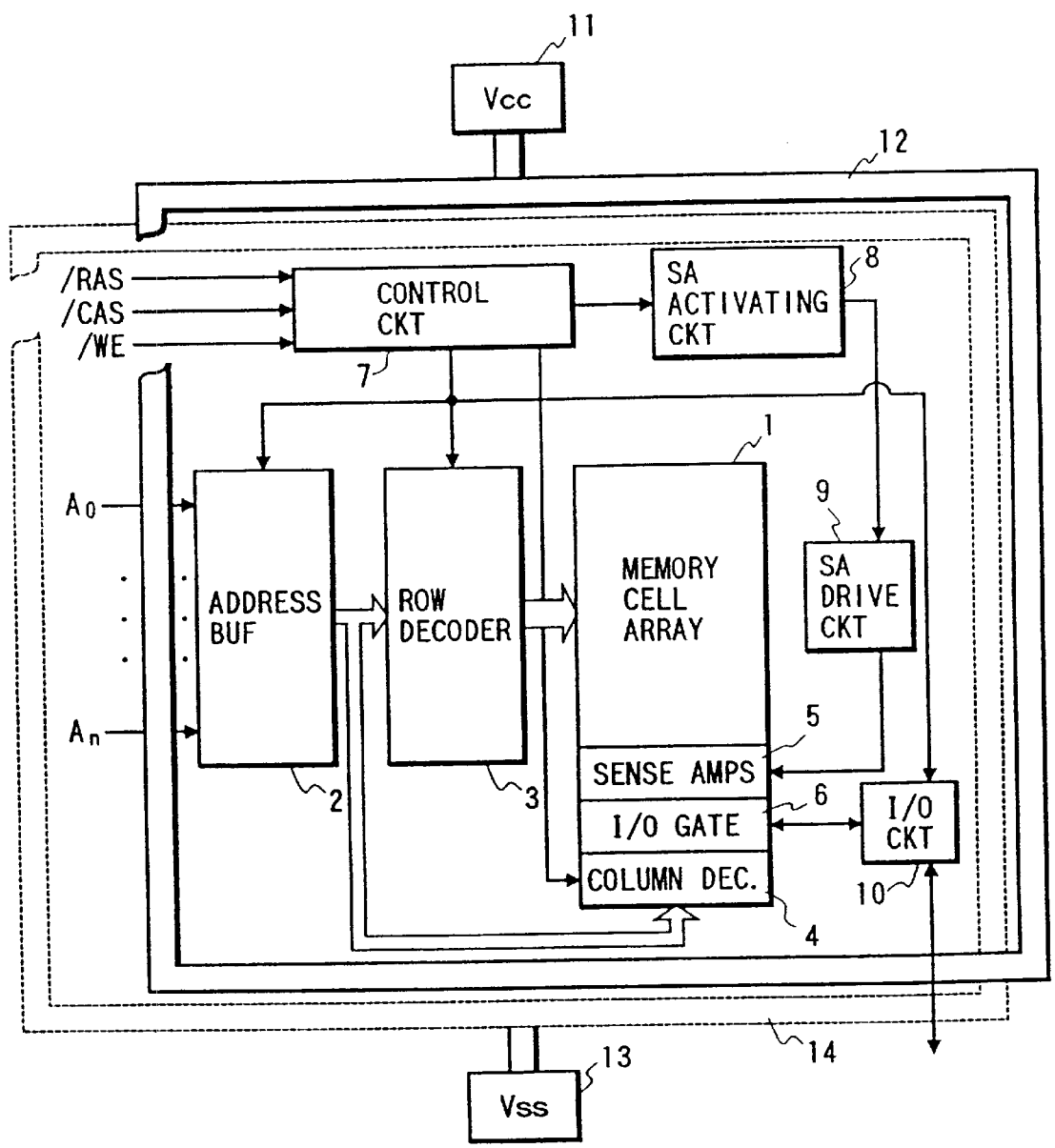
FIGS. 1–10B show semiconductor storage devices according to a first embodiment of the present invention.

Hereafter, a description will be given of an embodiment of the present invention. FIG. 1 is a diagram schematically illustrating a dynamic random access memory (DRAM). In the drawing, reference numeral 1 denotes a memory cell array having a plurality of memory cells which are arranged in the directions of the rows and columns; 2 denotes an address buffer for generating internal address signals upon receiving address signals A0 to An from an external circuit; 3 denotes a row decoder for selecting a corresponding row in the memory cell array 1 after decoding an internal address signal from the address buffer 2; 4 denotes a column decoder for generating a column selection signal for selecting a corresponding column in the memory cell array 1 after decoding an address signal from the address buffer 2; and 5 denotes a sense-amplifier forming region which senses, amplifies, and latches the information in the memory cells connected to the row selected by the row decoder 3 of the memory cell array 1. This sense-amplifier forming region 5 is a region which includes the sense amplifiers provided in correspondence with the respective columns of the memory cell array 1. In addition, numeral 6 denotes an I/O gate for connecting to the internal-data transmitting line (I/O line) a corresponding column of the memory cell array 1 in response to a column selection signal from the column decoder 4 and a corresponding column of the memory cell array 1 in response to an internal-data transmission signal.

A row address signal and a column address signal are imparted to the address buffer 2 after being subjected to time division multiplexing. The row decoder 3 decodes the row address signal from the address buffer 2, while the column decoder 4 decodes the column address signal from the address buffer 2.

In addition, this semiconductor storage device further comprises the following: a control circuit 7 for generating various internal control signals upon receiving control clock signals imparted thereto from an external circuit, i.e., a row address strobe signal (hereafter abbreviated as the /RAS signal), a column address strobe signal (hereafter abbreviated as the /CAS signal), and a write enable signal (hereafter abbreviated as the /WE signal); a sense-amplifier activating circuit 8 for generating signals for activating the sense amplifiers included in the sense-amplifier forming region 5 in response to the internal control signals from the control circuit 7; and a sense-amplifier drive circuit 9 for driving the sense amplifiers included in the sense-amplifier forming region 5 in response to the sense-amplifier activation signals from the sense-amplifier activating circuit 8.

The /RAS signal, which is one of the control signals, provides a timing signal at which the address buffer 2 accepts the external address signals A0 to An as the row address signals and generates internal row address signals. Further, the /RAS signal determines a memory cycle period of the semiconductor storage device. Meanwhile, the /CAS signal provides a timing signal at which the address buffer 2 accepts the internal address signals A0 to An as the column address signals and generates internal column address signals. On the other hand, the /WE signal is a signal which indicates whether the semiconductor storage device is in a data writing mode or in a data reading mode. Further, reference numeral 10 denotes an input/output circuit for receiving and transmitting data with respect to selected memory cells in the memory cell array 1 via the I/O gate 6.

This input/output circuit 10 generates internal write data upon receiving write data DQ from the external circuit during the data writing mode, and transmits the internal write data to the memory cells selected via the internal data transmission line and the I/O gate 6. During the data reading mode, the input/output circuit 10 generates the external read data from the data of the selected memory cells transmitted to the internal data transmission line via the I/O gate 6. Further, the sense-amplifier activating circuit 8 delays for a predetermined time the internal /RAS signal generated by the control circuit 7, and generates the sense-amplifier activation signals so as to drive the sense amplifiers included in the sense-amplifier forming region 5 in response to the sense-amplifier activation signals.

Furthermore, this semiconductor storage device comprises an operating power-supply-potential supplying line 12 connected to a power supply pad 11 for receiving operating power supply potential Vcc; and a grounding line 14 connected to a grounding pad 13 for receiving ground potential Vss. Both the operating power-supply-potential supplying line 12 and the grounding line 14 are constituted by a wiring having a large width, and are so arranged as to surround the storage device along the outer periphery of the chip for supplying stable power supply potential Vcc or the ground potential Vss to the storage device.

Figure 48:
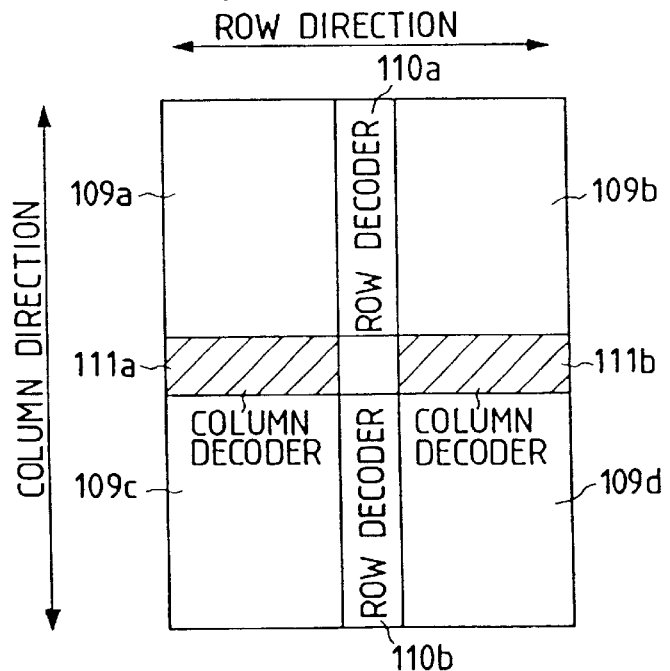
Figure 49:
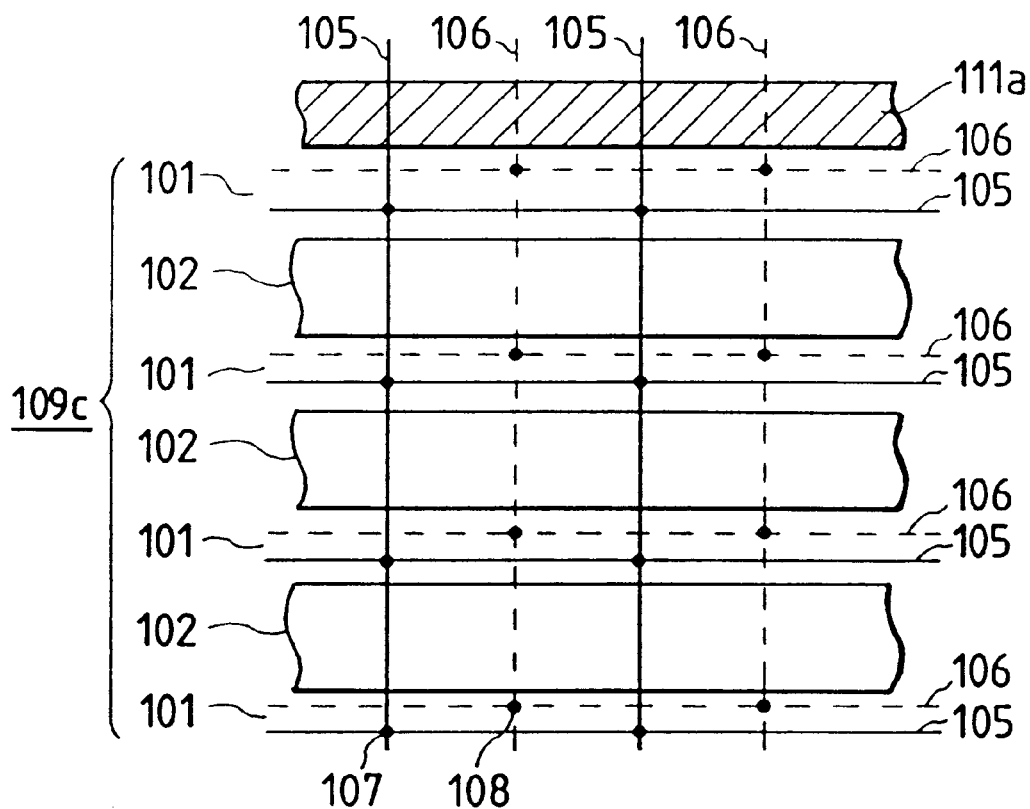

If a section which includes the memory cell array 1, the column decoder 4, the sense-amplifier forming region 5, and the like in FIG. 1 is assumed to be a memory section, this memory section corresponds to the memory portions 109a to 109d referred to in the prior art. This memory section, the row decoder 3, and the column decoder 4 are arranged such that the row-decoder forming region and a column-decoder forming region intersect each other orthogonally, as shown in FIG. 48.

Figure 2:
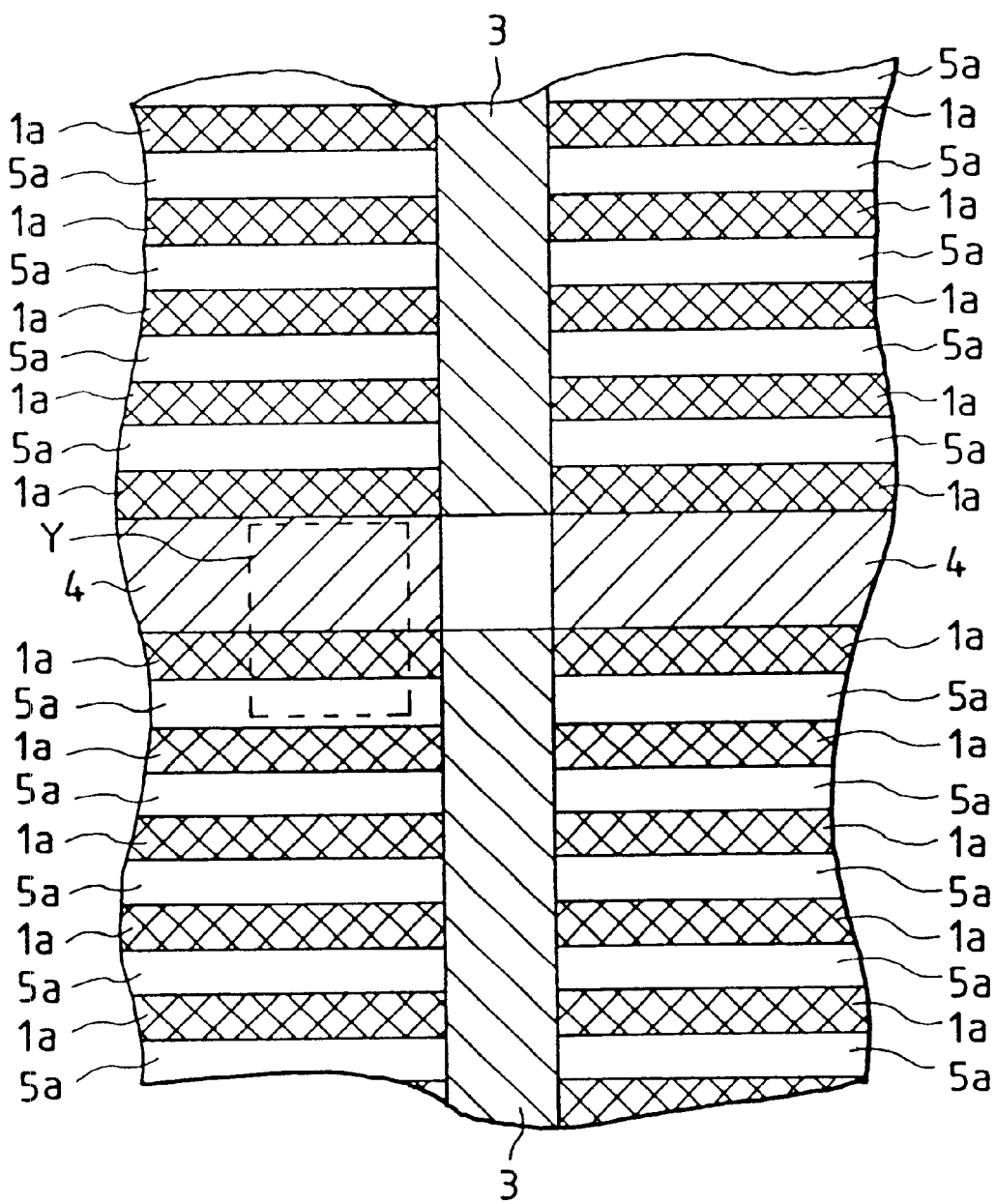

In addition, as shown in FIG. 2, the sense-amplifier forming region 5 and the memory cell array 1 which are included in the memory section are respectively formed in the form of divided strips. Specifically, a sense-amplifier forming region. 5a and a memory cell sub-array 1a are arranged alternately in the same way as in the prior art.

Figure 3:
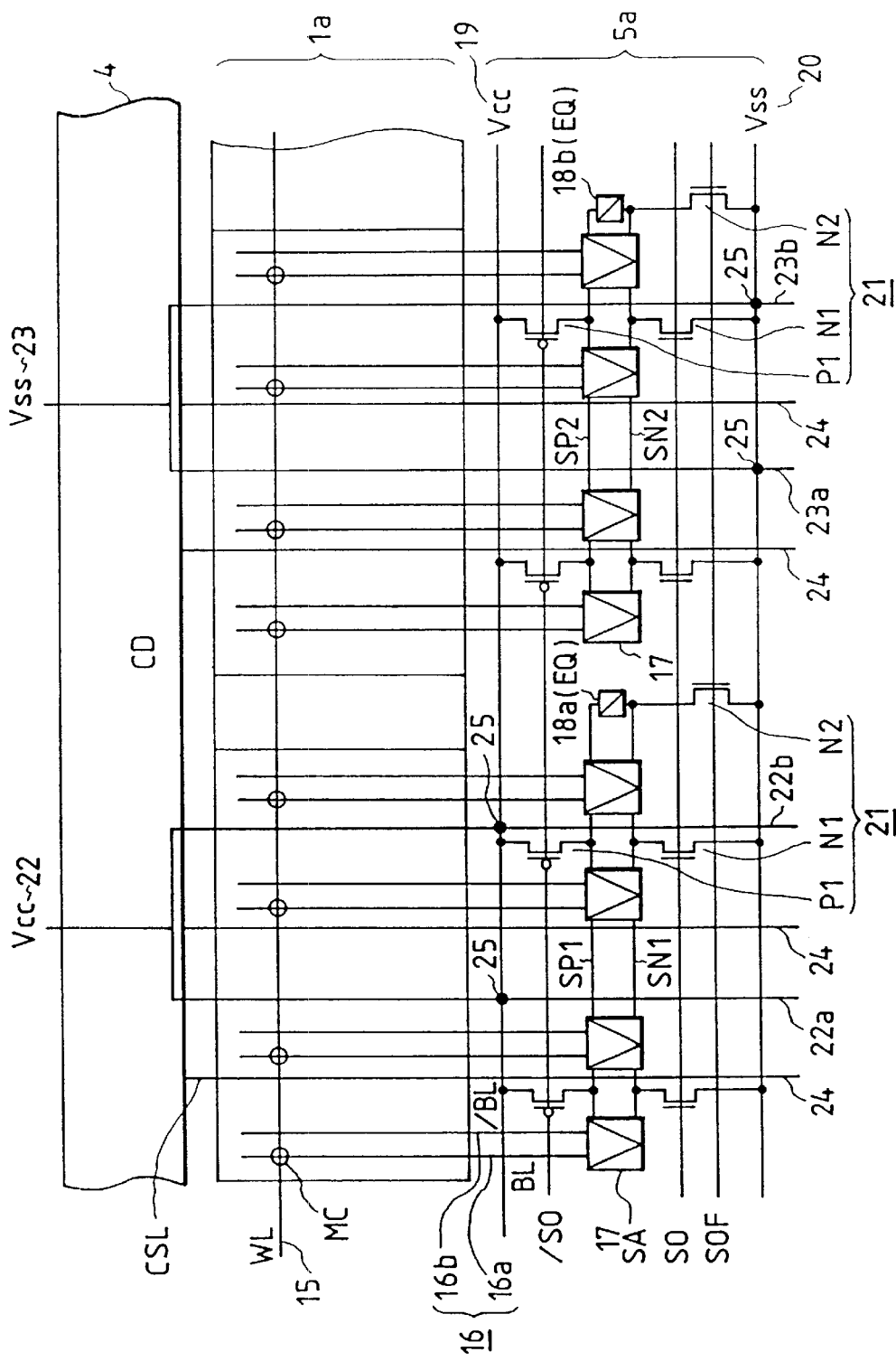

Next, an enlarged view of a region Y surrounded by broken lines in FIG. 2 is shown in FIG. 3. In this drawing, a plurality of power supply lines 22, i.e., first power supplying lines, and a plurality of grounding lines 23, i.e., second power supplying lines, are arranged on the memory cell sub-array 1a and the sense-amplifier forming region 5a so as to extend in the direction of the columns in the arrangement of the memory cells. A column selection signal line 24, which is activated upon receiving an activation signal from the column decoder 4, is disposed in a region between the power supply line 22 and the grounding line 23. The power supply line 22 and the grounding line 23 are respectively connected at intersections to a power supply line 19 and a grounding line 20 which are arranged in such a manner as to extend in the direction of the rows of the memory cells in the sense-amplifier forming region 5a. In addition, the memory cell sub-array 1a includes a plurality of word lines 15 (only one is typically shown in FIG. 3) to each of which one row of memory cells MC is connected, as well as bit line pairs 16 each of which is comprised of a pair of bit line 16a and complementary bit line 16b and to each of which one column of memory cells MC is connected.

The bit line 16a and the complementary bit line 16b constitute a pair, and transmits mutually complementary data. During the sensing operation, one of the bit line 16a and the complementary bit line 16b provides a reference potential with respect to the potential at the other bit line. The memory cell MC is disposed at an intersection between the word line 15 and the bit line 16a or 16b. That is, one memory cell MC is disposed at an intersection between the word line 15 and the bit line pair 16.

Sense amplifiers 17 which are included in the sense-amplifier forming region 5a are disposed in parallel with the word line 15 on one side of the memory cell sub-array 1a. The sense amplifiers 17 are provided in correspondence with the respective pairs of bit lines 16a and 16b. The reason for the fact that two sense-amplifier drive signal lines SP1 (or SP2) and SN1 (or SN2) are present so as to connect the plurality of sense amplifiers 17 included in the sense-amplifier forming region 5 is because each of the sense amplifiers 17 amplifies the potential at one of the bit lines of the pair of bit lines 16a and 16b to the level of the operating power supply potential Vcc and the potential at the other bit line to the level of the ground potential Vss.

In addition, equalizing circuits 18a and 18b for equalizing the potential at the sense-amplifier drive signal lines SP1 or SP2 and SN1 or SN2 are provided for these signal lines. Sense-amplifier drive circuits 21 are disposed in the sense-amplifier forming region 5a, and each of the sense-amplifier drive circuits 21 includes switching elements that are energized or de-energized upon receiving sense-amplifier activation signals SO, /SO, and SOF to connect or disconnect the sense-amplifier drive signal lines to and from the power supply line 19 or the grounding line 20 extending in the direction of the rows of the memory cells. For instance, the sense-amplifier drive circuit 21 connects the sense-amplifier drive signal lines SN1 and SP1, to which the equalizing circuit 18a is connected, to the wiring through which the sense-amplifier activation signals SO, /SO, and SOF are introduced. Specifically, the sense-amplifier drive circuit 21 includes a P-channel MOS transistor P1 for connecting the sense-amplifier drive signal line SP1 to the power supply line 19 in response to the sense-amplifier activation signal /SO, an N-channel MOS transistor N2 for connecting the sense-amplifier driver signal line SN1 to the grounding line 20 in response to the sense-amplifier activation signal SOF, and an N-channel transistor N1 for connecting the sense-amplifier driver signal line SN1 to the grounding line 20 in response to the sense-amplifier activation signal SO.

This N-channel MOS transistor N2 has a relatively small driving capability, while the N-channel MOS transistor N1 has a relatively large driving capability. The N-channel MOS transistor N1 is first energized to discharge the sense-amplifier driver signal line SN1 to the ground potential Vss at high speed.

The reason for driving the sense-amplifier driver signal line SN1 in two stages in the above-described manner is to improve the sensitivity of the sense amplifiers. That is, after the sense-amplifier driver signal line SN1 is slowly discharged to the level of the ground potential Vss, and the potential difference at each bit line pair 16 is amplified to some extent by the sense amplifiers 17, the sense-amplifier driver signal line SN1 is discharged to the ground potential Vss at high speed. Consequently, the sensing operation can be executed at high speed without impairing the sensitivity of the sense amplifiers 17.

Figure 4:
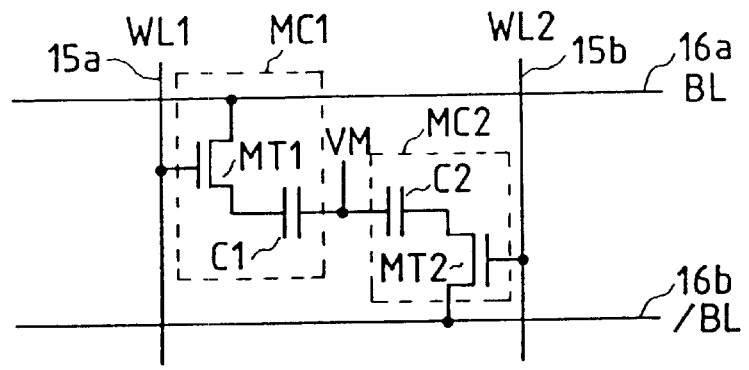

FIG. 4 is a diagram specifically illustrating the configuration of the memory cells MC (dynamic type) shown in FIG. 3. In FIG. 3, a memory cell MC1 disposed at an intersection between a word line 15a and the bit line 16a includes a memory cell capacitor C1 for storing information in the form of a charge and a transfer gate MT1 constituted by an N-channel MOS transistor connected to one electrode (storage node) of the memory cell capacitor C1. Similarly, a memory cell MC2 disposed at an intersection between a word line 15b and the bit line 16b includes a memory capacitor C2 and a transfer gate MT2.

Figure 5:
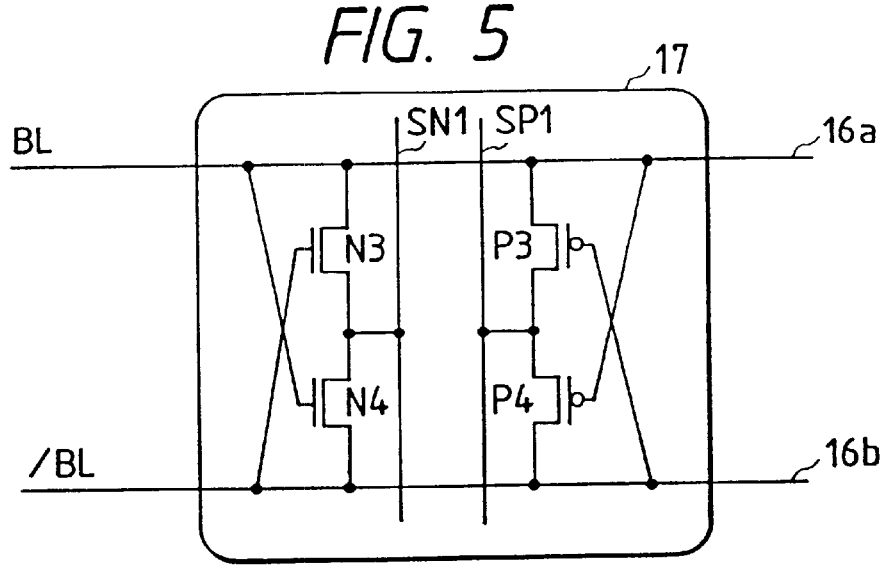

FIG. 5 is a diagram illustrating a specific configuration of the sense amplifier 17 shown in FIG. 3. In FIG. 5, the sense amplifier 17 includes cross-coupled N-channel MOS transistors N3 and N4. The transistor P3 of the sense amplifier 17 has its gate connected to the complementary bit line 16b and its drain to the bit line 16a. The transistor P4 of the sense amplifier 17 has its gate connected to the bit line 16a. The sources of the transistors P3 and P4 are commonly connected to the sense-amplifier driver signal line SN1.

Further, the N-channel MOS transistor N3 has its gate connected to the complementary bit line 16b and its drain to the bit line 16a. The transistor N4 has its gate connected to the bit line 16a and its drain to the complementary bit line 16b. The sources of the transistors P3 and P4 are commonly connected to the sense-amplifier driver signal line SN1.

The transistors P3 and P4 constitute the P-channel sense amplifier, and amplify the bit line having lower potential between the bit lines 16a and 16b to the level of the ground potential Vss.

Figure 6:
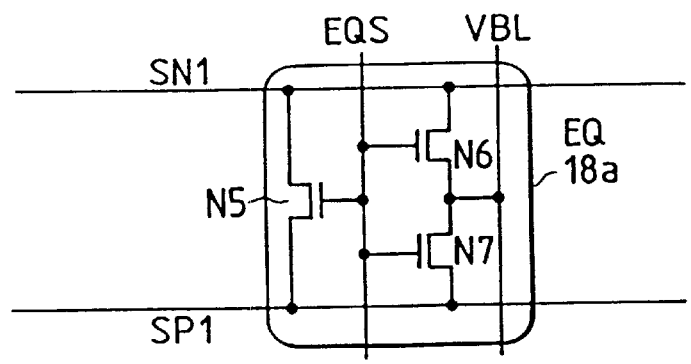

FIG. 6 is a diagram illustrating the configuration of the equalizing circuit 18a shown in FIG. 3. The equalizing circuit 18a includes an N-channel MOS transistor N5 whose gate is connected in such a manner as to receive an equalization signal EQS, whose drain is connected to the sense-amplifier drive signal line SP1, and whose source is connected to the sense-amplifier driver signal line SN1; an N-channel MOS transistor N6 whose drain is connected to the sense-amplifier drive signal line SN1, and whose source is connected in such a manner as to receive predetermined precharging potential VBL (normally, at the level of Vss/2); and an N-channel MOS transistor N7 whose gate is connected in such a manner as to receive the equalization signal EQS, whose source is connected to the drive signal line SP1, and whose drain is connected in such a manner as to receive the precharging potential VBL.

The transistor N5 short-circuits the drive signal lines SN1 and SP1 in response to the equalization signal EQS, while the transistors N6 and N7 are energized in response to the equalization signal EQS, so as to maintain the drive signal lines SN1 and SP2 at the level of the precharging potential VBL.

Normally, a circuit having a configuration similar to that of the equalizing circuit 18a shown in FIG. 6 is provided for each pair of the bit lines 16a and 16b, and the bit lines 16a and 16b are precharged to the precharging potential at the level of the intermediate potential Vcc/2, respectively, during standby. Next, a description will be given of the operation of the circuit shown in FIGS. 3 to 6 with reference to FIG. 7 which is a waveform diagram of its operation.

When the /RAS signal is at "H," the memory device in a standby state, and the sense-amplifier driver signal lines SP1 and SN1 are precharged to the predetermined precharging potential VBL. Similarly, the bit lines 16a (BL) and 16b (/BL) are also precharged to the intermediate potential Vcc/2.

When the /RAS signal falls to "L," a memory cycle begins. In response to the fall of the /RAS signal, the address buffer 2 (see FIG. 1) generates an internal row address signal and imparts the same to the row decoder 3. The row decoder 3 decodes the internal address signal imparted thereto, selects a corresponding word line 15 (WL) in the memory cell sub-array 1a, and raises the potential at the selected word line 15a (WL) shown in FIG. 4 to "H."

Figure 7:
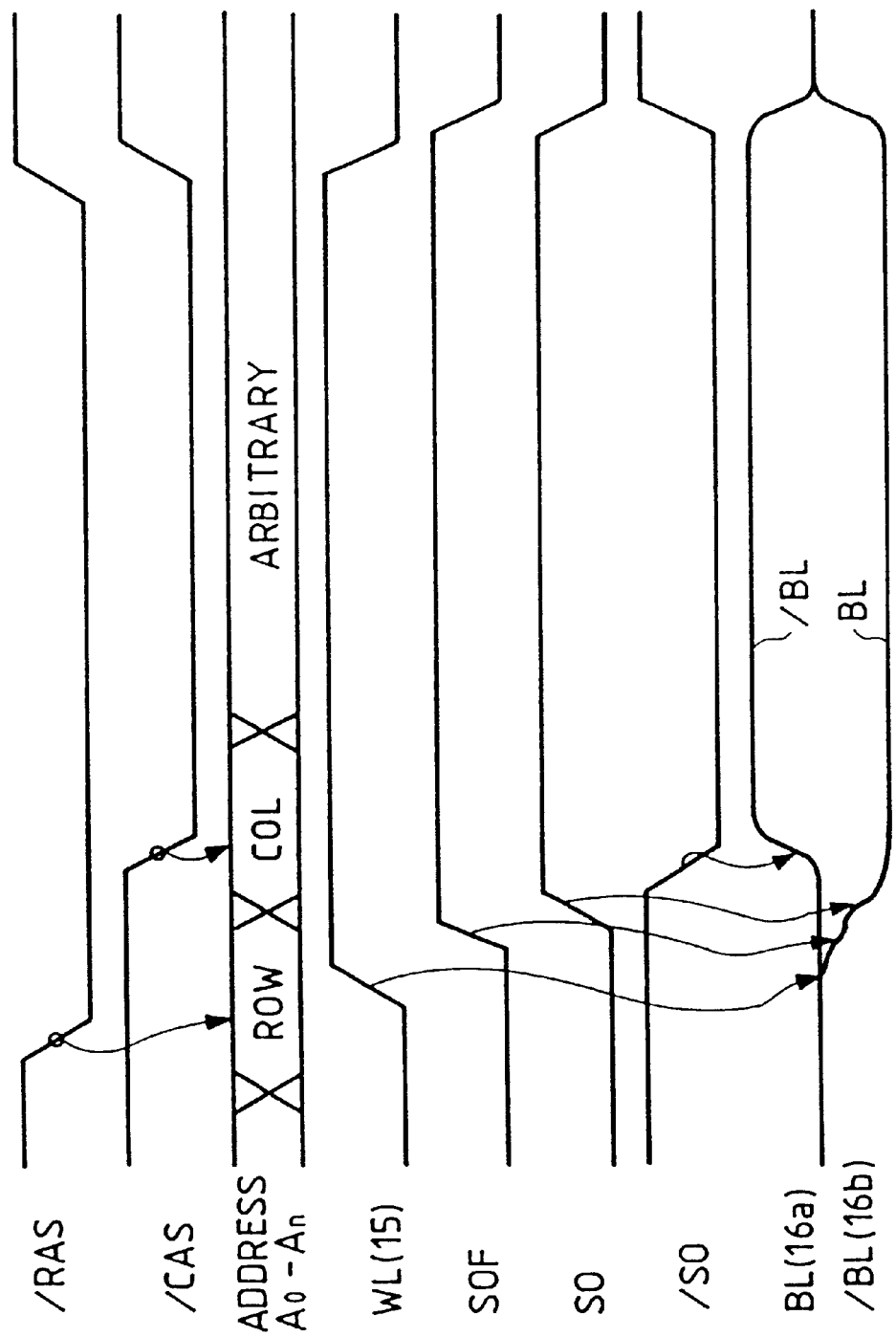

In response to the rise of the potential at the selected word line 15a (WL), the transfer gate MT (the gate MR1 or MR2 in FIG. 4) of the memory cell connected to this selected word line is energized. Consequently, the potential at the bit line 16a (BL) (or 16b (/BL)) is changed by charge correspond to the stored information at the memory cell MC connected to the selected word line 15a (WL). In FIG. 7, the selected memory cell stores "0," showing a state in which the potential at the bit line 16a (BL) has fallen. Although the efflux of the charge has not occurred in the other bit line (in FIG. 7, the bit line 16b (/BL)), its potential is at the predetermined precharging potential level. Here, the respective bit lines 16a (BL) and 16b (/BL) have been released from the precharging/equalizing state in response to the fall of the /RAS signal, and are in a floating state. This also applies to the equalizing circuit 18a provided for the sense-amplifier driver signal lines SP1 and SN1.

Next, after the potential at a selected word line WLn has risen and a predetermined time has elapsed, the sense-amplifier activation signal SOF first rises from "L" to "H," thereby energizing the transistor N3. Consequently, the potential at the sense-amplifier driver signal line SN1 gradually falls from the precharging potential VBL to the ground potential Vss level. In response to this fall the N-channel sense amplifier in the sense amplifier 17 operates, and a small potential difference between the bit lines 16a (BL) and 16b (/BL) is amplified. At this time, since the small potential difference between the bit lines 16a (BL) and 16b (/BL) is gradually amplified, the sensitivity of the sense amplifier 17 is improved, so that the potential difference between the bit lines 16a (BL) and 16b (/BL) is accurately amplified.

Next, after the potential difference between the bit lines 16a (BL) and 16b (/BL) is amplified to some degree, the sense-amplifier activation signal SO becomes "H." Consequently, the transistor N4 is energized, thereby discharging the sense-amplifier driver signal line SN1 to the ground potential Vss at high speed. As this transistor N4 is energized, the N-channel sense amplifier in the sense amplifier 17 is driven to amplify the potential difference between the bit lines 16a (BL) and 16b (/BL). As the N-channel sense amplifier is thus driven in two stages, the potential at the bit line having lower potential between the bit lines 16a (BL) and 16b (/BL) can be discharged to the ground potential level with high sensitivity and at high speed.

Next, the sense-amplifier activation signal /SO falls from "H" to "L," and the sense-amplifier driver signal line SP1 is connected to the power supply line Vcc by means of the drive transistor P3. Consequently, the P-channel sense amplifier included in the sense amplifier 17 is activated, and the potential at the bit line having higher potential between the bit lines 16a (BL) and 16b (/BL) is raised to the power supply potential Vcc level (FIG. 7 shows a state in which the complementary bit line 16b (/BL) is charged to the "H" level, and the bit line 16a (BL) is discharged to the "L" level).

Then, the column address strobe signal (the /CAS signal) falls to "L," and an internal column address signal is generated by the address buffer 2. The column decoder 4 decodes the internal column address signal thus generated. At this point of time, the potential at the bit lines 16a (BL) and 16b (/BL) is stable at "L" and "H." As a result, a corresponding column (i.e., bit line pair) is connected to the internal data transmission line to effect the writing or reading of data. If the /WE signal is at "H," the data is read, while if the /WE signal is at "L," the data is written.

When the writing or reading of data is effected, the dynamic semiconductor storage device is reset to a standby state in preparation for an ensuing access cycle. That is, the /RAS signal and the /CAS signal consecutively rise to "H," respectively.

In correspondence with this rise, the potential at the selected word line WLn falls to "L," and the sense-amplifier activation signals SO,. SOF, and /SO are also respectively reset to "L," "L," and "H" in the non-activated state. Meanwhile, the equalization signal EQS rises to "H." The equalizing circuit 18a is hence activated, and all the transistors N5, N6, and N7 (see FIG. 6) included in the equalizing circuit 18a are energized. The sense-amplifier driver signal lines SP1 and SP2, which respectively remained at the "H" and "L" levels until then, are short-circuited, and their potential is set to the intermediate potential Vcc/2.

At the same time, the sense-amplifier driver signal lines SP1 and SN1 are fixed, through the transistors N6 and N7, at the precharging potential level, i.e., at the precharging potential VBL (Vcc/2 level) generated by a separate VBL-generating circuit (not shown), and prepares for an ensuing sensing operation. The reason for holding the sense-amplifier driver signal lines at the precharging level of Vcc/2 is to reduce power consumption and speed up the sensing operation for the same reason as the precharging of the bit lines 16a (BL) and 16b (/BL) to the intermediate potential Vcc/2.

Further, in this embodiment, the plurality of power supply lines 22 and grounding lines 23 extending in the direction of the columns of the memory cells are respectively connected via through holes 25 to the power supply lines 19 and the grounding lines 20 extending in the direction of the rows of the memory cells. Therefore, power can be speedily supplied to the sense-amplifier driver signal lines SP1 and SN1 (or SN2 and SP2), so that the time required for charging these sense-amplifier driver signal lines can be reduced, thereby enabling high-speed sensing operation.

Figure 8:
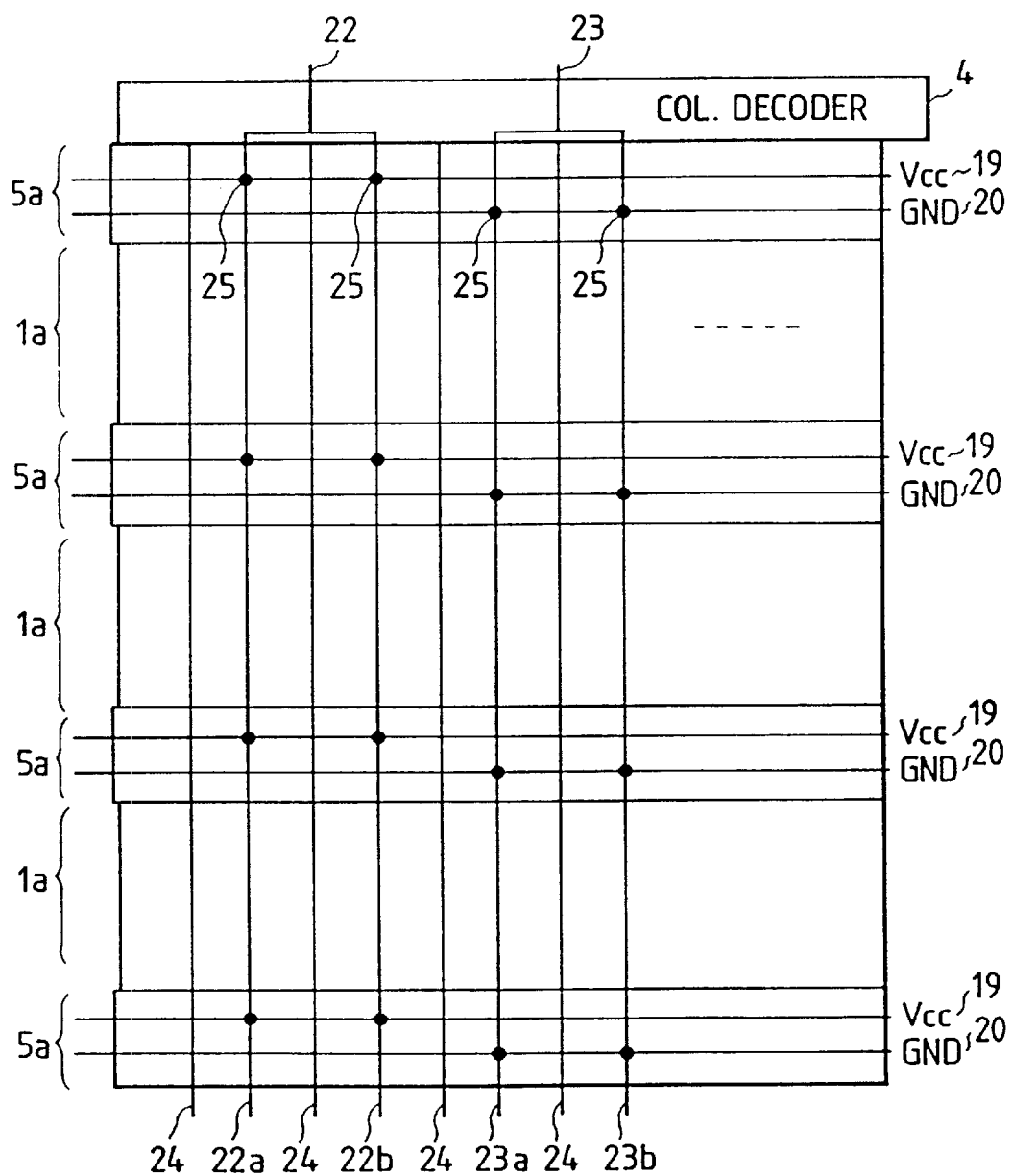

Next, FIG. 8 shows a power-supply layout diagram which focuses attention on the power supply lines 22 (22a and 22b) and the grounding lines 23 (23a and 23b). In the drawing, the same reference numerals as those already used denote identical or corresponding portions. Since the power supply line and the grounding line which extend in parallel with the direction of the columns of the memory cells are conventionally arranged alternately, in a case where these wirings are formed in the same plane in the same process, it is difficult to combine a plurality of wirings. In this embodiment, however, as shown in FIG. 8, since the power supply lines 22a and 22b are disposed adjacent to each other, the power supply lines can be combined as a single power supply line 22 having a relatively large width in the vicinity of a boundary portion between the column decoder 4 and the sense-amplifier forming region 5a, thereby making it possible to decrease the number of wirings traversing the column decoder 4 in the direction of the columns.

In addition, as the number of wirings traversing the column decoder 4 is decreased, it is possible to expand an effective area of the formation of the column decoder to a degree greater than in the prior art. This makes it possible to increase the number of elements which can be formed in the column decoder, thereby making it possible to form a more reliable column decoder. Furthermore, the grounding line 23 can also be arranged in the same way as the power supply line 22, and even if an arrangement is provided such that a plurality of power supply lines 22 and a plurality of grounding lines 23 are arranged alternately, the number of wirings traversing the column decoder 4 can be decreased, thereby making it possible to expand the effective area of the formation of the column decoder.

The first embodiment is directed to a case where a plurality of power supply lines (22a and 22b) or a plurality of grounding lines (23a and 23b) are combined in the boundary portion between the column decoder 4 and the sense-amplifier forming region 5a (or the memory cell sub-array 1a). However, even if the power supply lines (22a and 22b) or the grounding lines (23a and 23b) are arranged on the column decoder such that the lines on the memory cell sub-array 1a and the sense-amplifier forming region 5a are extended, power to the sense-amplifier driver signal lines (SN1, SN2, SP1, and SP2) can be supplied at high speed.

Figure 9:
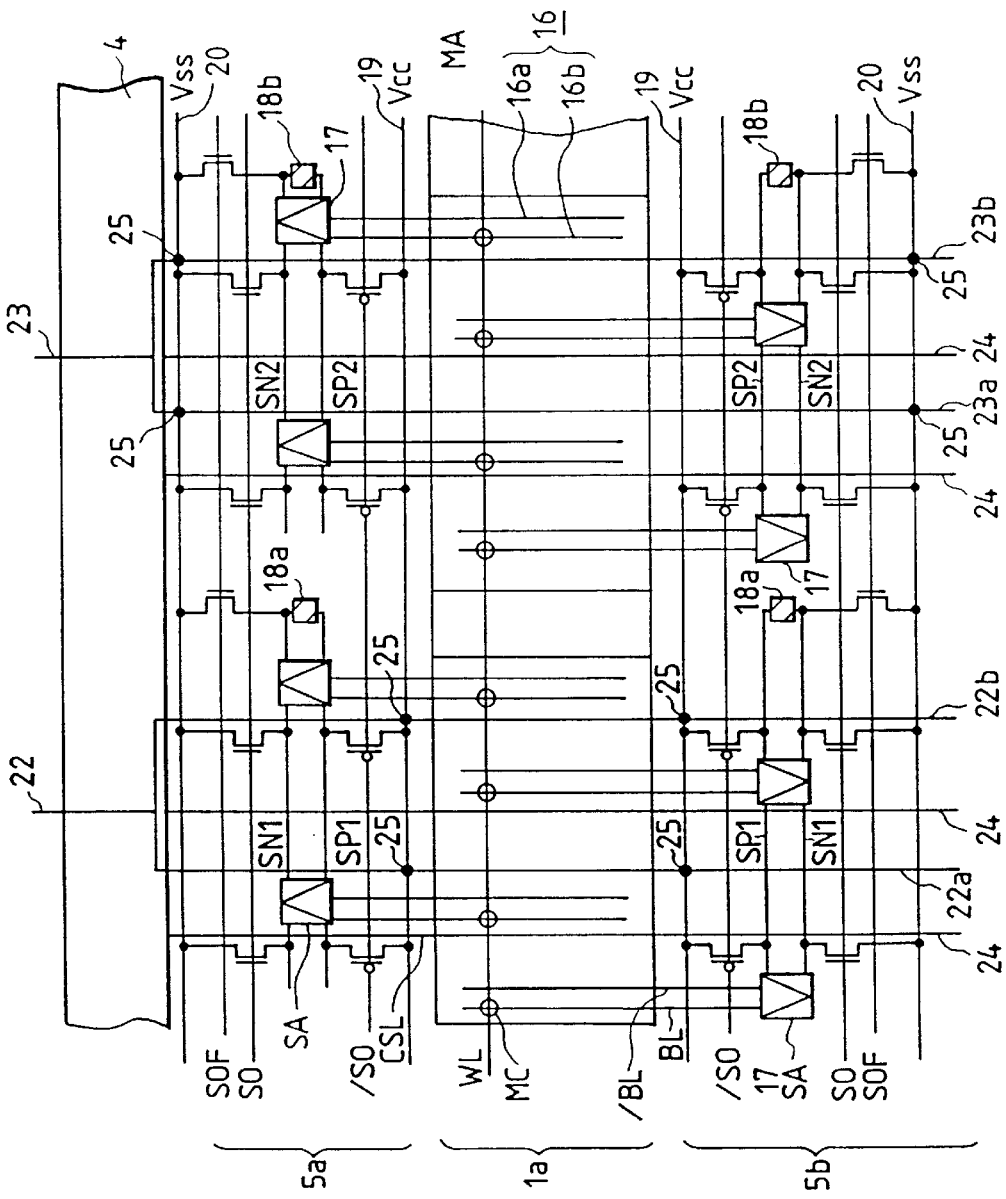

In addition, although in FIG. 3 the memory cell sub-array 1a is formed adjacent to the column decoder 4, the sense-amplifier forming region 5a is disposed adjacent to the column decoder 4 in FIG. 8. However, there is no difference in the effect due to the difference in the layout, and since utterly the same effect is produced, it is possible to adopt either layout. Furthermore, although, in the enlarged view of the semiconductor storage device shown in FIG. 3, the sense amplifiers 17 are juxtaposed in a row in the direction of the rows of the memory cells, it is possible to form two rows of sense-amplifier forming regions 5a and 5b with a belt-like memory cell sub-array 1a placed therebetween, as shown in FIG. 9. This makes it possible to reduce the element-forming region in the direction of the rows of the memory cells.

Figure 10A:
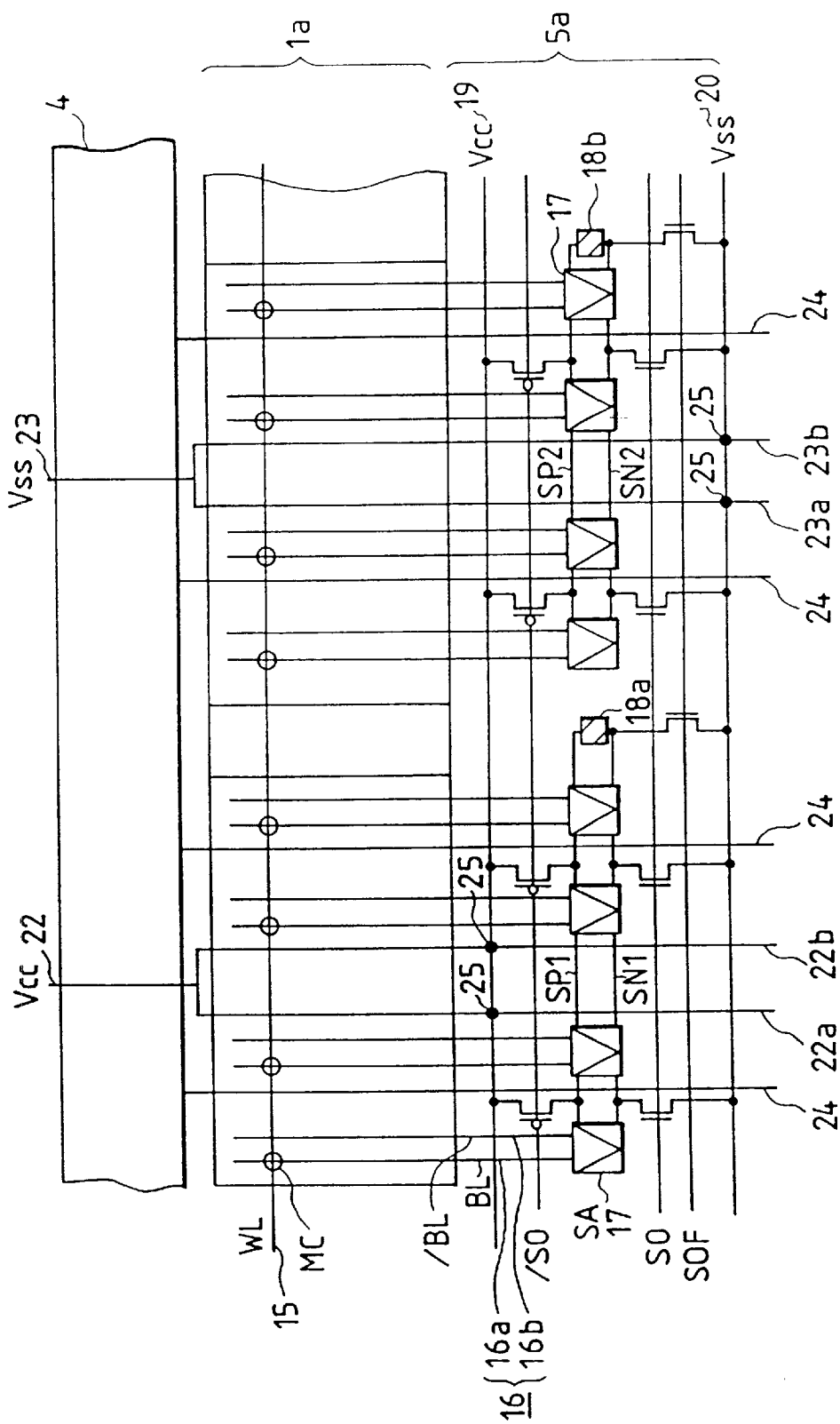
Figure 10B:
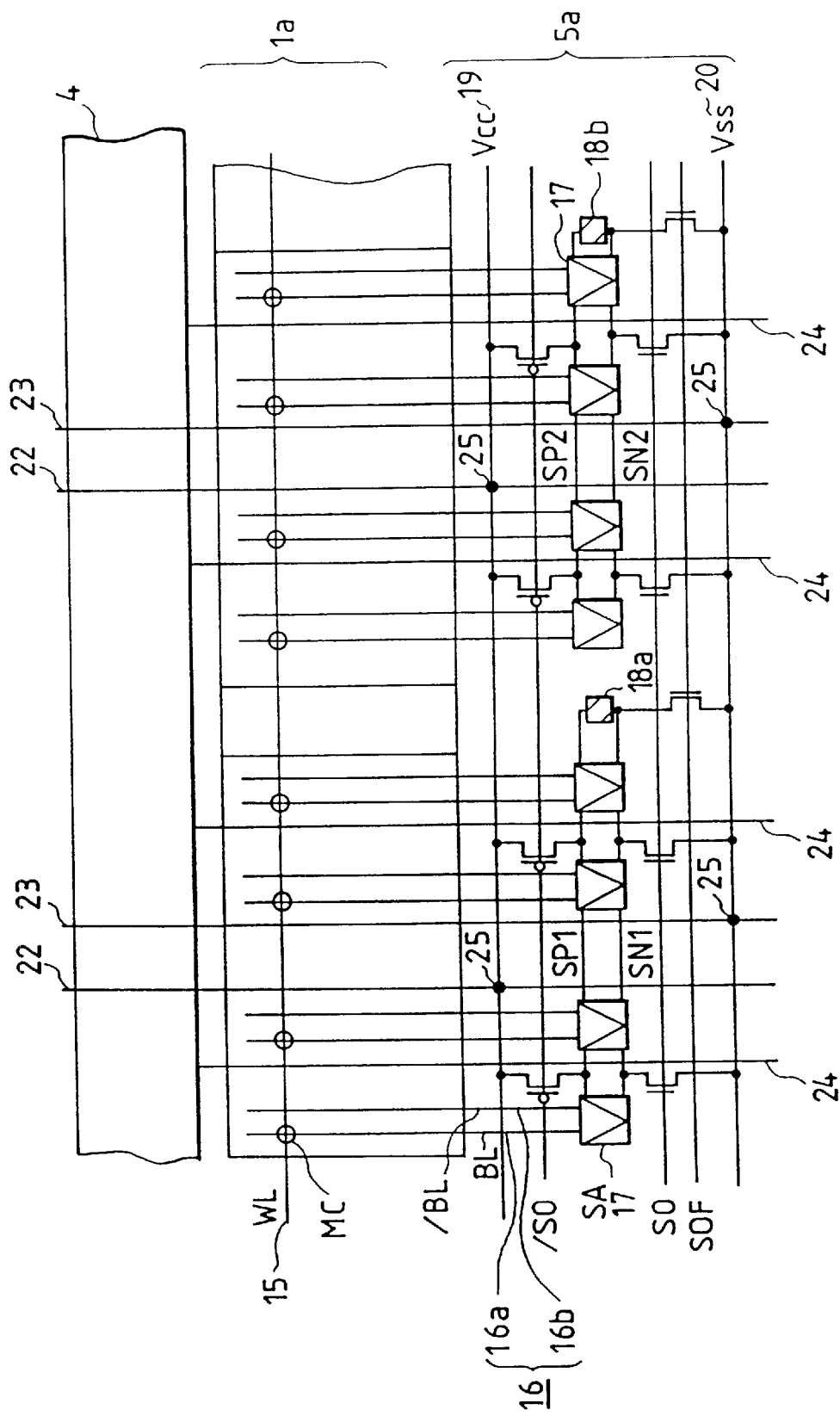

Furthermore, although each of the column selection signal lines 24 can be disposed between two adjacent ones of the power supply lines (22a and 22b) and the grounding (lines 23a and 23b) as shown in FIGS. 3, 8, and 9, the column selection signal lines 24 may be respectively disposed on both sides of the two power supply lines (22a and 22b) or the two grounding lines (23a and 23b), as shown in FIG. 10A. Alternatively, the column selection signal lines 24 may be respectively disposed on both sides of the power supply line 22 and the grounding line 23 disposed adjacent to each other, as shown in FIG. 10B. In this case, as the power supply line 22 and the grounding line 23 which are adjacent to each other are disposed on the column decoder 4 as close to each other as possible, it is possible to expand the effective area of the formation of the column decoder.

Furthermore, in this embodiment, since the plurality of power supply lines 22 and grounding lines 23 extending in the direction of the columns of the memory cells are respectively connected via the through holes 25 to the power supply lines 19 and the grounding lines 20 extending in the direction of the rows of the memory cells in the sense-amplifier forming region, power can be speedily supplied to the sense-amplifier driver signal lines SP1 and SN1 (or SN2 and SP2). Hence, the time required for charging these sense-amplifier driver signal lines can be reduced, thereby enabling high-speed sensing operation.

Second Embodiment

While the above-described first embodiment is mainly directed to the layout of the power supply lines (22a, 22b) and the grounding lines (23a, 23b) which extend in the direction of the columns of the memory cells, in this embodiment a description will be given of how the power supply lines and the grounding lines are arranged on memory cell blocks 26a and 26b (shown in FIG. 11) included in the memory cell sub-array 1a.

Figure 11:
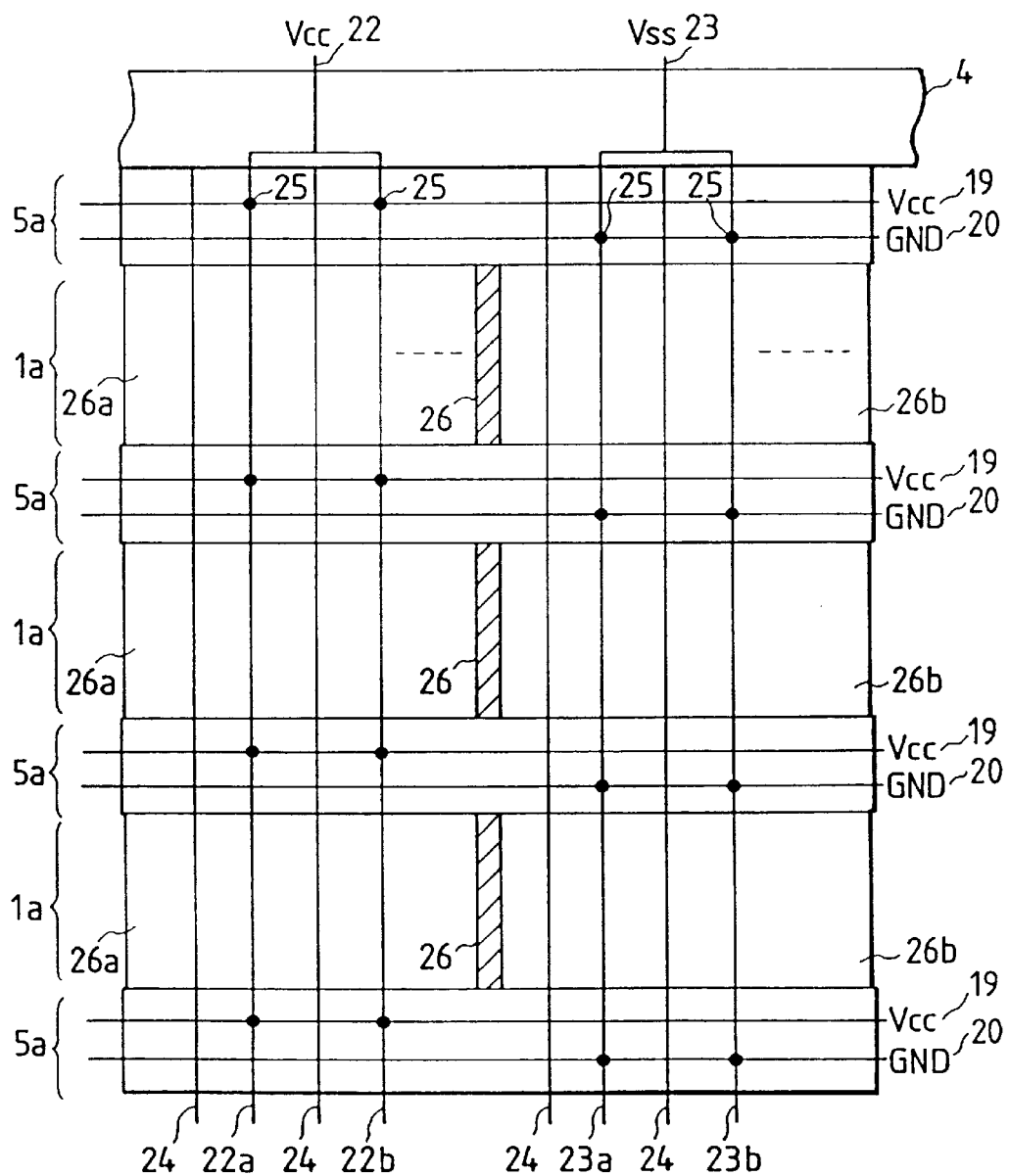
FIGS. 11 and 12 semiconductor storage devices according to a second embodiment of the invention.

FIG. 11 shows the memory cell blocks 26a and 26b which are formed by dividing one memory cell sub-array 1a region by a word-line shunting region 26, and the memory cells are arrayed in the memory cell blocks 26a and 26b in the directions of the rows and columns. The aforementioned word-line shunting region 26 is a region where a connecting portion between a metal wiring and a wiring made of polycrystalline silicon is formed so as to obtain low resistance of the word lines. Since this connecting portion must be formed, memory cells are not formed in the word-line shunting region. Accordingly, it can be said that this is a region where the memory cells arranged in the memory cell sub-array 1a are made discontinuous.

The characteristic feature of the invention shown in this second embodiment is that, as for the wirings arranged on the aforementioned memory cell block 26a in the direction of the columns of the memory cells, apart from the signal lines either the power supply lines or the grounding lines are disposed on one memory cell block. In one example, the signal lines (here, the column selection signal lines 24) and the power supply lines (22a and 22b) may only be disposed, and in another example the signal lines (24) and the grounding lines (23a and 23b) may only be disposed. In the example shown in FIG. 11, the power supply lines 22a and 22b are disposed on the memory cell block 26a, and the column selection signal lines 24 and these power supply lines are arranged alternately with one kind of line alternating with another. Meanwhile, the grounding lines 23a and 23b are disposed on the memory cell block 26b, and the column selection signal lines 24 and these grounding lines are arranged alternately with one kind of line alternating with another.

Even if the power supply lines (22a and 22b) and the grounding lines (23a and 23b) are thus arranged, in the same way as in the first embodiment the wirings which are at the same potential in the vicinity of the boundary between the column decoder 4 and the sense-amplifier forming region 5a or the memory cell sub-array 1a can be formed as one relatively wide wiring layer (comprising the power supply line 22 and the grounding line 23 in this example). As a result, the number of wirings traversing the column decoder 4 can be decreased, thereby making it possible to expand the effective area where the column decoder 4 is formed.

Figure 12:
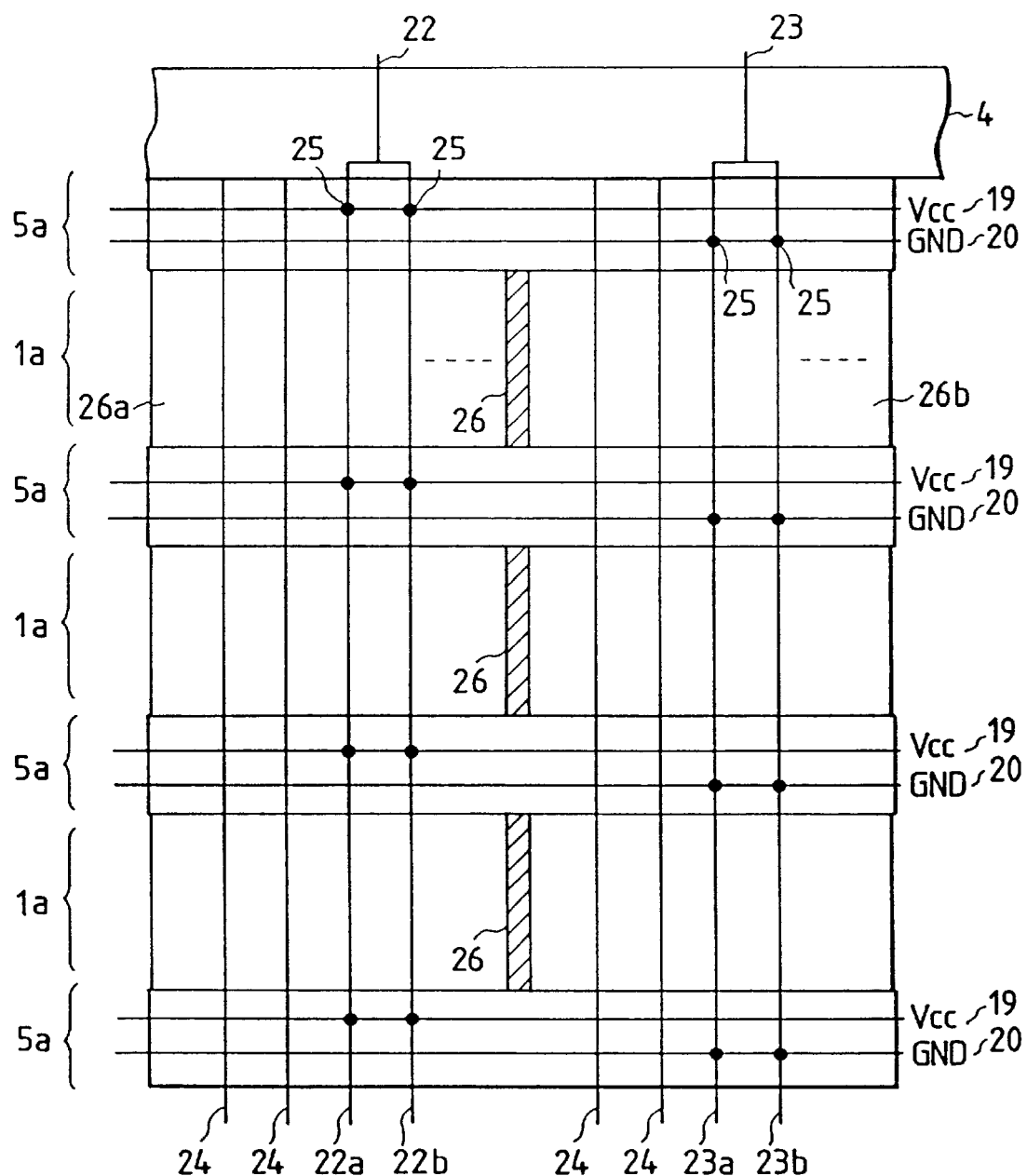

Although in FIG. 11 the signal lines (column selection signal lines) and the power supply lines or the grounding lines are arranged alternately with one kind of line alternating with another, it is possible to obtain an effect similar to that of the device shown in FIG. 11 if a group of signal lines and a group of power supply lines (or grounding lines) are arranged alternately as shown in FIG. 12 in which, for instance, two signal lines (column selection signal lines) and two power supply lines or two grounding lines are arranged alternately in units of two similar lines on each memory cell block.

If, as another example, the column selection signal lines 24 are respectively disposed on both sides of two power supply lines 22a and 22b (the arrangement is not shown), it is possible to obtain an effect similar to that of the device shown in FIG. 11. As still another example, as for the power supply lines and the grounding lines which extend in the direction of the columns of the memory cells, although the power supply lines 22a and 22b on the column decoder 4 are combined as a single power supply line 22, and the grounding lines 23a and 23b are combined as a single grounding line 23 in FIGS. 11 and 12, even if the power supply lines 22a and 22b and the grounding lines 23a and 23b are not combined, but are arranged on the column decoder 4 as different wirings, it is possible to obtain a semiconductor storage device having utterly the same power supplying capability as in the case of the devices shown in FIGS. 11 and 12.

Third Embodiment

Figure 13:
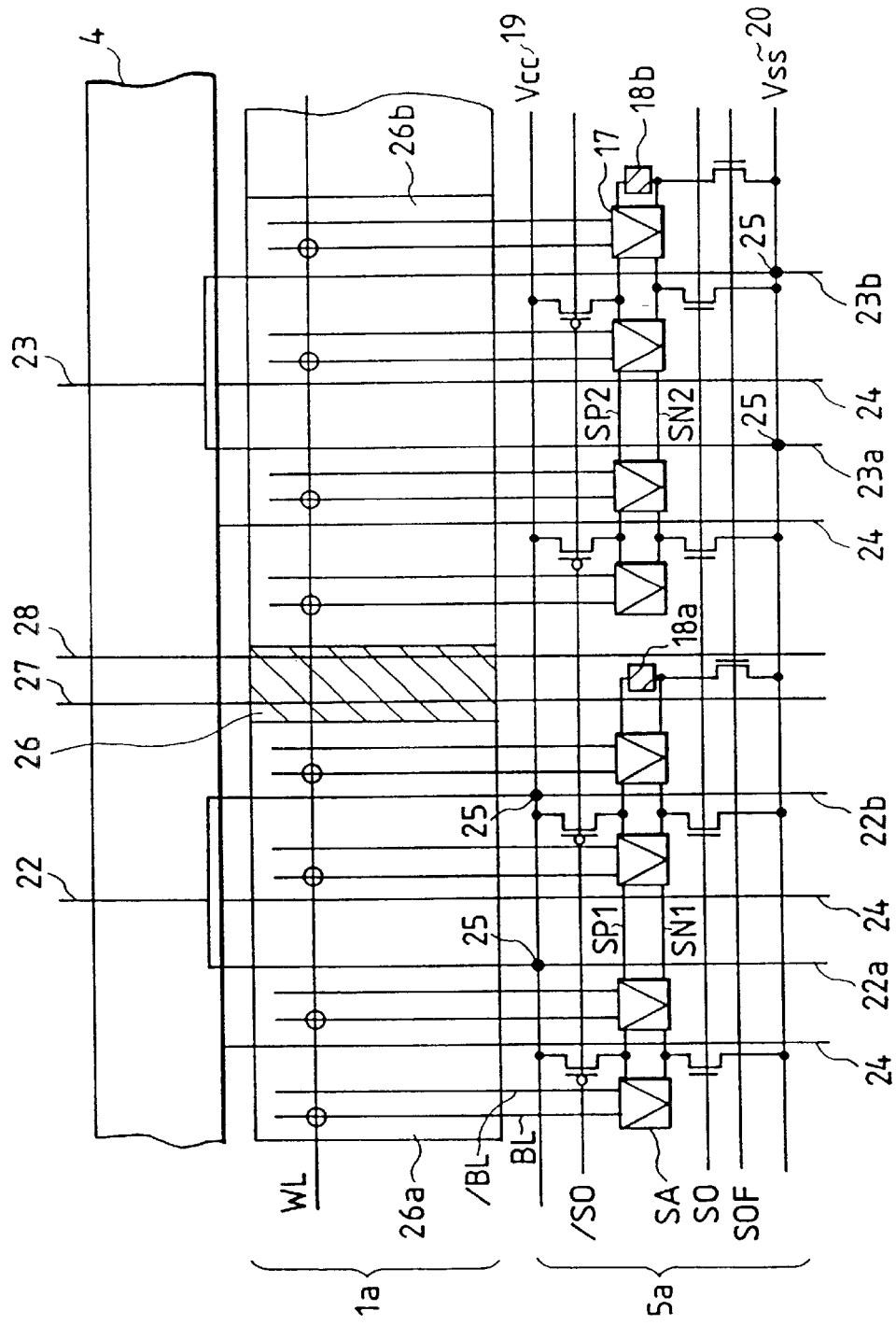
FIG. 13 shows a semiconductor storage device according to a third embodiment of the invention.

Next, a description will be given of a third embodiment of the present invention. As described in the first and second embodiments, the memory cell array includes the plurality of memory cell sub-arrays 1a, and each of the memory cell sub-arrays is comprised of the plurality of memory cell blocks 26a and 26b. As shown in FIG. 13, the series of memory cell blocks 26a and 26b is divided by the word-line shunting region 26. As described in the second embodiment, this word-line shunting region 26 is a region where a connecting portion between the metal wiring of the word line and the wiring made of polycrystalline silicon is formed. Since this connecting portion must be formed, it has been difficult to form memory cells in the word-line shunting region 26.

However, even if the formation of memory cells is difficult, it is possible to arrange the wirings on the connecting portion in the direction of the columns of the memory cells by placing an insulating layer therebetween. Accordingly, in this embodiment, in addition to the semiconductor storage devices shown in the first and second embodiments, referring to FIG. 13, a description will be given of a semiconductor storage device in which a column selection signal line 27 and a power supply line 28, such as a power supply line for supplying power supply potential or a grounding line for supplying ground potential, are arranged in the word-line shunting region 26 between adjacent memory cell blocks.

In FIG. 13, the same reference numerals as those used in the description of the first and second embodiments denote identical or corresponding portions. In this drawing, one signal line 27 and one power supply line 28 are arranged in the word-line shunting region 26 by way of example. However, if it is necessary to strengthen the power supply with respect to a predetermined portion of the memory cell array, only a plurality of power supply lines may be arranged therein. Alternatively, a plurality of signal lines, such as the column selection signal lines, may be arranged therein. The signal line(s) or the power supply line(s) which are arranged in one word-line shunting region 26 may be constituted by a single line having a relatively large width, and the line may be divided at a necessary portion into a plurality of lines each having a relatively small width.

Since the signal line(s) 27 and/or the power supply line(s) 28 are arranged in the word-line shunting region 26 which is conventionally used only as a through-hole forming region for connecting the metal wiring constituting the word line and the wiring made of polycrystalline silicon, it is possible to obtain a highly reliable semiconductor storage device.

Fourth Embodiment

Next, referring to FIGS. 14 and 15, a description will be given of a fourth embodiment of the present invention. The characteristic feature of this embodiment lies in the layout of the signal lines extending in the direction of the columns of the memory cells. In addition, as shown in FIG. 14, the power supply line 22 and the grounding line 23 are disposed adjacent to each other with two column selection signal lines 24 placed respectively on both sides thereof.

For instance, a case is now considered in which adjacent wirings have short-circuited due to the distortion of the wiring of signal lines or the like or a defect occurring in the formation of the wiring in a case where the power supply lines and the grounding lines are arranged alternately with one kind of line alternating with another. If the column selection signal line 24 and the power supply line 22 have short-circuited, electric current flows from the power supply line 22 to the column selection signal line 24, the power consumption increases, and the potential at the column selection signal line 24 is set to a level to which the potential should not be essentially set.

Figure 14:
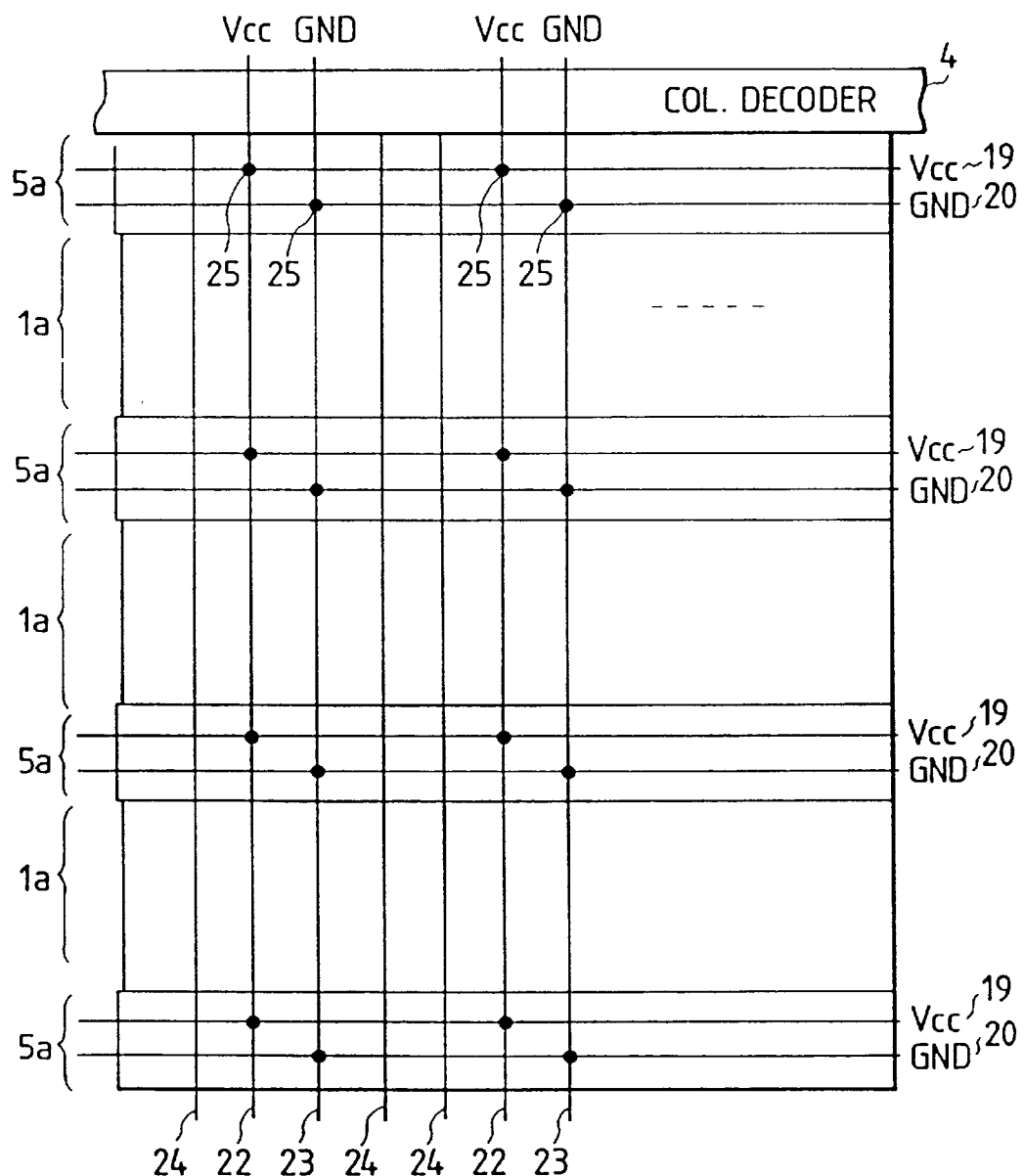
FIGS. 14 and 15 show semiconductor storage devices according to a fourth embodiment of the invention.

Accordingly, as the two column selection signal lines 24 are disposed between the power supply line 22 and the grounding line 23 as shown in FIG. 14, even in a case where the mutually adjacent column selection signal lines 24 are short-circuited due to a distortion, a projection, or the like occurring at the time of the formation of the wiring, it is possible to suppress an increase in the power consumption as compared with a case where the power supply line 22 and the grounding line 23 are short-circuited. Hence, there is an advantage in that it is possible to minimize the effect of a short-circuiting between wirings, such as the malfunctioning of the device due to fluctuations of voltage between the power supply line 22 and the grounding line 23. Furthermore, in this embodiment, the power supply lines 22 and the grounding lines 23 are arranged uniformly so as to extend in the direction of the column of the memory cell array as in the above-described embodiments, and are respectively connected via the through holes to the power supply lines 19 and the grounding lines 20 which are arranged uniformly in the sense-amplifier forming region 5a so as to extend in the direction of the rows. Therefore, it is possible to supply sufficient power to the sense amplifiers formed in the memory cell array.

Figure 15:
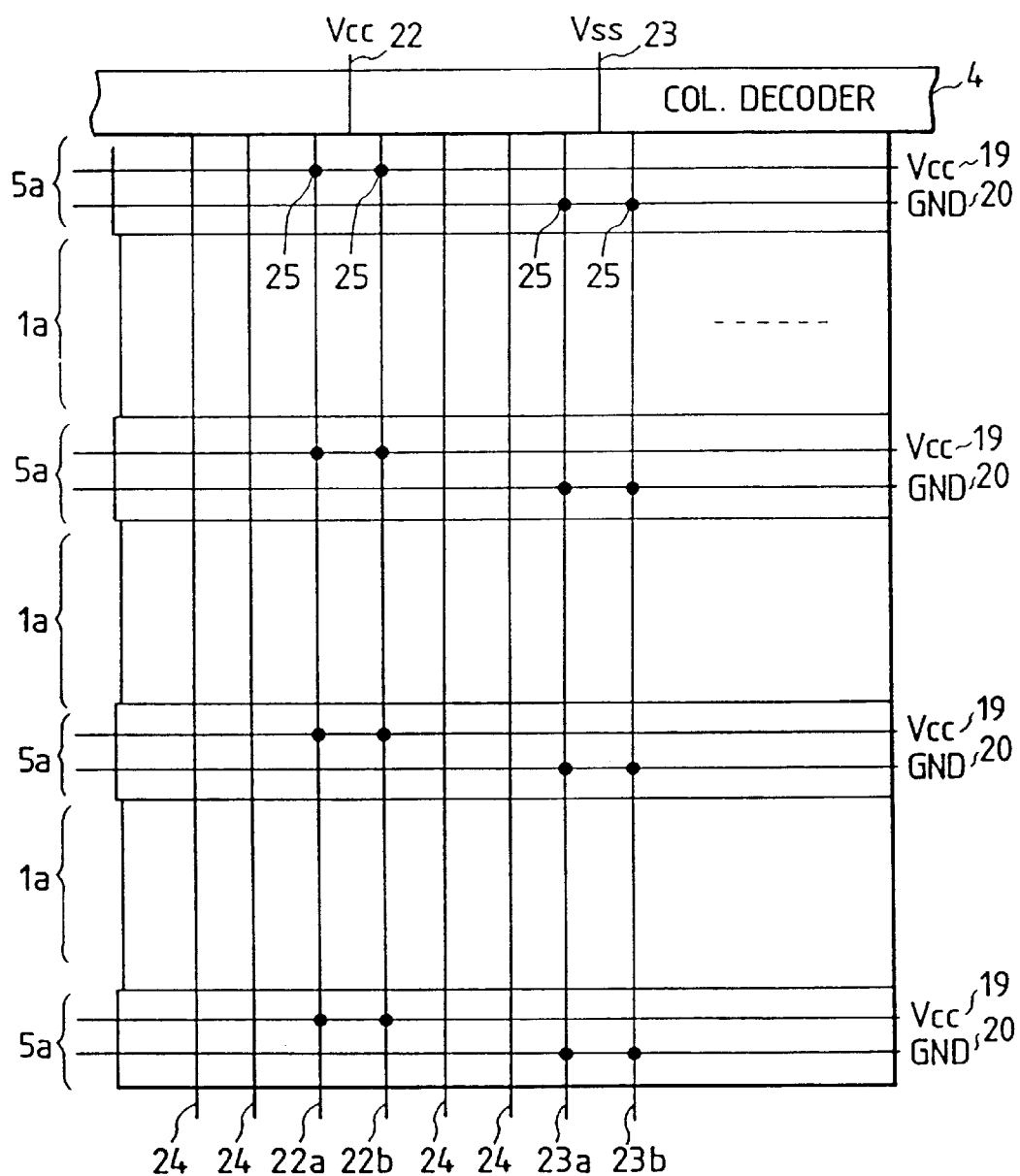

In addition, as shown in FIG. 15, if two signal lines extending in the direction of the columns of the memory cells are arranged adjacent to each other, and two adjacent power supply lines which are at the same potential are arranged adjacent to these signal lines, and if the two power supply lines 22a and 22b (or grounding lines 23a and 23b) arranged on the memory cell array are combined into a single power supply line 22 (or grounding line 23), it is possible to expand the effective area of the formation of the elements of the column decoder. Hence, there is an advantage in that the formation of a more multifunctional column decoder can be facilitated. Although, in FIG. 15, the power supply lines which are arranged on the memory cell array are shown as being two power supply lines 22a and 22b, it is possible to obtain a similar effect if a plurality of power supply lines are used.

Fifth Embodiment

Figure 16:
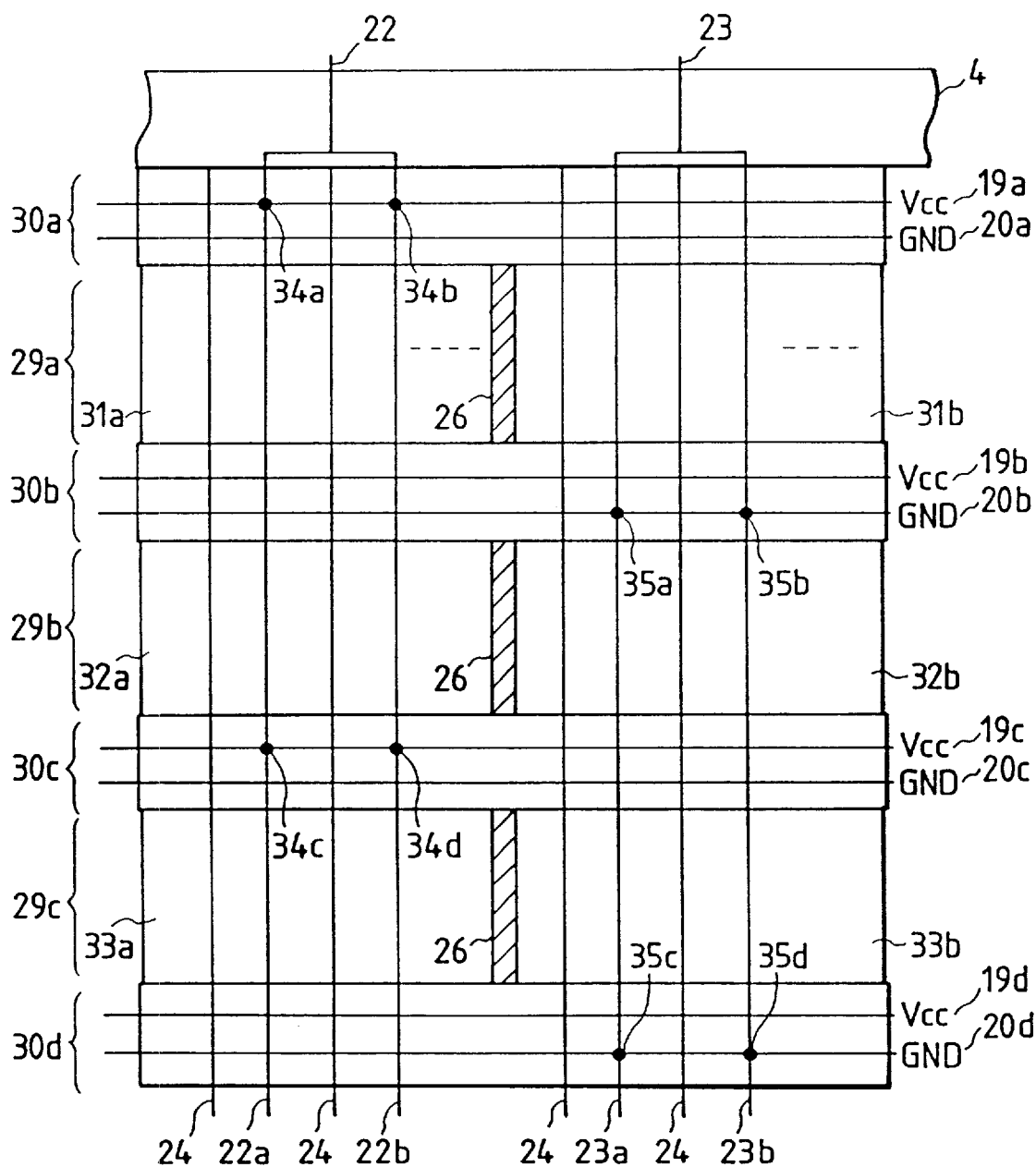
FIGS. 16–19 show semiconductor storage devices according to a fifth embodiment of the invention.

Next, referring to FIG. 16, a description will be given of a fifth embodiment of the present invention. In FIG. 16, reference numerals 29a, 29b, and 29c respectively denote memory cell sub-arrays which are constituent elements of the memory cell array, i.e., assemblies of memory cells. Numeral 30a denotes a sense-amplifier forming region connected to the memory cells formed in the memory cell sub-array 29a. Numeral 30b denotes a sense-amplifier forming region connected to the memory cells formed in the memory cell sub-array 29b. Numeral 30c denotes a sense-amplifier forming region connected to the memory cells formed in the memory cell sub-array 29c. (The same applies to 30d as well.) Further, numerals 34a and 34b respectively denote through holes for connecting the power supply lines 22a and 22b to a power supply line 19a extending in the direction of the rows of the memory cells.

In addition, numerals 35a and 35b denote through holes for connecting the grounding lines 23a and 23b to a grounding line 20b extending in the direction of the rows of the memory cells. Numerals 34c and 34d denote through holes for connecting the power supply lines 22a and 22b to a power supply line 19c extending in the direction of the rows of the memory cells. Numerals 35c and 35d denote through holes for connecting the grounding lines 23a and 23b to a grounding line 20d extending in the direction of the rows of the memory cells. Further, the memory cell sub-array 29a is divided into a plurality of memory cell blocks by one or more word-line shunting regions 26. Here, a case in which two memory cell blocks are juxtaposed in the direction of the rows is considered as one example. Numerals 31a and 31b denote memory cell blocks included in the memory cell sub-array 29a. Similarly, numerals 32a and 32b denote memory cell blocks included in the memory cell sub-array 29b, and numerals 33a and 33b denote memory cell blocks included in the memory cell sub-array 29c. The other reference numerals which are the same as those used in the description of the first to fourth embodiments denote identical or corresponding portions.

The characteristic feature of this embodiment lies in the positions of formation of the through holes for connecting the power supply lines extending in the direction of the rows of the memory cells and the power supply lines extending in the direction of the columns. For instance, power supply potential (Vcc) is supplied to the sense amplifiers connected to the memory cell sub-array 29a (these sense amplifiers are included in the sense-amplifier forming region 30a) from the power supply lines 19a, 22a, and 22b connected to each other via the through holes 34a and 34b. Meanwhile, ground potential (Vss) is supplied to the sense amplifiers connected to the memory cell sub-array 29b (these sense amplifiers are included in the sense-amplifier forming region 30b) from the grounding lines 20b, 23a, and 23b connected to each other via the through holes 35a and 35b.

As shown in the drawings used for the description of the first to fourth embodiments, such as FIG. 8 illustrating the first embodiment, the power supply lines 22a and 22b (grounding lines 23a and 23b) extending in the direction of the columns of the memory cells and the power supply line 19 (grounding line 20) extending in the direction of the rows are electrically connected to each other via the through hole 25 at each position where these two power supply lines, which are at the same potential, are superposed on each other. The power supply potential or the ground potential is thereby strengthened. If such two power supply lines extending in the directions of the rows and columns are thus connected to each other via the through hole at each position where they are superposed on each other, it is possible to strengthen the power supplying capability uniformly for the overall memory cell array.

However, in a case where it is necessary to increase predetermined power supplying capability particularly for assemblies (memory cell sub-arrays, or in smaller units, memory cell blocks) of the memory cells having a high frequency of being particularly activated in the memory cell array, the selective formation of through holes as shown in FIG. 16 is effective. In this example, the capability of supplying the power supply potential (Vcc) is strengthened with respect to the sense-amplifier forming regions 30a and 30c. Meanwhile, the capability of supplying the ground potential (Vss) is strengthened with respect to the sense-amplifier forming regions 30b and 30d.

In this example, the through holes which are provided on the power supply line 22a are formed at positions where the line 22a is superposed on the power supply lines 19 which are odd-numbered from the column decoder 4 side and extend in the direction of the rows. The same holds true of the grounding line 23 as well. As the through holes are thus formed at positions where the lines are superposed at preselected positions, there is an advantage in that the power supplying capability can be strengthened with respect to particular memory cell assemblies.

Figure 17:
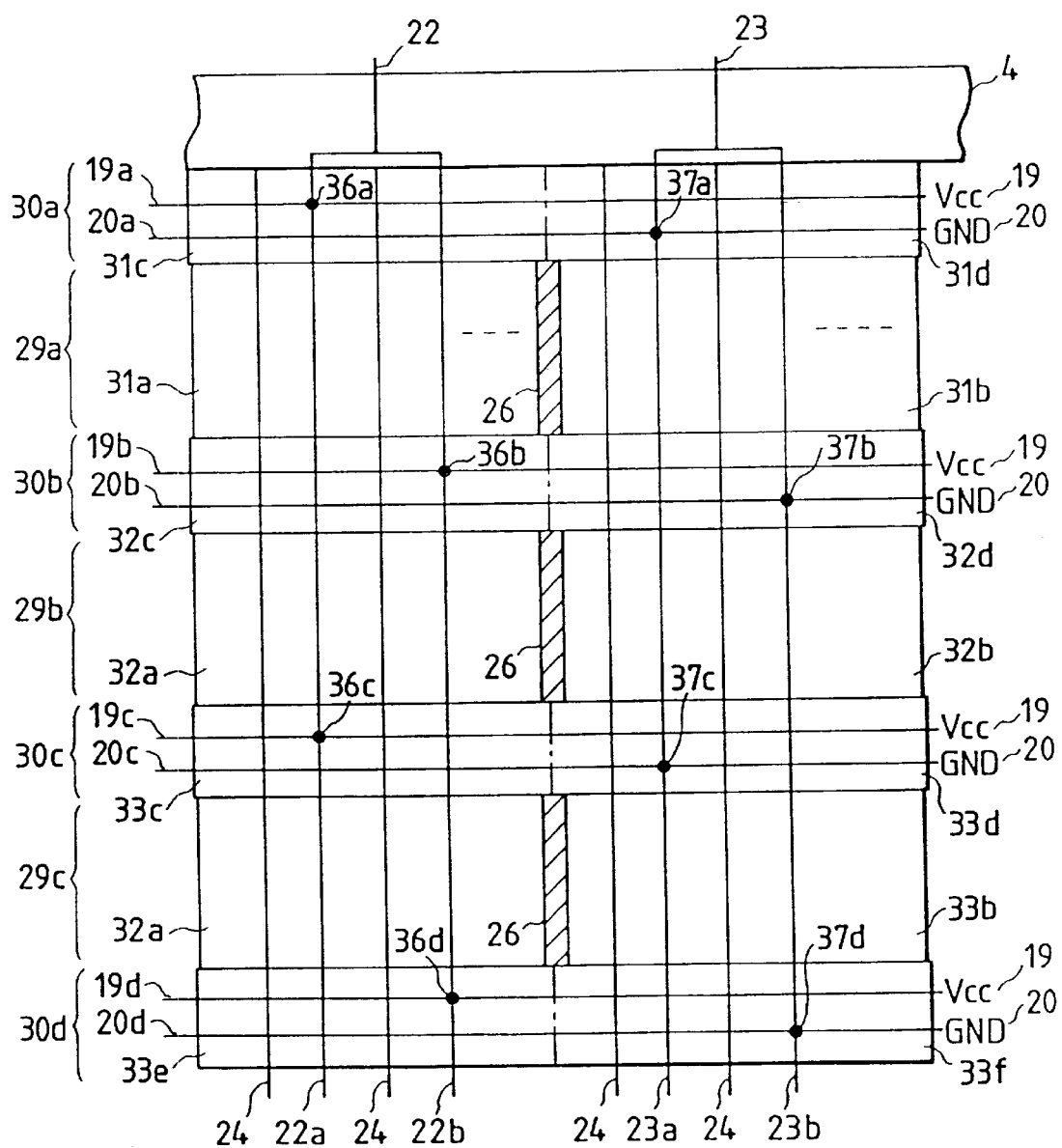

As another example of the strengthening of the power supplying capability, it is possible to cite the layout of the through holes shown in FIG. 17. In this drawing, reference numerals 31c and 31d respectively denote sense amplifier blocks which are regions where the sense amplifiers connected to the memory cells formed in the memory cell blocks 31a and 31b are formed. Numerals 32c, 32d, 33c, 33d, 33e, and 33f similarly denote sense amplifier blocks. The other reference numerals which are the same as those already used in the foregoing description denote identical or corresponding portions.

As for the positions of the through holes by which the power supply lines at the same potential are connected to each other, the through holes for the power supply line 22a extending in the direction of the columns of the memory cells are formed at positions where the power supply line 22a is superposed on the odd-numbered power supply lines 19 extending in the direction of the rows. Meanwhile, the through holes for the power supply line 22b extending in the direction of the columns and located adjacent to the power supply line 22a are formed at positions where the power supply line 22b is superposed on the even-numbered power supply lines 19 extending in the direction of the rows. Also, the positions where the through holes for the grounding lines are similar to the case of the power supply lines. If the through holes are thus arranged, both the power supply potential (Vcc) and the ground potential (Vss) are supplied to the sense-amplifier forming region 30a, for instance, and the power supply potential and the ground potential are similarly supplied to the other sense-amplifier forming regions as well.

However, if consideration is given to the supplying of power to the sense amplifier blocks connected to the memory cell sub-arrays in units of the memory cell sub-arrays, the power supply lines 19 and 22a are connected to the sense amplifier block 31c by a through hole 36a, so that it can be said that the supply of the power supply potential (Vcc) is strengthened. Further, the grounding lines 20 and 23a are connected to the sense amplifier block 31d by a through hole 37a, so that it can be said that the ground potential (Vss) is strengthened. Thus, if the minimum unit of the region of the memory cell array which particularly requires the supply of power supply potential is the sense amplifier block, it is possible to supply the necessary power supply potential (or ground potential) for each sense amplifier block.

Figure 18:
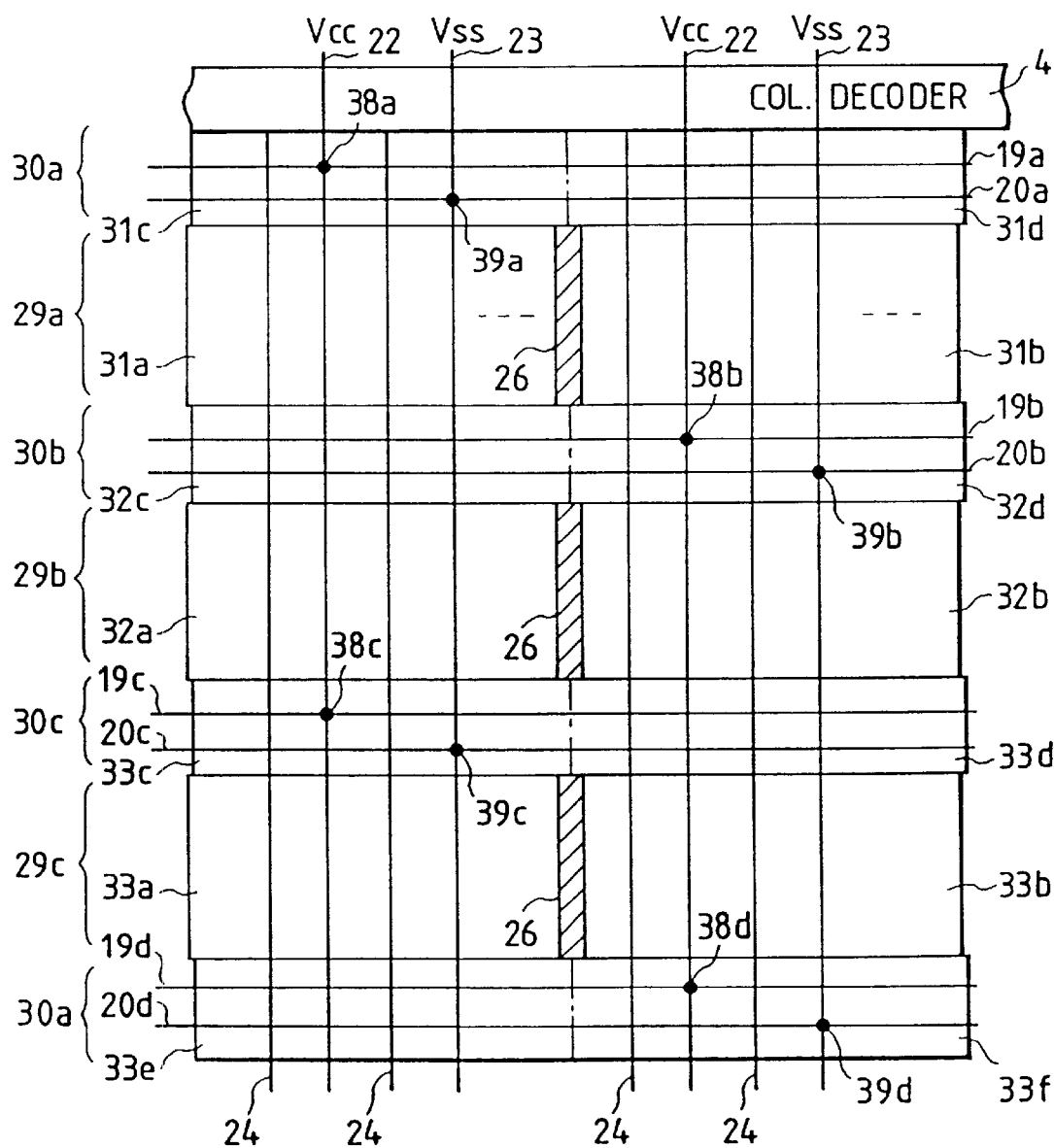

As still another example of the strengthening of the power supplying capability, it is possible to cite a case shown in FIG. 18. In this drawing, reference numerals 38a, 38b, 38c, and 38d and 39a, 39b, 39c, and 39d denote through holes, and the same reference numerals as those already used in the foregoing description denote identical or corresponding portions. The difference between this example and the example shown in FIG. 17 lies in that although the power supply lines and the grounding lines extending in the direction of the columns of the memory cell array of the semiconductor storage device shown in FIG. 17 are arranged such that a plurality of power supply lines (grounding lines) at the same potential are disposed adjacent to each other, in this example (FIG. 18) the power supply lines 22 and the grounding lines 23 extending in the direction of the columns of the memory cells are arranged alternately with one kind of line alternating with another.

Also as for this arrangement in which the power supply lines 22 and the grounding lines 23 are thus arranged alternately, if a comparison is made between the sense amplifier block 31c where the sense amplifiers connected to the memory cell block 31a are formed and the sense amplifier block 31d where the sense amplifiers connected to the memory cell block 31b are formed, the sense amplifier block 31c requires a higher power supplying capability. Similarly, in a case where the sense amplifier block 31c requires a higher power supplying capability as a result of comparison between the aforementioned sense amplifier bock 31c and the sense amplifier block 32c where the sense amplifiers connected to the memory cell block 32a are formed, it is possible to particularly strengthen the power supplying capability for the sense amplifier bock 31c by forming the through holes 38a and 39a on the sense amplifier bock 31c. In the case of FIG. 18, the power supplying capability for the sense amplifier blocks 31c, 32d, 33c, and 33f is particularly strengthened.

Figure 19:
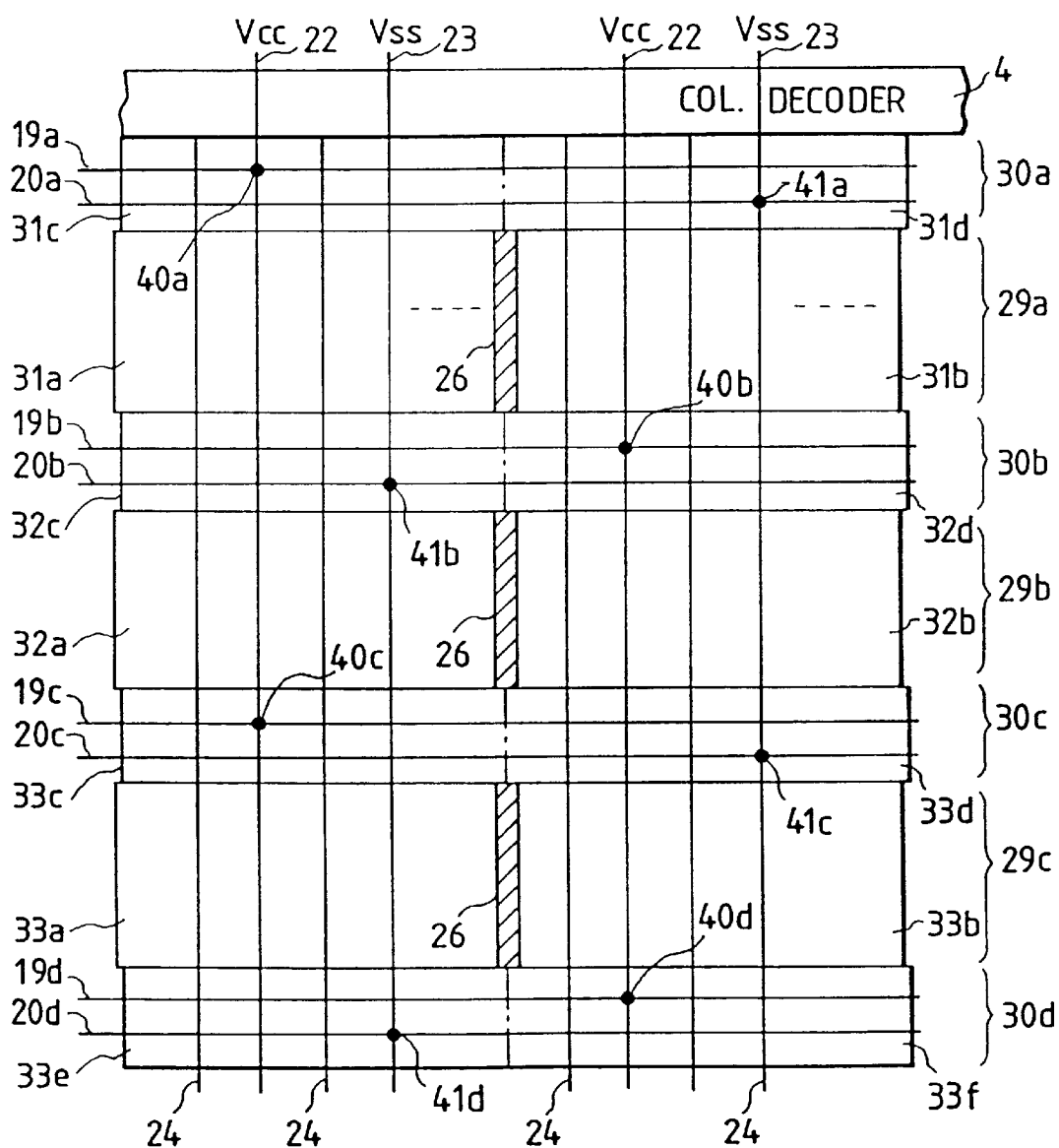

As a further example of the strengthening of the power supplying capability, there is a case such as the one cited in FIG. 19. In this drawing, reference numerals 40a, 40b, 40c, and 40d and 41a, 41b, 41c, and 41d denote through holes, and the same reference numerals as those already used in the foregoing description denote identical or corresponding portions. The difference between this example and the example shown in FIG. 18 lies in the positions of formation of the through holes which are connecting portions between the grounding lines 23 extending in the direction of the columns of the memory cells and the grounding lines 20 extending in the direction of the rows. In the case shown in FIG. 18, the through holes formed on the power supply line 22 and the through holes formed on the grounding line 23 are formed on the same sense amplifier block, but in the case of FIG. 19, the through holes formed on the power supply line 22 and the through holes formed on the grounding line 23 are formed on different sense amplifier blocks. As shown in FIG. 19, it is possible to strengthen the power supplying capability selectively with respect to the sense amplifier blocks, such as by forming the through hole 40a on the sense amplifier bock 31c for strengthening the power supply potential (Vcc) and by forming the through hole 41a on the sense amplifier bock 31d for strengthening the ground potential (Vss).

Furthermore, the through hole in an actual device is designed to a size of a 0.5 $\mu$m square or thereabouts in a 64M DRAM, and occupies a relatively large area in contrast to the fact that the size of a contact between an active region and a wiring layer in a semiconductor substrate is 0.3 $\mu$m square. Hence, there has been a possibility that the formation of a plurality of through holes in an identical plane at mutually close distances leads to a decline in the leeway in the formation of wiring layers for other power supply lines and the like. However, since the through holes are not formed in the vicinities of adjacent power supply lines (grounding lines) as in the layout of the through holes shown in FIGS. 17 and 19 in accordance with this embodiment, there is an advantage in that it is possible to enhance leeway in the formation of wiring layers for other power supply lines and the like.

Sixth Embodiment

The invention according to the second to fifth embodiments shows a method in which the word lines consisting of low-resistance metal wirings are arranged in parallel and connected to polycrystalline silicon wirings at predetermined positions (this system is referred to as a word line shunt system) so as to lower the wiring resistance as compared to a case where the entire wirings are formed of polycrystalline silicon. Although the rise time constant can be reduced by the above-described method, in conjunction with advancement in the fine patterning of elements due to the higher integration of the semiconductor storage device, since the wiring width of the metal wirings is relatively large, the leeway in the formation of other wirings has become small. Thus it is conceivable that the possibility of causing a decline in yield in the manufacturing process is high. This embodiment in accordance with the present invention is based on a method which makes it. possible to achieve the low resistance of the word lines without using metal wiring for each word line in the manner described above.

Figure 20A:
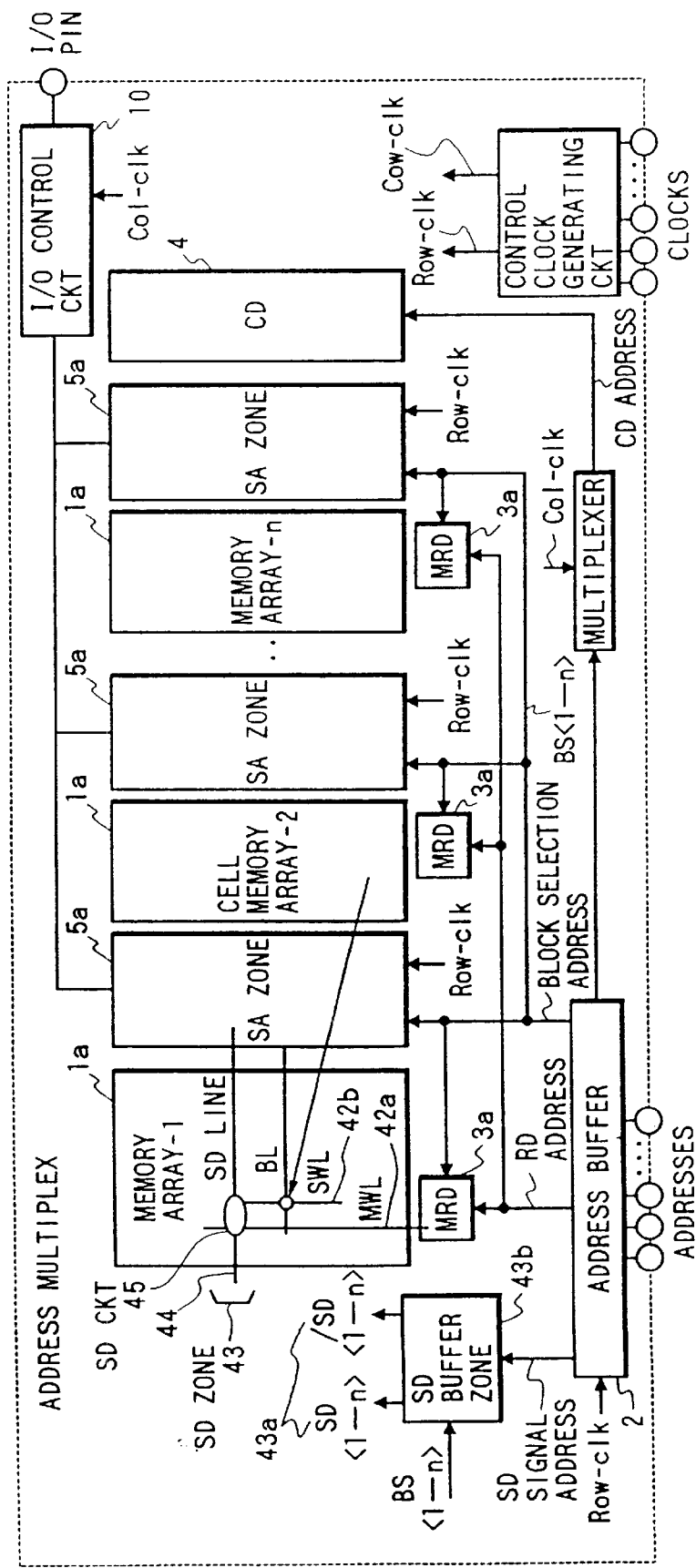
Figure 20B:
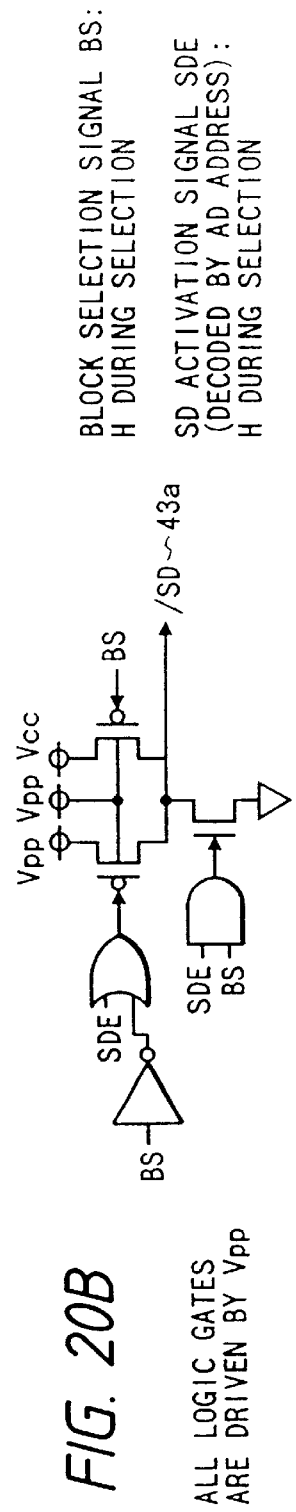

Next, to describe this embodiment, a description will be first given of a word line division system used for achieving the low resistance of the word lines with reference to FIG. 20A. FIG. 20A shows an overall block diagram of the semiconductor storage device, and the same reference numerals as those already used denote identical or corresponding portions. In this word line division system, a main word line 42a (first metal wiring) is selected by a main row decoder 3a, and a sub-word line 42b is selected by a decoded sub-decoding signal 43a in a sub-decoding zone 43 formed in the memory cell sub-array 1a. Consequently, it becomes possible to disperse the load on the word line, allowing the voltage at the word line to be raised at high speed. The sub-decoding signal 43a is a signal outputted by a sub-decoding buffer zone 43b shown in FIG. 20B, and a sub-decoding circuit 45 is a circuit formed at a position of intersection between the main word line 42a and a sub-decoding line 44.

In this word line division system, as compared with a case where the word line shunt system is used, the greater the number of ways (the number of branches) of the sub-decoding lines 44, the more the interval between the first metal wirings (main word lines 42a) disposed can be shortened. Consequently, the leeway in the formation of wirings other than the word lines increases, so that it becomes possible to improve the yield in the manufacturing process.

Figure 21A:
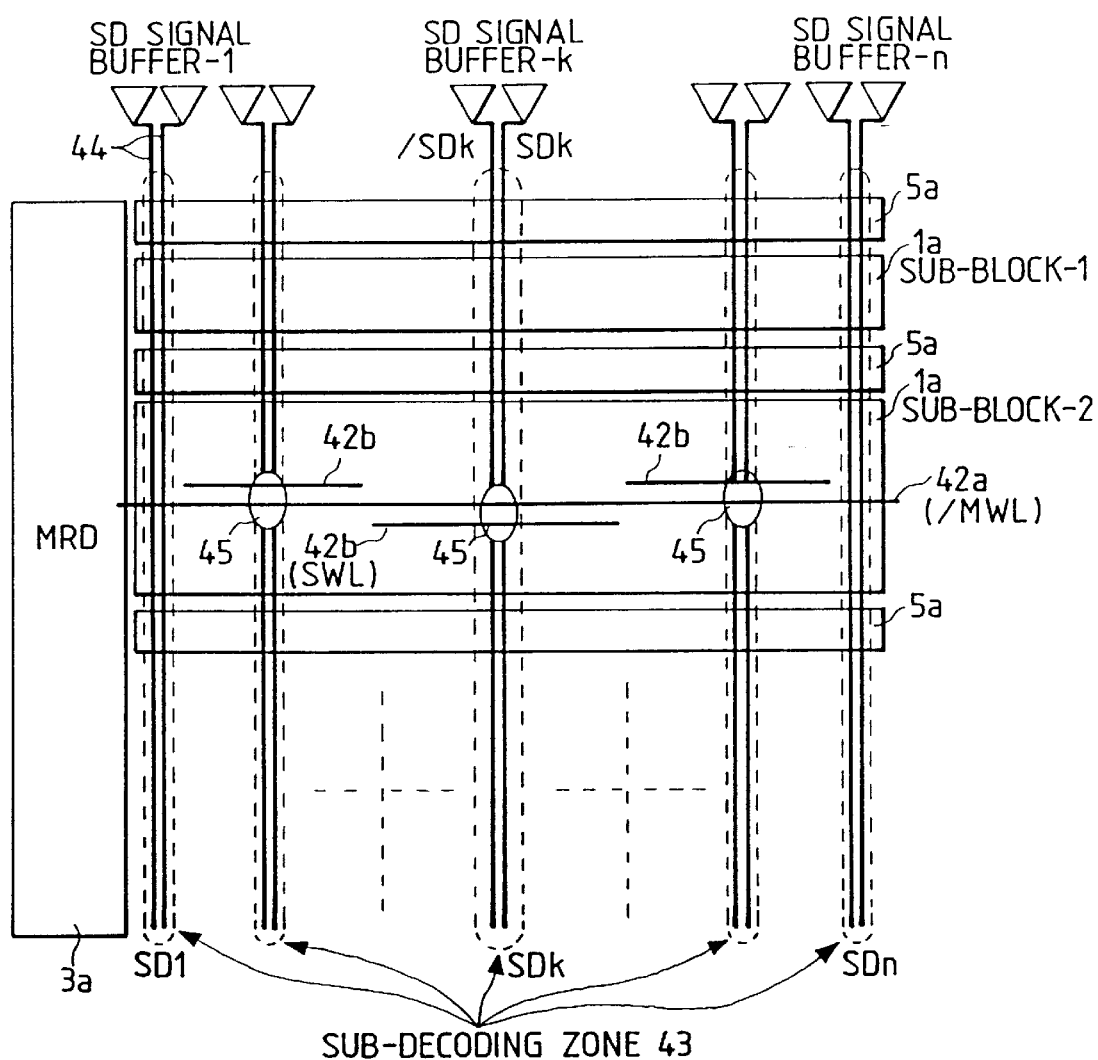

Next, an example of the word line division system is shown in FIG. 21A. In this drawing, the sub-word lines 42b are disposed in parallel with the main word line 42a, and a plurality of sub-word lines 42b are arranged in a row in the direction of the rows of the memory cells. Although in this drawing the sub-word lines 42b for two rows of memory cells are arranged with respect to one main word line 42a, since the sub-word lines 42a for 256 rows of memory cells are generally arranged for one memory cell sub-array 1a, 64 main word lines are arranged in a case where the sub-word lines 42b for four rows of memory cells are arranged with respect to one main word line 42a. Similarly, 128 main word lines are arranged in a case where the sub-word lines 42b for two rows of memory cells are arranged with respect to one main word line 42a as illustrated in the drawing.

Figure 21B:
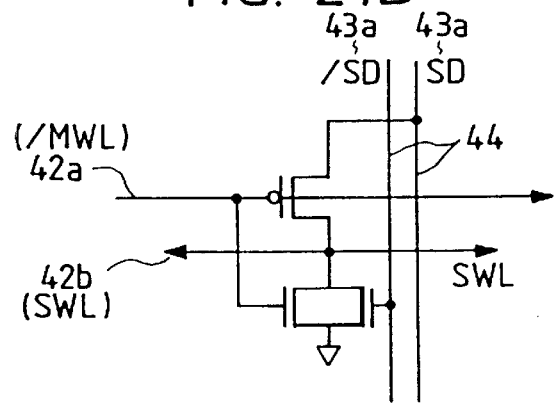

As other constituent elements, two sub-decoding lines 44 for respectively transmitting complementary signals for sub-decoding lines are arranged on the memory cell array at a predetermined interval therebetween in such a manner as to extend in the direction of the columns of the memory cells. The sub-decoding circuit 45 is formed at the position of intersection between the pair of sub-decoding lines 44 and one sub-word line 42b. If attention is focused on one pair of sub-decoding lines 44, the sub-decoding circuits 45 are formed continuously at predetermined intervals in the direction of the columns of the memory cell array. The portion where the sub-decoding circuit is formed is shown as the sub-decoding zone 43. A specific configuration of the sub-decoding circuit 45 is shown in FIG. 21B, and the structure provided is such that the sub-word line 42b is selectively enabled on the basis of the relationship between potential (potential at /MWL) of the opposite phase to that of the potential at which the main word line 42a is energized and the potential of the complementary signal (/SD, SD) of the sub-decoding signal.

In the memory cell array (memory cell sub-array 1a) of the semiconductor storage device of the above-described word line division system, it is difficult to form memory cells in the sub-decoding zone 43 for forming the sub-decoding circuit 45, thereby hindering the higher integration of the semiconductor storage device. However, if the region of this sub-decoding zone 43 is considered in the same way as the shunting region of the semiconductor storage device using the word line shunt system, it is possible to arrange in this region the power supply line (grounding line) and the signal line (column selection signal line) which extend in the direction of the columns of the memory cells for strengthening the power supplying capability.

Furthermore, the arrangement of the power supply lines and the grounding lines which extend in the direction of the columns of the memory cells can also be applied to the semiconductor storage device using this word line shunt system in the same way as in the above-described first to fifth embodiments. FIG. 22 shows a schematic wiring diagram of the semiconductor storage device using this word line shunt system. As shown in the drawing, lines including the signal line 27 and the power supply line (grounding line) 28 are arranged in the sub-decoding zone 43, and are connected at predetermined positions to the power supply line 19 or the grounding line 20 which extend in the direction of the rows of the memory cells and on which the lines are superposed, thereby making it possible to strengthen the power supplying capability with respect to the circuits connected to that power supply line.

Seventh Embodiment

Figure 23:
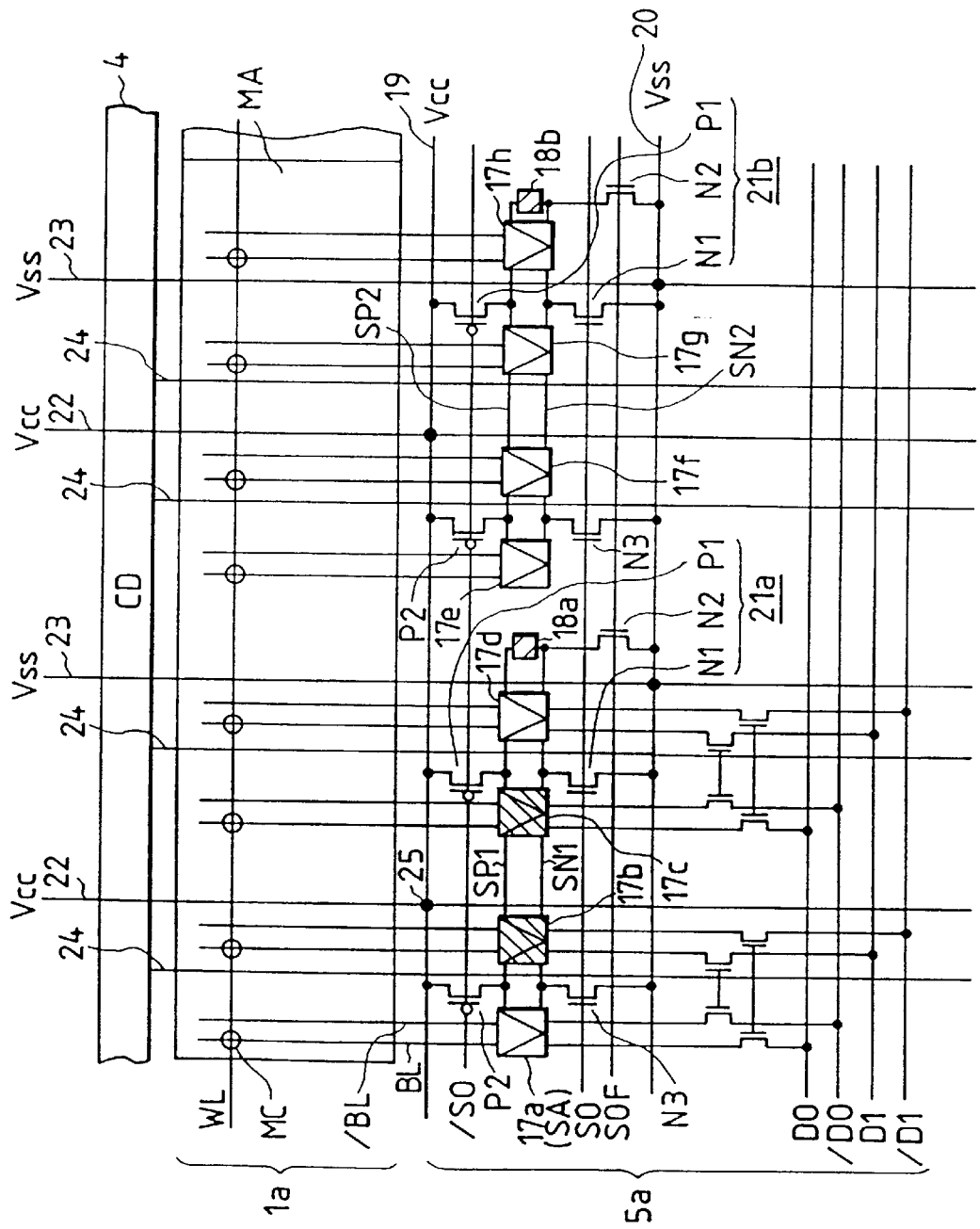
FIGS. 23–26 show semiconductor storage devices according to a seventh embodiment of the invention.

Next, referring to FIGS. 23 to 26, a description will be given of a seventh embodiment of the present invention. In FIG. 23, reference numerals 17b and 17c respectively denote sense amplifiers into which information is written simultaneously, and the same reference numerals as those already used denote identical or corresponding portions. In this drawing, the P-channel transistor P1 is formed for electrically connecting, on the one hand, the sense-amplifier signal drive line SP1 for electrically connecting the plurality of sense amplifiers and, on the other hand, the power supply line 19 disposed in the direction of the rows of the memory cells. As the P-channel transistor P1 is energized, power supply potential is supplied to two sense amplifiers 17c and 17d.

When information is written into memory cells, it is necessary to write data into the sense amplifiers. If it is assumed that data is simultaneously written into the sense amplifiers 17c and 17d, electric power approximately two times as large as when information is written into one sense amplifier becomes necessary. Therefore, there is a problem in that if the power supplying capability of the power supply lines 19 and 23 for supplying power to the P-channel transistor P1 connected commonly to these sense amplifiers is small, only potential smaller than the potential to be supplied would be supplied.

Accordingly, in this embodiment, an arrangement is provided in advance in the step of the circuit design such that as the switching elements which are constituent elements of sense-amplifier drive circuits 21a and 21b are energized, the plurality of sense amplifiers to which power supply potential is commonly supplied (e.g., in the case of FIG. 23, those denoted by numerals 17a and 17b; 17c and 17d; 17e and 17f; and 17g and 17h) are not activated simultaneously relative to each other. As the arrangement of the power supply lines is determined by thus taking into consideration whether or not the sense amplifiers are to be activated simultaneously, it is possible to control the power supply potential supplied to these sense amplifiers from being locally deprived of the power supplying capability. That is, as portions which consume power are dispersed in wide areas in the memory cell array, it becomes possible to control the fluctuations of potential at the power supply lines (grounding lines) for supplying power necessary for rewriting.

For instance, of the sense amplifiers 17a to 17h, the two sense amplifiers 17b and 17c are written into at the same timing, and the supply of power to these two sense amplifiers is effected by mutually different switching elements (constituent elements of the sense-amplifier drive circuits). This makes it possible to control the fluctuations of potential at the power supply lines (grounding lines) as compared with the case where the plurality of sense amplifiers connected to one switching element are activated simultaneously.

Figure 24:
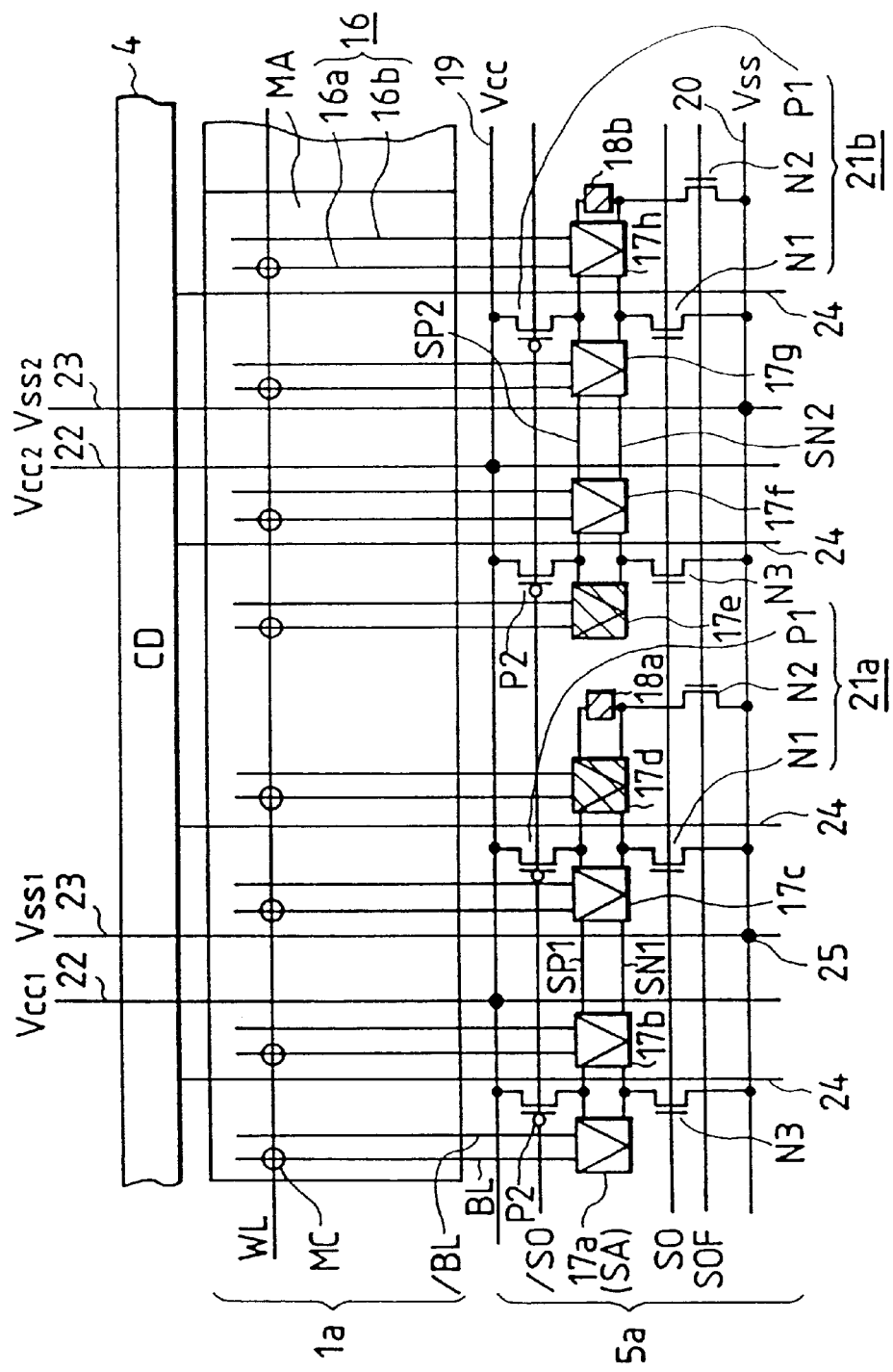

Next, referring to FIG. 24, a description will be given of another example of the case in which a plurality of sense amplifiers which are written into simultaneously are present. In FIG. 24, the same reference numerals as those already used denote identical or corresponding portions. The example of FIG. 23 is characterized in that information is not written simultaneously into the sense amplifiers to which power supply potential is supplied by the same switching elements (i.e., the constituent elements of the sense-amplifier drive circuits to electrically connect the power supply line (or the grounding line) and the sense amplifiers). However, the example of FIG. 24 is characterized in that, for instance, in circuit designing a plurality of sense amplifiers 17a to 17d connected by the identical sense-amplifier driver signal lines SP1 and SN1 are not subjected to writing simultaneously.

As the sense amplifiers which are written into simultaneously among the plurality of sense amplifiers connected to the respective series of sense-amplifier drive signal lines SP1 and SN1 are thus arranged by being dispersed in the memory cell array, it is possible to control power consumption from becoming large in particular portions and the potential at the power supply lines (grounding lines) from fluctuating.

If, in FIGS. 23 and 24, the power supply lines 22 and the grounding lines 23 extending in the direction of the columns of the memory cells are arranged as shown in the above-described first to sixth embodiments, and if the power supply lines 22 and the grounding lines 23 are arranged alternately as shown in FIG. 23 as one example and the through holes are formed at predetermined positions where these lines are superposed on the power supply lines 19 and the grounding lines 20 extending in the direction of the rows, it is possible to strengthen the power supplying capability of the semiconductor storage device.

In addition, in this case, at least one power supply line and one grounding line 23 extending in the direction of the columns of the memory cells may be arranged on one sense-amplifier drive signal line SP1 or SN1, and may be connected thereto at predetermined positions via the through holes, so as to supply both the power supply potential (Vcc) and the ground potential (Vss) at equal levels with respect to the sense-amplifier forming region 5a over the entire region of the memory cell array.

Figure 25:
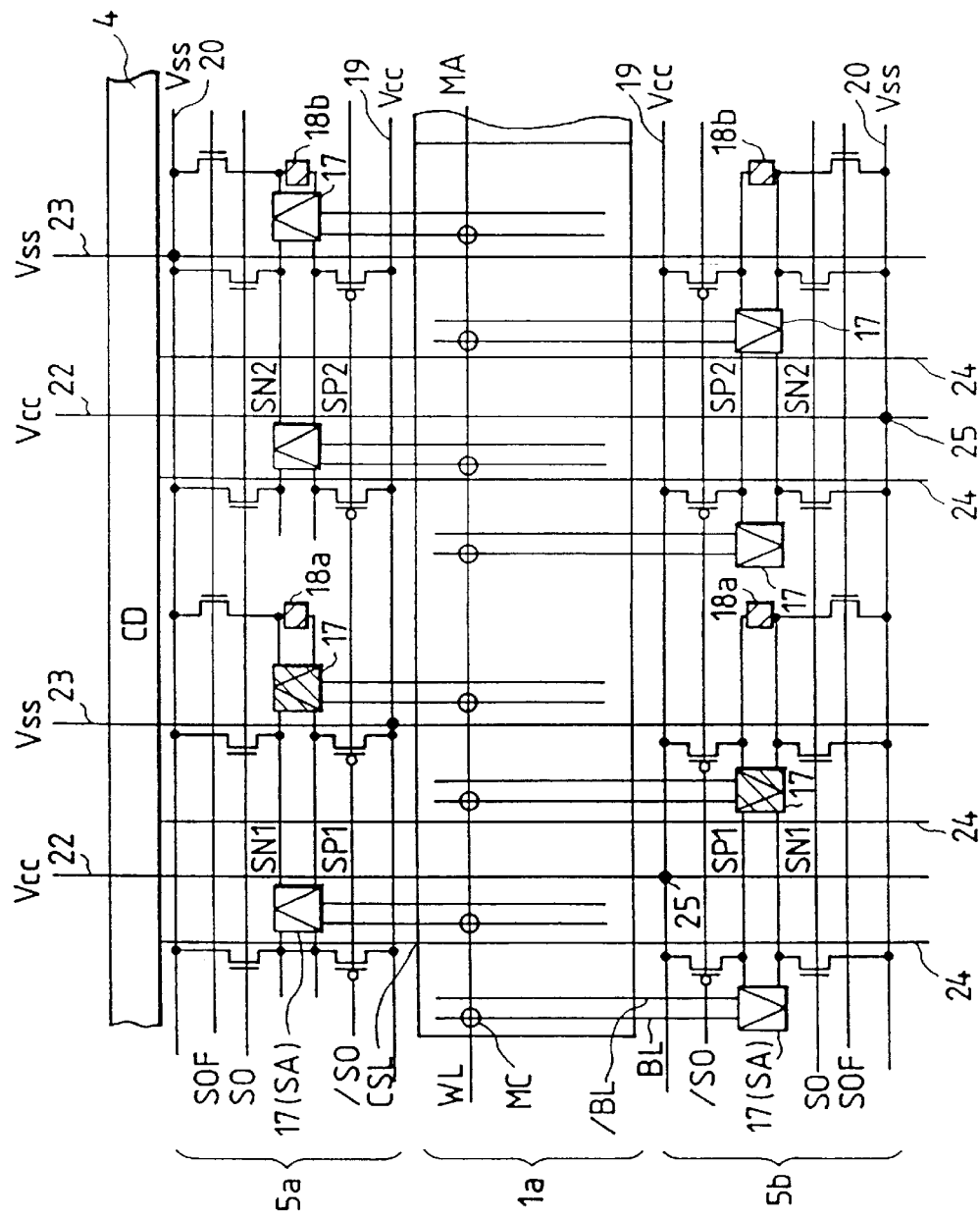

Furthermore, it is possible to cite a semiconductor storage device such as the one shown in FIG. 25 as an example which takes into consideration the strengthening of the power supplying capability with respect to the sense amplifiers which are written into simultaneously. This semiconductor storage device has the same arrangement of the sense amplifiers as that of the semiconductor storage device shown in FIG. 9, and this example shows the case in which the sense-amplifier forming regions 5a and 5b are respectively formed on both sides of one memory cell sub-array 1a. In this case as well, the plurality of sense amplifiers connected to one sense-amplifier drive signal line SP1, SN1 are not written into simultaneously. The semiconductor storage device also such a layout also exhibits advantages similar to those of the semiconductor storage devices shown in FIGS. 23 and 24.

Figure 26:
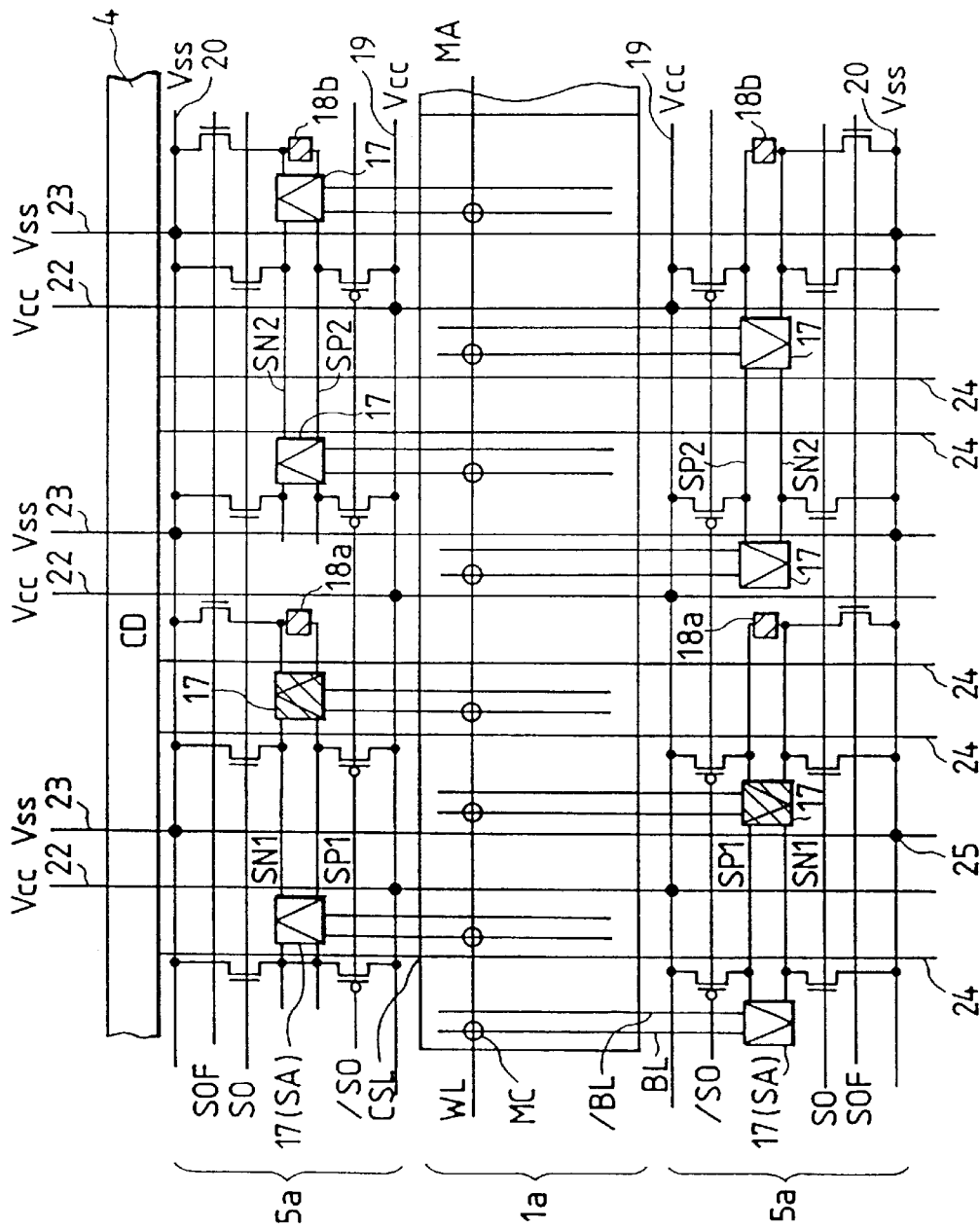

In addition, in the example shown in FIG. 26, two column selection lines 24 and two power supply lines (including the grounding lines) extending in the direction of the columns of the memory cells are arranged alternately in units of two similar lines, so that one signal line (column selection signal line) is disposed on one side of another column selection signal line 24, thereby reducing the probability of a short-circuiting between the column selection signal line 24 and the power supply line (including the grounding line). Consequently, in addition to the advantages shown in FIGS. 23 to 25, it is possible to obtain the advantage of making it possible to reduce a decline in the power supplying capability with respect to the power supply lines or the grounding lines.

Eighth Embodiment

Figure 27:
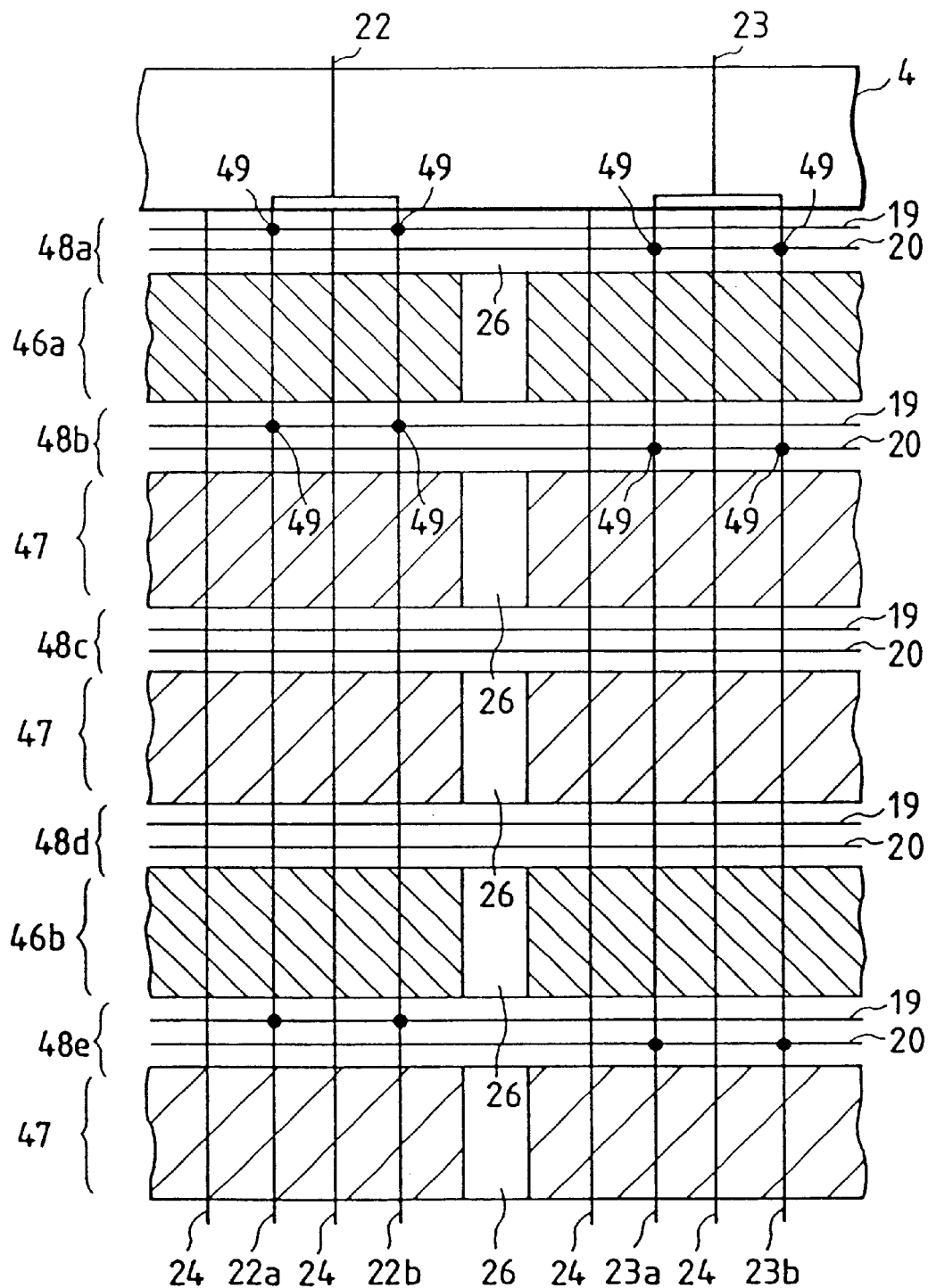
FIGS. 27–30 show semiconductor storage devices according to an eighth embodiment of the invention.

Next, referring to FIGS. 27 to 30, a description will be given of an eighth embodiment of the present invention. FIGS. 27 to 30 show portions of the memory cell array of the semiconductor storage device. In FIG. 27, reference numerals 46a and 46b respectively denote memory cell sub-arrays (simultaneously activated memory cell sub-arrays) which are activated at the same timing, and numeral 47 denotes a memory cell sub-array which is non-activated when the aforementioned memory cell sub-arrays 46a and 46b are activated. In addition, the same reference numerals as those already used in the foregoing description denote identical or corresponding portions.

Normally, when a writing or reading operation is carried out with respect to a predetermined memory cell, the other memory cells connected to the word line to which the targeted memory cell is connected are also activated simultaneously. In the case of the semiconductor storage device using the word line division system, an assembly of the memory cells thus activated is located in the region where the predetermined sub-word lines are disposed. In the case of the semiconductor storage device not using the word line division system, the assembly of such memory cells is an assembly of unit memory cells of predetermined memory cell sub-arrays. In this example, one simultaneously activation memory cell sub-array and two non-activated memory cell sub-arrays are repeatedly arranged. In addition, the sense-amplifier forming regions 48a to 48e are respectively disposed between the column decoder 4 and the memory cell sub-array and between two adjacent ones of the memory cell sub-arrays.

Further, in the same way as in the above-described embodiments the power supply lines 22 (22a, 22b) and the grounding lines 23 (23a, 23b) extending in the direction of the columns of the memory cells are arranged on the memory cell array. With respect to those power supply lines 22 and grounding lines 23 that are respectively at the same potential as the power supply lines 19 and the grounding lines 20 extending in the direction of the rows of the memory cells, through holes 49 are formed at superposed positions in the sense-amplifier forming regions. The power supply lines extending in the directions of the rows and columns are connected together, and the power supplying capability for sense-amplifier forming regions 48a to 48c and the memory cell sub-arrays is strengthened.

In the semiconductor storage device having the above-described arrangement, the characteristic feature of this embodiment lies in the positions of formation of the through holes 49 for connecting the power supply lines 19 extending in the direction of the rows and the power supply lines 22a and 22b extending in the direction of the columns as well as the positions of formation of the through holes 49 for connecting the grounding lines 20 extending in the direction of the rows and the grounding lines 23a and 23b extending in the direction of the columns.

In the step of the circuit design of ordinary semiconductor storage devices, it is possible to ascertain memory cells having at least a high frequency of being activated simultaneously. On the basis of this fact, a case is considered in which an assembly of memory cells, including those having a high frequency of being activated simultaneously, are the memory cell sub-arrays 46a and 46b shown in FIG. 27. The through holes 49 are formed in the nearest vicinities of the memory cell sub-arrays in such a manner as to connect, on the one hand, the power supply lines 19 and the grounding lines 20 arranged on the sense-amplifier forming regions 48a, 48b, and 48d, 48e formed adjacent to these memory cell sub-arrays 46a and 46b, respectively, and, on the other hand, the power supply lines (including the grounding lines) extending in the direction of the columns. Since much power is required if the plurality of memory cell sub-arrays are activated simultaneously, the through holes are thus formed in the nearest vicinities of the memory cell sub-arrays which are activated simultaneously to supply power from the power supplies, thereby strengthening the power supplying capability.

Figure 28:
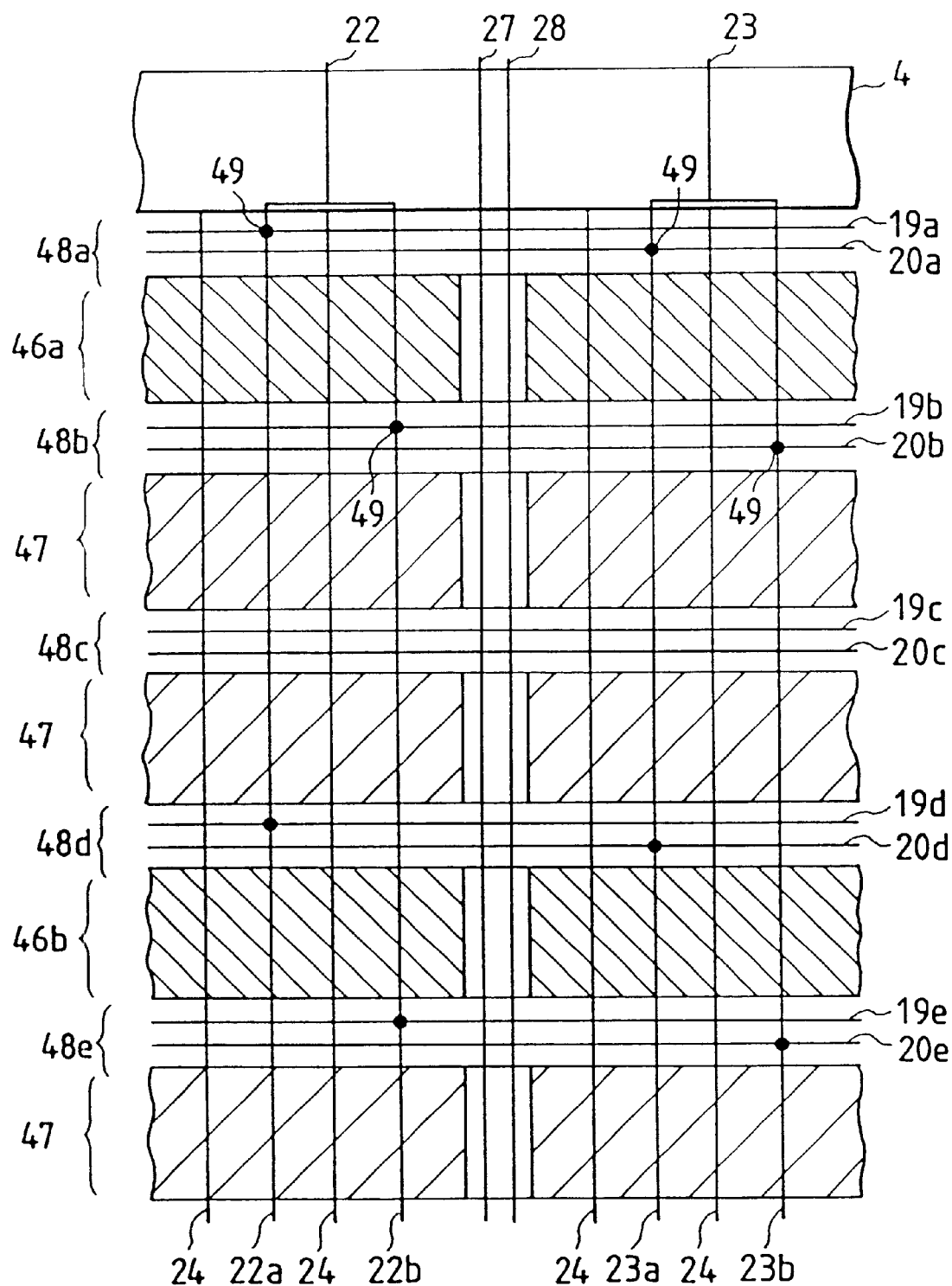

Furthermore, although, in FIG. 27, the same number of through holes 49 are also formed in the power supply line 22b just as the through holes 49 are formed in the power supply line 22a, it is possible to provide an arrangement as shown in FIG. 28 in which the power supply line 22a (extending in the direction of the columns) is connected to the power supply line 19a extending in the direction of the rows, while the power supply line 22b is connected to the power supply line 19b. Thus, by reducing the number of connections provided, it is possible to strengthen the power supplying capability in the same way as the semiconductor storage device shown in FIG. 27.

Figure 29:
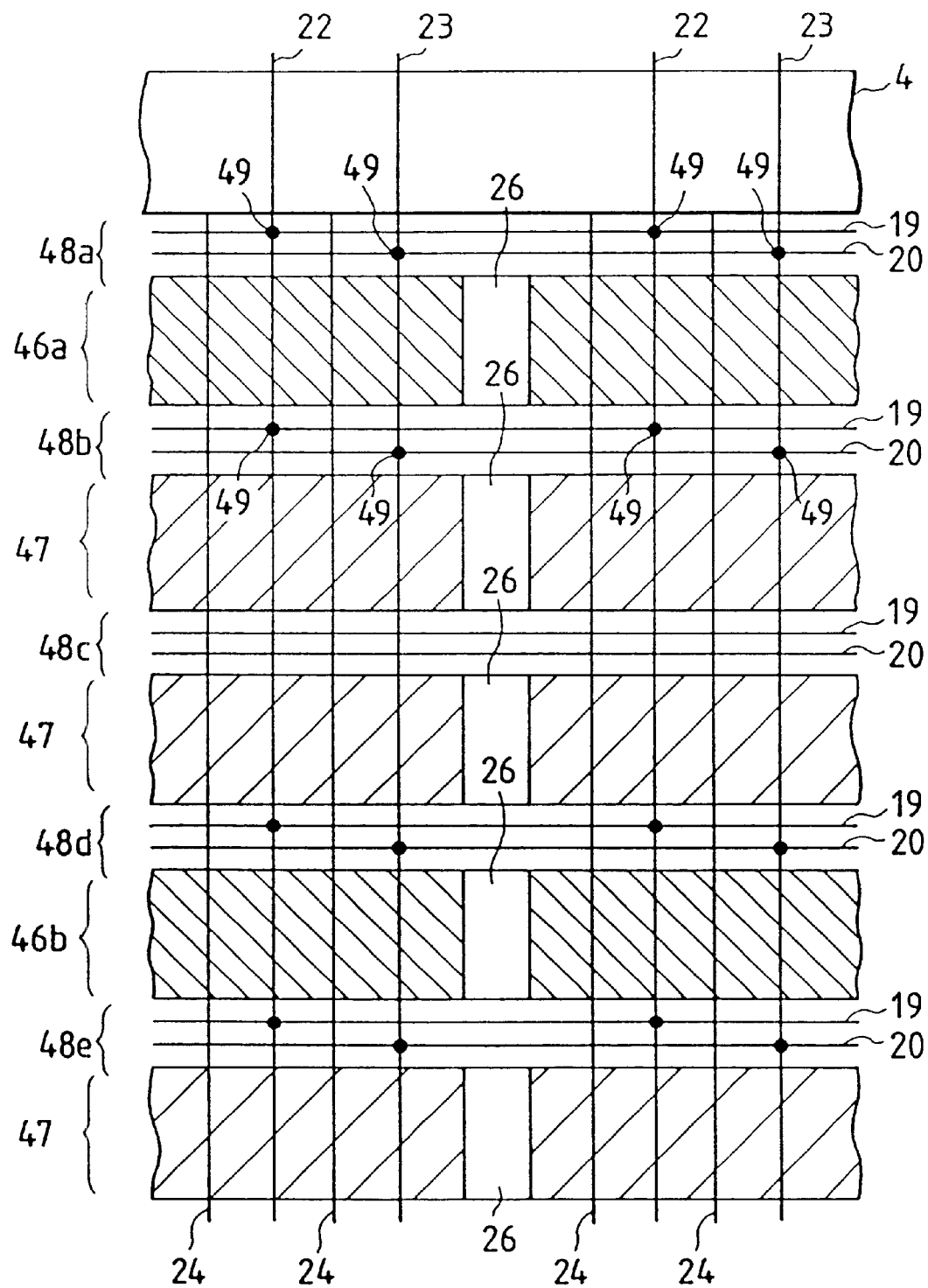
Figure 30:
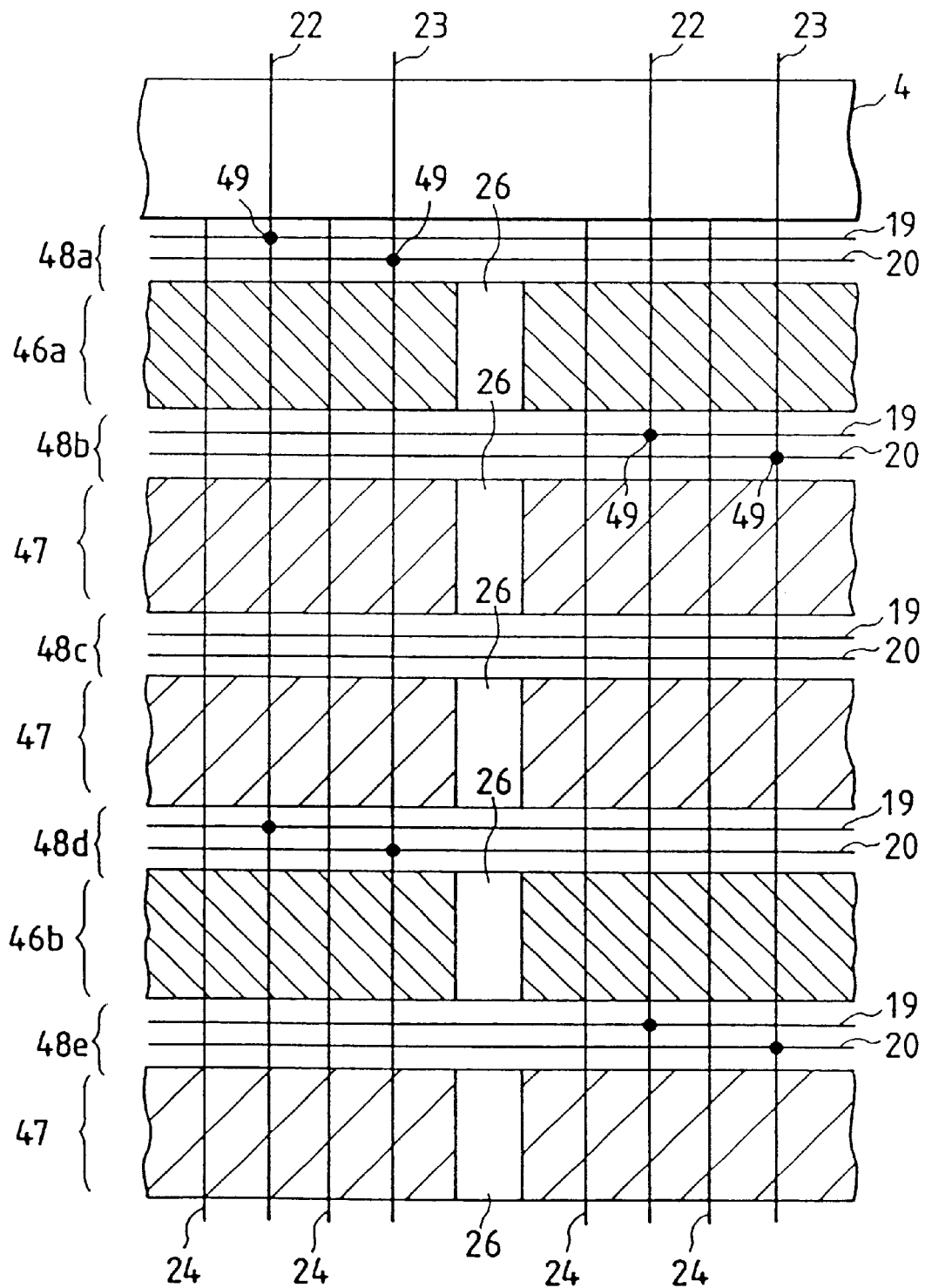

In addition, in the case where the power supply lines 22 and the grounding lines 23 disposed in the direction of the columns of the memory cells are arranged alternately as shown in FIGS. 29 and 30, the power supplying capability can be similarly strengthened if the through holes 49 connecting the power supplying lines (grounding lines) are formed in the vicinities of the memory cell sub-arrays 46a and 46b which are activated simultaneously. As for the arrangement of the column selection signal lines 24, the power supplying capability is similar even if one column selection signal 24 is disposed between adjacent ones of the power supply lines (grounding lines) or a plurality of column selection signals 24 are disposed therebetween. Furthermore, even if other signal lines and power supply lines are disposed on the word-line shunting regions (regions which are the sub-decoding zones in the word line division system) 25, the semiconductor storage device can be provided with utterly the same power supplying capability.

Ninth Embodiment

Next, referring to FIGS. 31 to 34, a description will be given of the arrangement of the power supply lines 22, the grounding lines 23, and the column selection signal lines 24 which extend in the direction of the columns of the memory cells, as well as power supply lines 50a and grounding lines 50b arranged on the column decoder 4 in the direction of the rows and the power supply lines 19 and the grounding lines 20 arranged on the sense-amplifier forming regions 5a in the direction of the rows.

Conventionally, of the aforementioned wirings, the power supply lines 19 and the grounding lines 20 extending in the direction of the rows of the memory cells are formed of aluminum wiring of a first layer (the layer which is formed first is designated as the first layer and the layer which is formed next as the second layer), while the power supply lines 50a and grounding lines 50b arranged on the column decoder 4, as well as the column selection signal lines 24, the power supply lines 22, and the grounding lines which extend in the direction of the columns are formed of aluminum wiring of a second layer.

For this reason, to prevent a short-circuiting between the power supply lines 50a and 50b formed within the column decoder 4 and the power supply lines 22 and 23 extending in the direction of the columns, the power supply lines 22 and 23 in the column decoder 4 are conventionally changed over to the aluminum wiring of the first layer. However, since the power supply lines 22 and 23 in the column decoder 4 are formed of the aluminum wiring of the first layer, there have arisen a problem in that the aluminum wiring of the first layer necessary for the formation of the column decoder 4 cannot be formed, or that because of the aluminum wiring formed as the power supply lines 22 and 23, leeway in the formation of other wiring layers becomes small, and the structures of the elements become complex.

Accordingly, in this ninth embodiment, the power supply lines 19 and 20 arranged on the sense-amplifier forming regions 5a in the direction of the rows are formed of the aluminum wiring of the first layer in the same way as the prior art, while the power supply lines 50a and 50b arranged on the column decoder 4 are formed of the aluminum wiring of the first layer with column-decoder constituting circuits 51 placed therebetween, and the power supply lines 22 and 23 and the column selection signal lines 24 extending in the direction of the columns are formed of the aluminum wiring of the second layer. Thus, as the power supply lines 19, 20, 50a, and 50b extending in the direction of the rows are formed of the aluminum wiring of the first layer, and the power supply lines 22 and 23 and the signal lines 24 extending in the direction of the columns are formed of the aluminum wiring of the second layer, it is readily possible to form the power supply lines 22 and 23 in the direction of the columns.

Figure 31:
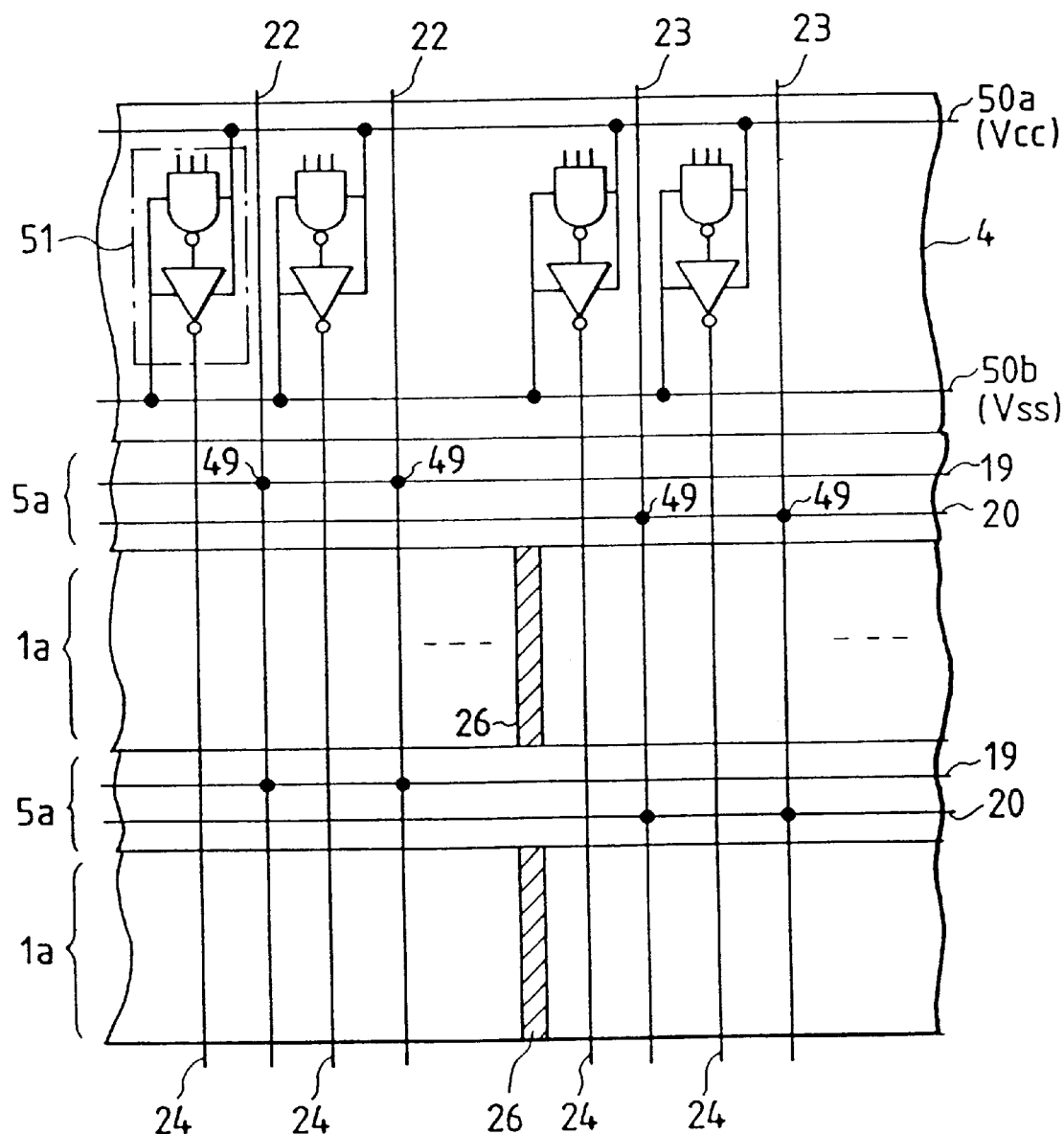
FIGS. 31–34 show semiconductor storage devices according to a ninth embodiment of the invention.
Figure 32:
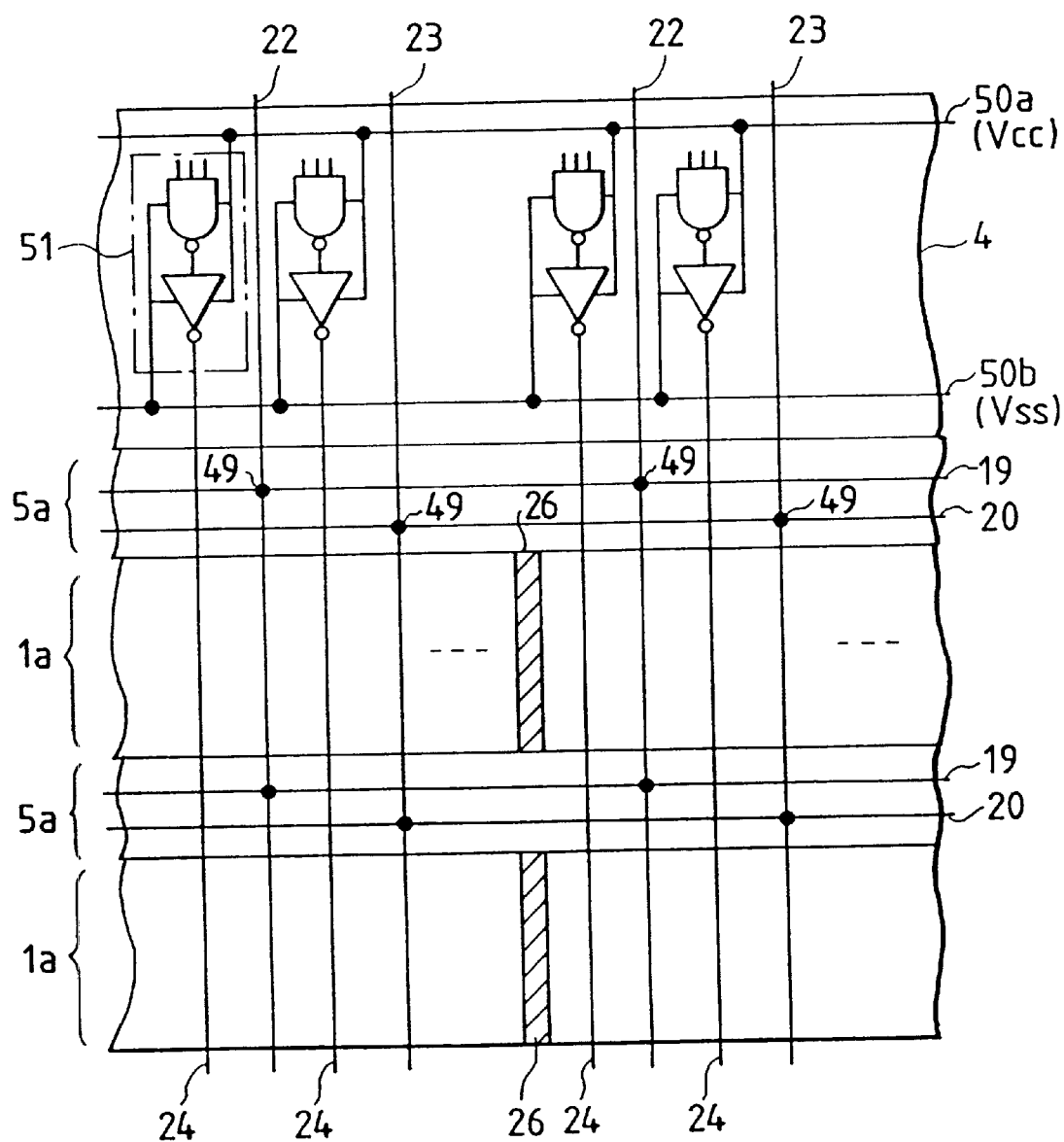

Further, as shown in FIG. 31, as the power supply lines 22 and the grounding lines 23 extending in the direction of the columns of the memory cells are arranged alternately in units of a plurality of similar lines, it is possible to improve the power supplying capacities for the memory cell array. Alternatively, as shown in FIG. 32, if the power supply lines extending in the direction of the columns are arranged alternately in units of single lines, it is possible to obtain similar power supplying capability.

Figure 33:
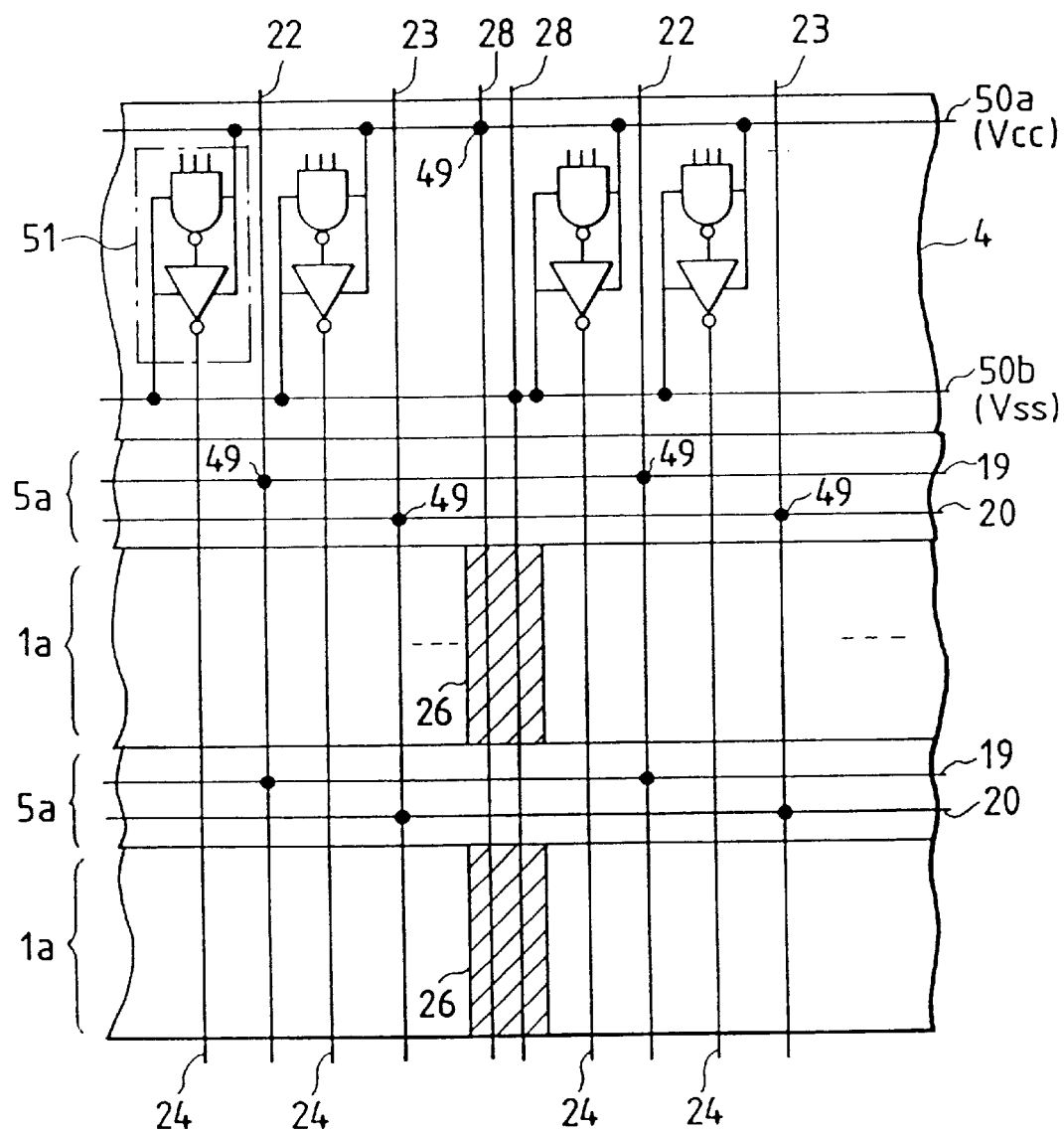
Figure 34:
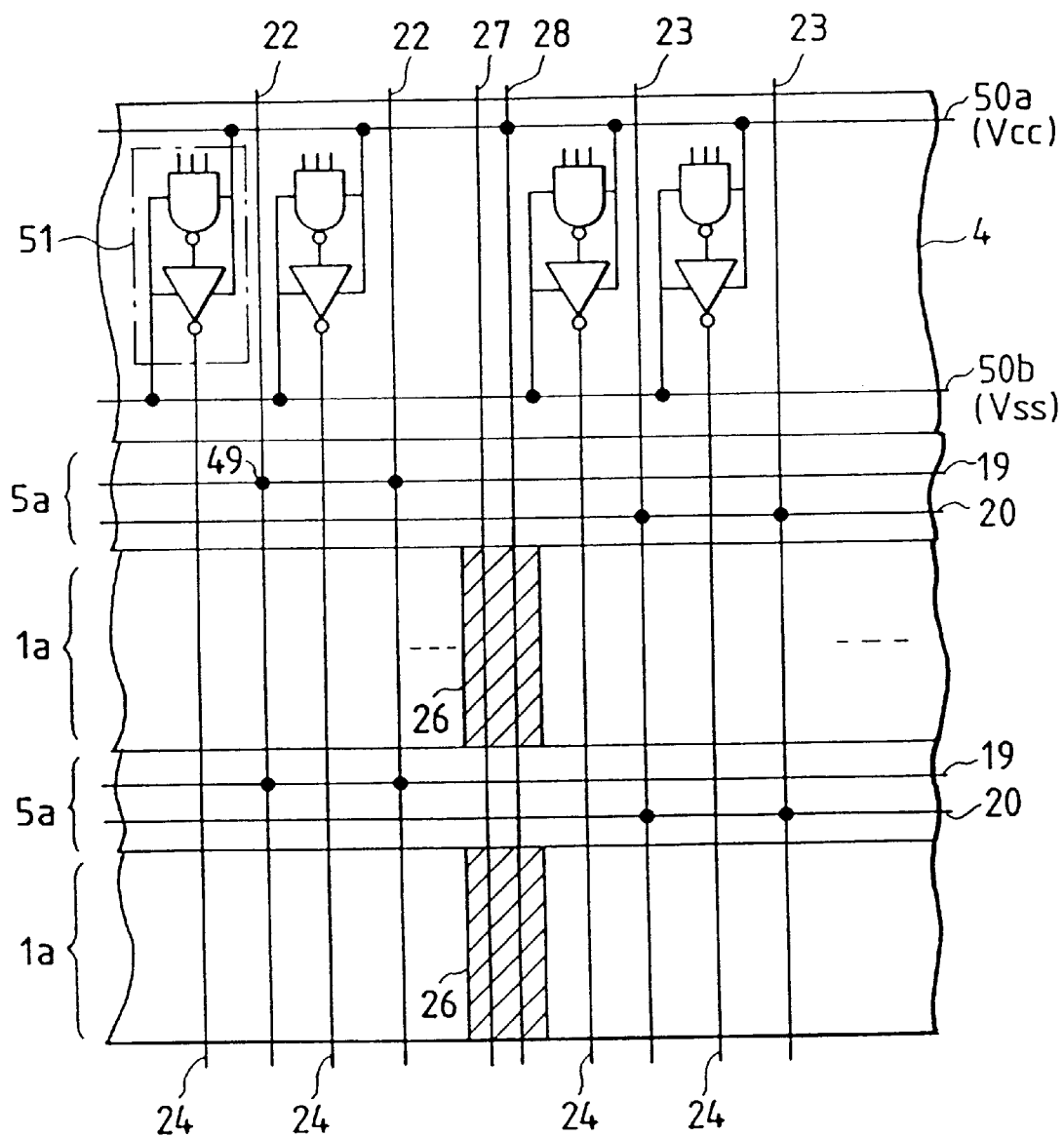

Furthermore, as shown in FIG. 33, other power supply lines 28 may be arranged in the word-line shunting regions 26 (sub-decoding zones in the case of the semiconductor storage device of the word line division system) formed within the memory cell sub-arrays 1a, and these lines are connected to the power supply lines 50a and 50b at the respective superposed positions in the column decoder 4 via the through holes. This makes it possible to enhance the power supplying capability for the column decoder. In addition, if these power supply lines 28 are connected to the power supply lines in the memory cell array, it is possible to enhance the power supplying capability for the sense-amplifier forming regions or the memory cells. Also, as shown in FIG. 34, another signal line 27 may be formed on the word-line shunting regions 26 in the same way as the power supply line 28 so as to improve the performance of the semiconductor storage device.

10th Embodiment

Figure 35:
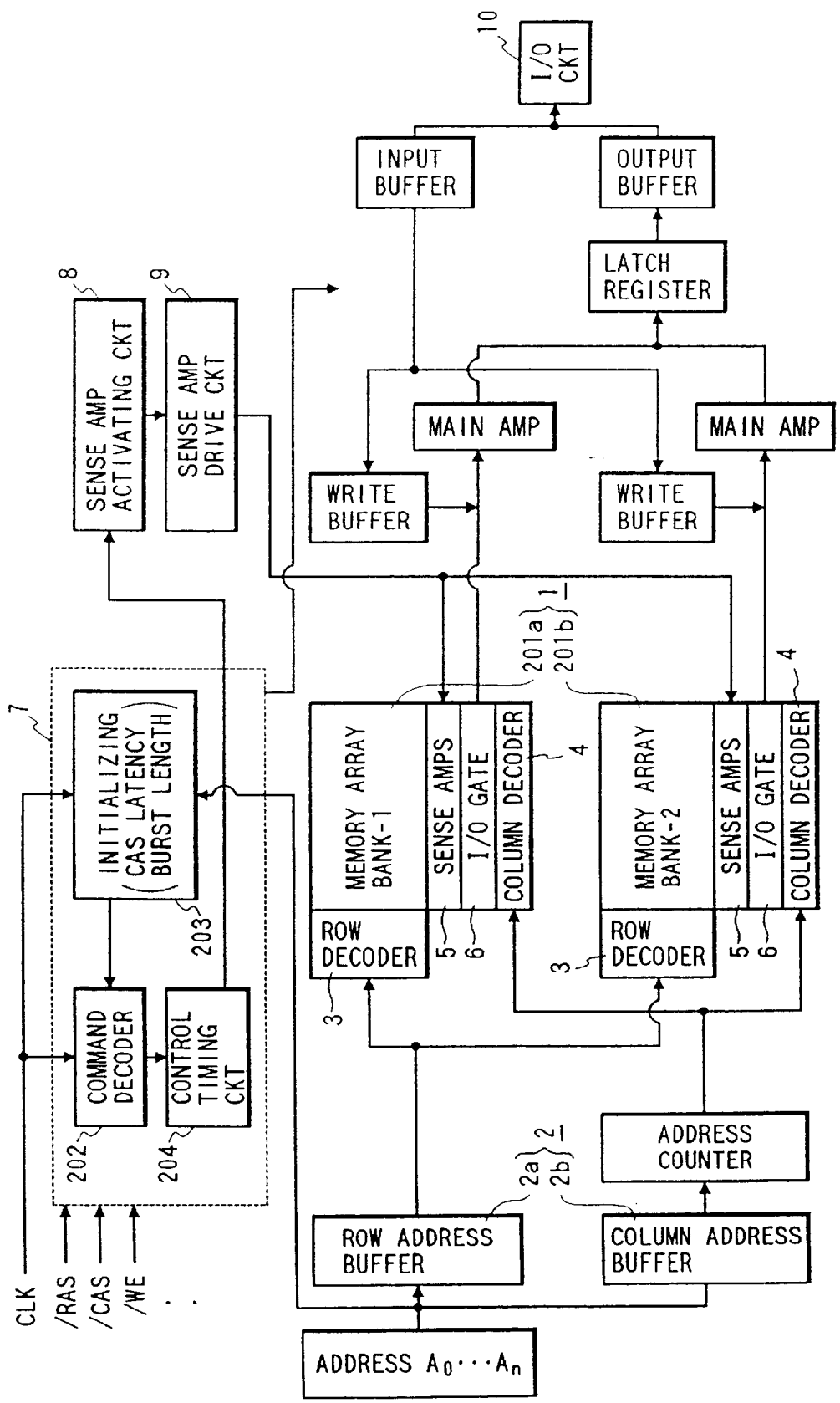

FIG. 35 illustrates a schematic diagram of a synchronous DRAM. As shown in this drawing, the memory cell array includes a first bank 201a and a second bank 201b. These first and second banks 201a and 201b respectively have the characteristics of independently accessing data of the memory cells at independent addresses, receives a control clock signal /CS, a row address strobe signal (hereafter abbreviated as the /RAS signal), a column address strobe signal (/CAS signal), and a write enable signal (/WE signal) which are imparted thereto from an external circuit, and selects one of the banks in response to a bank selection signal (BS signal).

This synchronous DRAM is further comprised of the control circuit 7 including a command decoder 202, an initializing circuit 203, and a control timing circuit 204 and adapted to generate internal control signals; the sense-amplifier activating circuit 8 for generating signals for activating the sense amplifiers in the sense-amplifier forming region 5 corresponding to the internal control signal from the control circuit 7; and the sense-amplifier drive circuit 9 for driving the sense amplifiers included in the sense-amplifier forming region 5 in response to the sense-amplifier activation signals from the sense-amplifier activating circuit 8. In addition, reference numerals 2a and 2b respectively denote the row address buffer and the column address buffer. The other reference numerals which are the same as those already used in the foregoing description denote identical or corresponding portions.

In the synchronous DRAM having such a configuration, the internal structure and the operation of the first bank 201a are similar to those of the DRAM already described with reference to FIG. 9, and the second bank 201b also has a similar internal structure, and operates in a similar manner.

Figure 36:
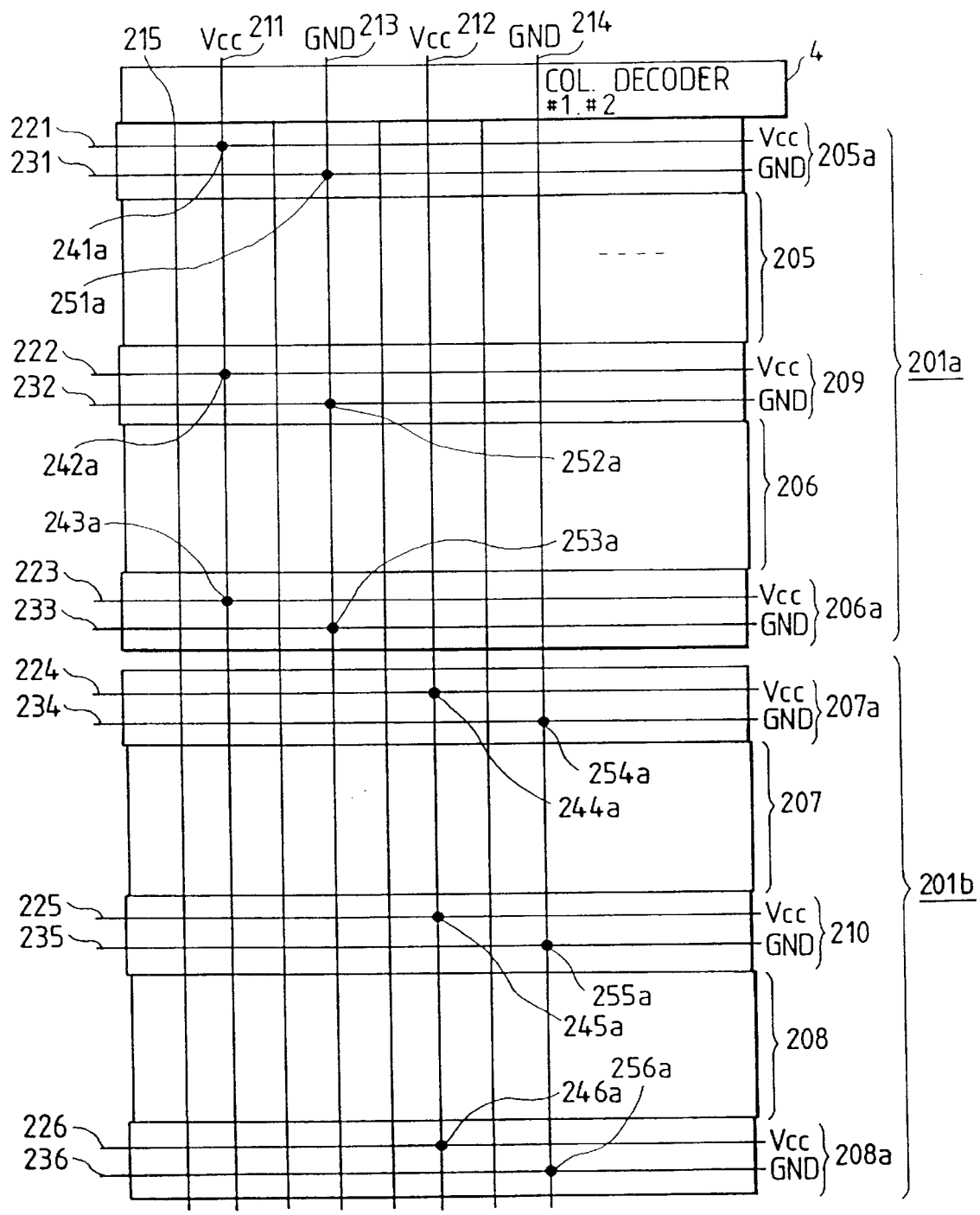

FIG. 36 shows the first bank 201a and the second bank 201b constituting the memory cell array and the layout of the wirings formed on the first bank 201a and the second bank 201b. In the drawing, reference numerals 205 to 208 denote memory cell sub-arrays which are assemblies of a plurality of memory cells arranged in the directions of the rows and columns; 205a to 208a denote sense amplifiers used exclusively for their adjacent memory cell sub-arrays; and 209 and 210 denote sense amplifiers used jointly by two adjacent memory cell sub-arrays. The first bank 201a includes the memory cell sub-arrays 205 and 206 and the sense-amplifier forming regions 205a, 206a, and 209. Similarly, the second bank 201b includes the memory cell sub-arrays 207 and 208 and the sense-amplifier forming regions 207a, 208a, and 210.

In addition, power supply lines 211 and 212 are arranged regularly at equal intervals on the banks in the direction of one side of the memory cell array and perpendicularly to the column decoder 4. Grounding lines 213 and 214 are arranged in parallel with the power supply lines 211 and 212 at positions equidistanced from the power supply lines.

Further, a column selection signal line 215 is disposed between two sets of wiring each comprising the power supply lines 211 and 212 and the grounding lines 213 and 214. In addition, a power supply line 221 and a grounding line 231 extend in the direction of the rows of the memory cell array, and power supply lines 222 to 226 and grounding lines 232 to 236 are also arranged on the other sense-amplifier forming regions 209, 206a, 207a, 210, and 208a, respectively.

The power supply line 211 extending in the direction of the columns of the memory cell array and the power supply line 221 extending in the direction of the rows are respectively formed at heightwise different positions from the main surface of the semiconductor substrate, and are connected together at their intersecting position via a through hole 241a. Similarly, the grounding line 213 and the grounding line 231 are connected together at their intersecting position via a through hole 251a. In addition, numerals 242a to 246a and 252a to 256b denote through holes for electrically connecting the two power supply lines or grounding lines extending in the directions of the rows and columns.

As the power supply lines and the grounding lines are thus arranged at predetermined intervals so as to extend in the direction of the columns of the memory cell array of the synchronous DRAM, and are respectively electrically connected via the through holes to the power supply lines or the grounding lines arranged in the sense-amplifier forming regions so as to extend in the direction of the rows, it is possible to stabilize the power supply potential and strengthen the power supply. In addition, since adjacent power supply lines 211 and 212 or grounding lines 213 and 214 extending in the direction of the columns are respectively connected to the power supply lines or the grounding lines in the different banks via the through holes, even in the case of the simultaneous operation of the first bank 201a and the second bank 201b and the second bank 201b, there is no problem in which a decline in the potential in one bank causes a decline in the potential at the other bank due to that effect. Hence, it becomes possible to strengthen the power supply effectively.

In the semiconductor storage device capable of simultaneously operating a plurality of banks as in the case of the synchronous DRAM shown here, data for each bank are inputted and outputted via the column decoder and the data input/output lines. For this reason, the column decoder 4 may be formed in a central portion of the plurality of banks, thereby making it possible to uniformize the electric characteristics within the chip.

In addition, as shown in FIG. 37, reference numerals 261 to 264 denote bonding pads to which the power supply lines and grounding lines 211 to 214 are respectively connected. Numerals 271 to 274 denote through holes whereby the power supply lines and the grounding lines 211 to 214 are respectively electrically connected to the power supply lines and the grounding lines (not shown) perpendicularly intersecting these power supply lines and grounding lines. The other reference numerals which are the same as those already used in the foregoing description denote identical or corresponding portions.

As shown in FIG. 37, the power supply lines and grounding lines 211 to 214 extending in the direction of columns of the memory cell so as to bridge a plurality of banks are connected to the bonding pads 261 to 264 in one-to-one correspondence. Therefore, sufficient power can be supplied to the power supply lines and grounding lines 211 to 214 extending in the direction columns, so that interference between the power lines and grounding lines can be suppressed. Thus, the power supplying can be made effective.

Further, as shown in FIG. 38, a supply voltage drop circuit 281 is formed between the bonding pad 261 and the power supply line 211 arranged in such a manner as to extend in the direction of the columns of the memory cells. Similarly, a supply voltage drop circuit 282 is formed between the bonding pad 262 and the power supply line 212. In the semiconductor storage device thus formed, since the supply voltage drop circuits 281 and 282 are formed independently for the power supply lines 211 and 212 formed in the direction of the columns of the memory cells, electric interference of the power supply lines can be suppressed. In addition, it is conceivable to connect the power supply lines 211 and 212 to one bonding pad 261 via the supply voltage drop circuits 281 and 282, as shown in FIG. 39. As the power is supplied by connecting a plurality of power supply lines to a bonding pad, it is possible to reduce the number of bonding pads, which makes it possible to make the semiconductor storage device compact or add functions in vacant spaces.

In an actual semiconductor storage device, as for the arrangement of the power supply lines, the grounding lines, and the column selection signal lines formed in such a manner as to extend in the direction of the columns of the memory cells, supply potential and ground potential can also be sufficiently supplied even if such lines are arranged alternately in units of two similar lines as described in the first to ninth embodiments. Further, the supply potential and the ground potential can similarly be sufficiently supplied if a structure is provided such that another wiring is not disposed in parallel between two adjacent column selection signal lines.

11th Embodiment

Figure 40:
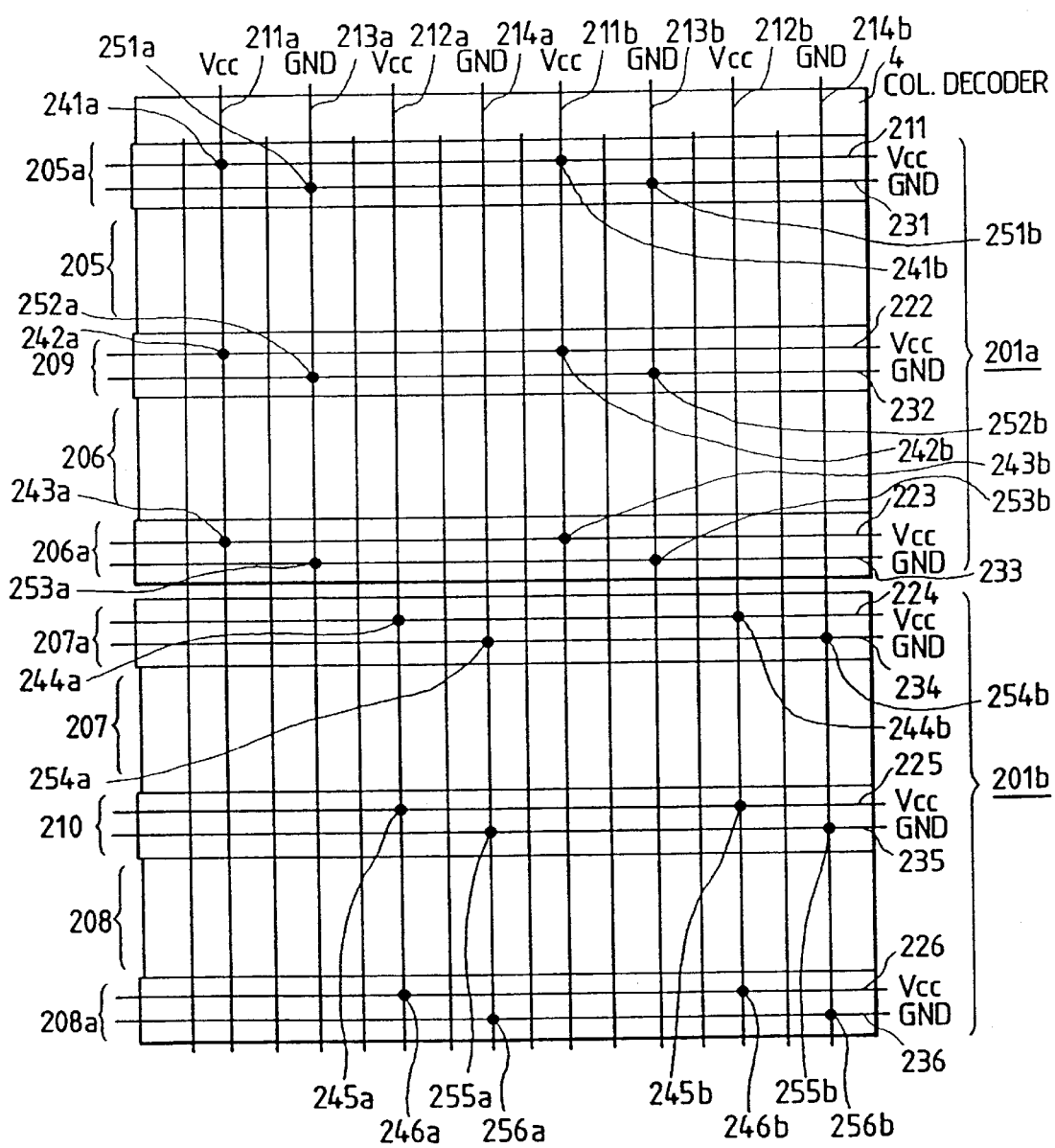
FIG. 40 shows a semiconductor storage device according to an eleventh embodiment of the invention.

Next, a description will be given of a further embodiment which is applicable to a semiconductor storage device capable of simultaneously selecting different addresses such as a synchronous DRAM. In FIG. 40, reference numerals 211a, 212a, 211b, and 212b denote power supply lines formed in such a manner as to extend in the direction of the columns of the memory cells, and numerals 213a, 214a, 213b, and 214b denote grounding lines formed in such a manner as to extend similarly in the direction of the columns. These power supply lines and grounding lines are arranged alternately with one kind of line alternating with another. In addition, reference numerals 241b to 246b and 251b to 256b respectively show through holes used for electrically connecting, on the one hand, the power supply lines and the grounding lines arranged in the sense-amplifier forming regions 205a, 209, 206a, 207a, 210, and 208a and, on the other hand, the aforementioned power supply lines and the grounding lines formed at positions of perpendicular intersection with these wirings.

As shown in FIG. 40, the power supply line 211a and the power supply line 212a formed adjacent to the power supply line 211a are connected to the first bank 201a and the second bank 201b via the through holes 241a and 244a, respectively, to strengthen the power supply. The arrangement pattern of the power supply lines 211a and 212a and the grounding lines 213a and 214a is repeatedly formed in the direction of the columns, thereby forming the lines 211b, 212b, 213b, and 214b. The power supply lines and grounding lines thus formed in the direction of the columns are so arranged that adjacent ones of the power supply lines or the grounding lines are not connected to the same bank. In case where, for example, two banks are formed as shown in FIG. 40, the lines are connected to the first bank 201a and the second bank 201b alternately so as to supply the power uniformly. Since the wiring provided is such that the power supply line 211a is connected only to the first bank 201a, and the power supply line 212a is connected only to the second bank 201b, it is possible to supply the power sufficiently even if the two banks operate simultaneously. Thus, it is possible to overcome the problem of a decline in the potential at a particular power supply line to an extreme level, and independent operation becomes possible for each bank.

In the 10th embodiment as well, it becomes possible to supply a low voltage by forming each supply voltage drop circuit between each of the power supply lines 211a, 212a, 211b, and 212b extending in the direction of the columns of the memory cells and each of the bonding pads for supplying potential to these power supply lines, as shown in FIG. 38. Further, if each bonding pad is formed in such a manner as to correspond to each of the power supply lines and the grounding lines extending in the direction of the columns of the memory cells, the power supplying capability can be further enhanced, and the power supply for each bank can be secured independently. Furthermore, if two power supply lines are connected to one bonding pad as shown in FIG. 39, the number of bonding pads formed can be reduced, so that the device can be made compact, and the functions of the device can be consolidated by making use of vacant spaces.

In addition, it becomes possible to supply power sufficiently to the respective banks if, as shown in the first to ninth embodiments, the power supply lines or the grounding lines arranged in parallel with the direction of the columns of the memory cells are arrayed such that, for example, the grounding lines are arranged with two adjacent power supply lines placed therebetween.

12th Embodiment

Figure 41:
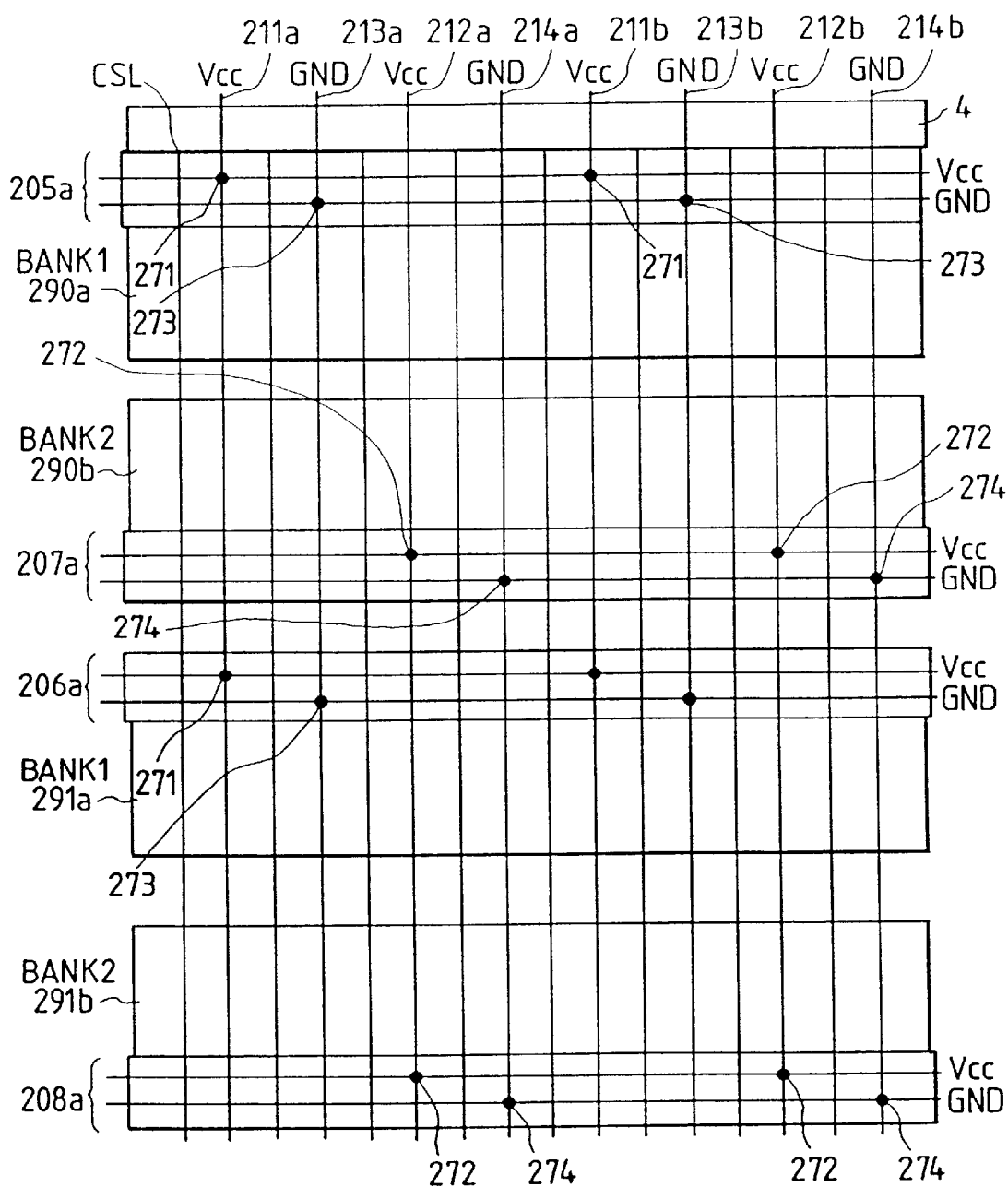
FIG. 41 shows a semiconductor storage device according to a twelfth embodiment of the invention.

Next, referring to FIG. 41, a description will be given of a still further embodiment. Two banks are formed in the structures of the synchronous DRAMs shown in the 10th and 11th embodiments, and each of the banks is structured as one assembly of memory cells grouped together. In this embodiment, however, even in the case where two banks are formed, each of the banks is divided into sub-banks, i.e., first sub-banks 290a and 291a belonging to the first bank and second sub-banks 290b and 291b belonging to the second bank. As these first and second sub-banks 290a, 291a, 290b, and 291b are arranged such that the first bank and the second bank alternate, it is possible to arrange the memory cell array uniformly for the banks.

If one power supply line extending in the direction of the columns of the memory cells is connected to either the first sub-bank 290a or 291a, the power supply line formed adjacent to this power supply line is connected to either of the second sub-banks 290b and 291b via the through hole so as to supply power. Hence, power can be supplied uniformly in the same way as the layout of the memory cell array.

Further, as shown in FIGS. 38 and 39, stepped-down potential can be supplied by forming a supply potential drop circuit between the bonding pad and the power supply line. Additionally, a plurality of power supply lines may be connected to one bonding pad so as to supply power to the respective banks.

In addition, it becomes possible to supply power sufficiently to the respective banks if, as shown in the first to ninth embodiments, the power supply lines or the grounding lines arranged in parallel with the direction of the columns of the memory cells are arrayed such that, for example, the grounding lines are arranged with two adjacent power supply lines placed therebetween.

13th Embodiment

Figure 42A:
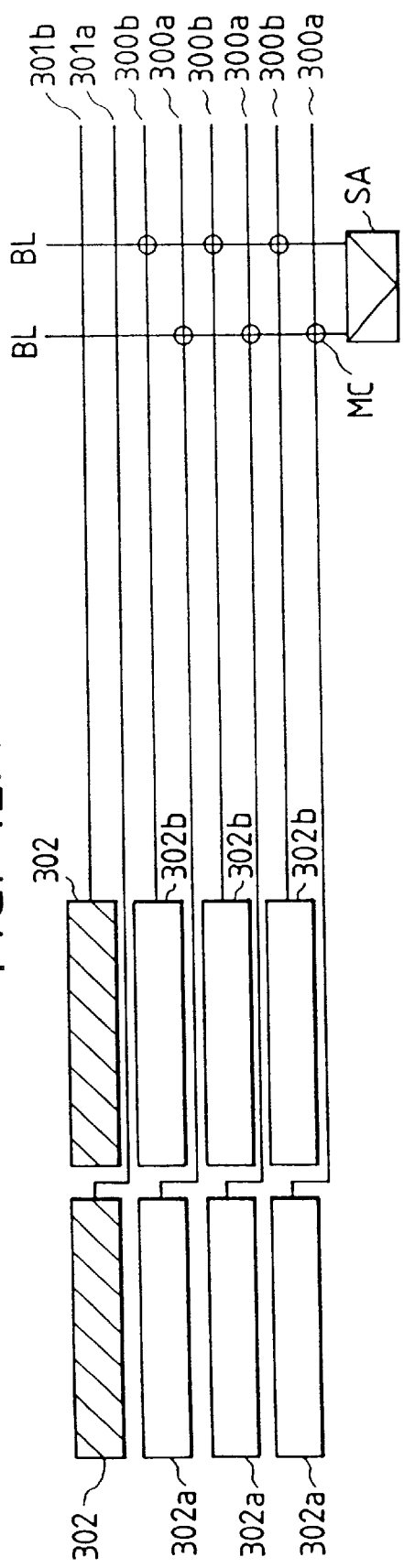
FIGS. 42A and 42B show a semiconductor storage device according to a thirteenth embodiment of the invention.

A description will be given of a further embodiment concerning the ordinary word line shunt system and the word line division system. In a case where a defect has occurred to a word line among the word lines formed on the memory cell array, a technique is employed in which the defective word line is disconnected and is reconnected to a spare word line so as to salvage the defective word line. As shown in FIG. 42A, spare word lines 301a and 301b are formed in advance in parallel with ordinary word lines 300a and 300b at the time of formation of the word lines 300a and 300b. Word line driver circuits 302a and 302b are each formed at one predetermined ends of the ordinary word lines 300a and 300b, while spare word line driver circuits 302 are each formed at one predetermined ends of the spare word lines 301a and 301b. In a case where the word line driver circuits 302a and 302b are each formed at one ends of the ordinary word lines 300a and 300b, these word line driver circuits 302a and 302b are respectively connected regularly to the spare word line driver circuits 302 located in the first and second rows, perpendicularly to the direction in which the word lines 300a and 300b extend. Accordingly, in the light of the layout of the spare word line driver circuits 302, two kinds of the long spare word line 301a and the short spare word line 301b have been conventionally formed, so that the conventional spare word line 301b is formed with the same length as the ordinary short word line (300b).

Figure 42B:
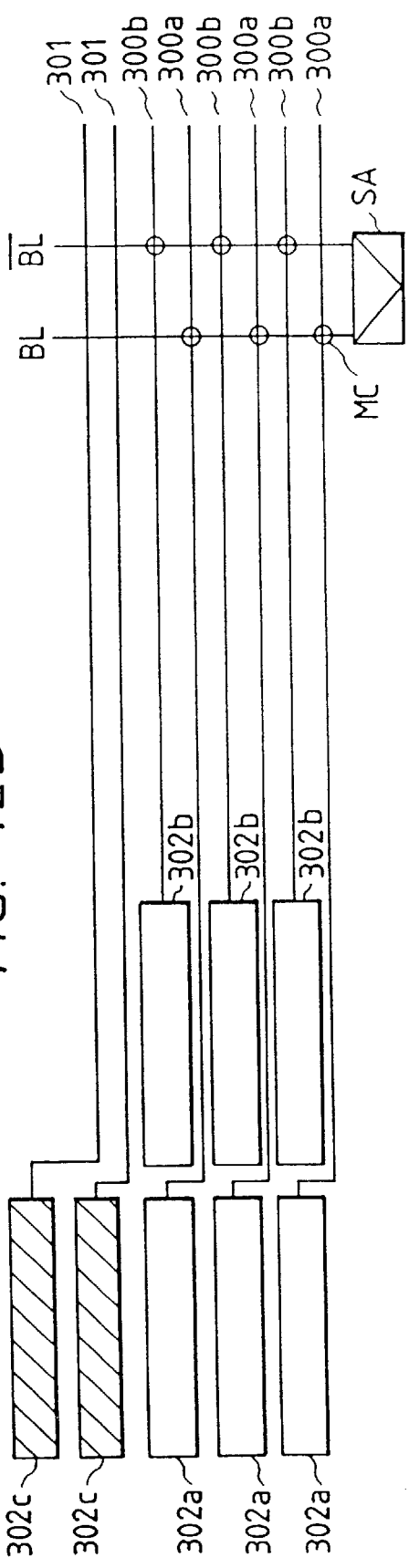

In FIG. 42B, which illustrates an embodiment of the present invention, the ordinary long word lines 300a and short word lines 300b are arranged alternately, the word line driver circuits 302a and 302b are each connected to one ends of the word lines 300a and 300b. The word line driver circuits 302a are arranged by being juxtaposed in a direction perpendicular to the direction in which the word lines extend. Each word line driver circuit 302a connected to the long word line 300a is disposed adjacent to each word line driver circuit 302b connected to the short word line 300b.

Spare word line driver circuits 302c, which are each formed at one ends of the spare word lines 301, are juxtaposed in a direction perpendicular to the direction in which the word lines extend. Since each of the spare word lines 301 thus arranged has the same length as the long word line 300a, the distance from the memory cell formed at the other end of the long word line 300a to the driver circuit and the distance from the memory cell formed at the other end of the spare word line 301 to the driver circuit are set at maximum distances. Thus, the memory cell which is connected to the spare word line driver circuit 302c via the spare word line 301 and is located at a farthest point from the driver circuit 302c can operate at the same timing as the memory cell which is connected to the word line driver circuit 302a via the long word line 300a and is located at a farthest point from the driver circuit 302a. Accordingly, the setting of timing can be facilitated at the circuit design stage, thereby making it possible to prevent a malfunctioning due to variations in the selecting or nonselecting timing of the ordinary word lines and the spare word lines.

14th Embodiment

Figure 43A:
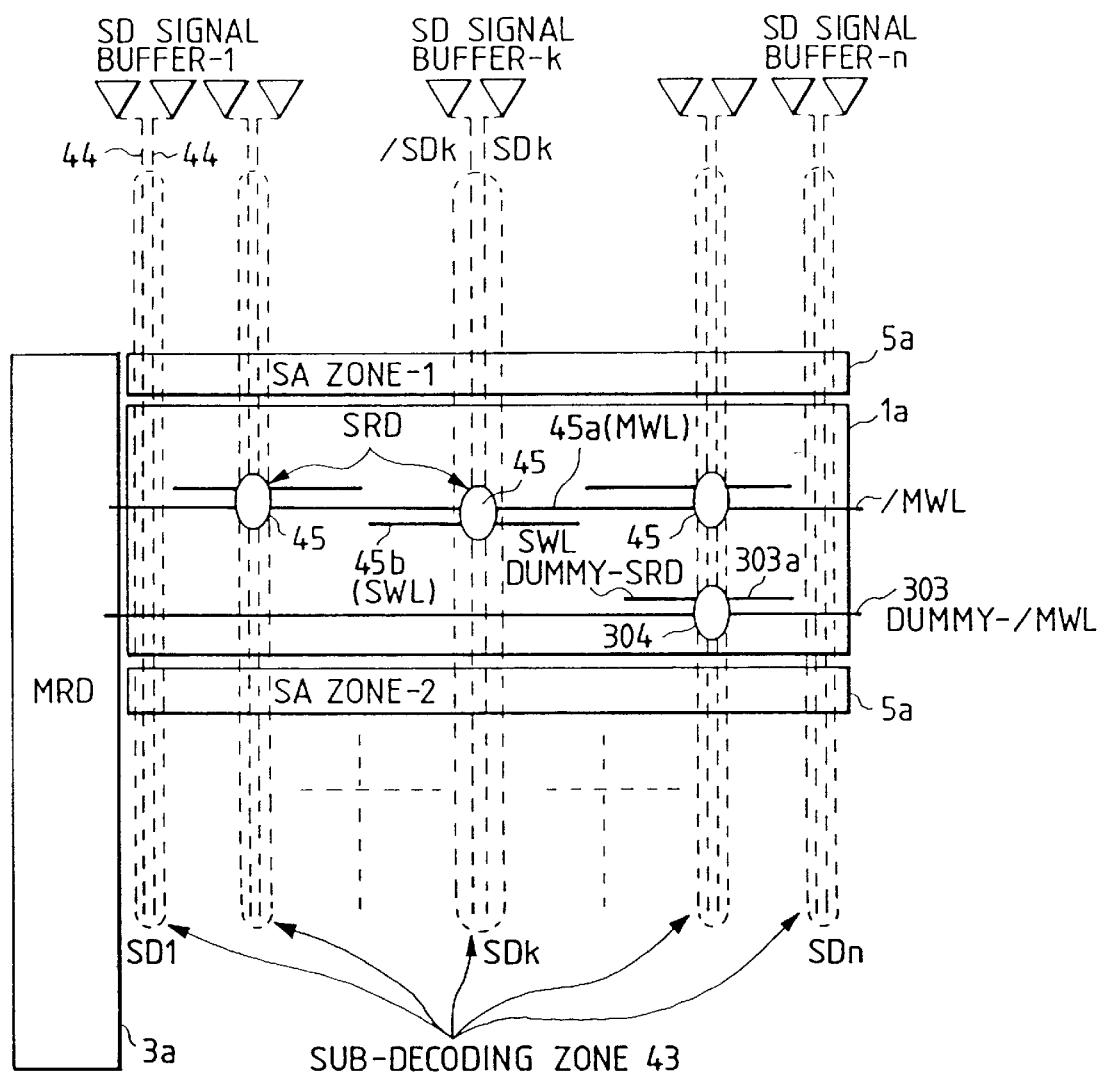
FIGS. 43A and 43B show a semiconductor storage device according to a fourteenth embodiment of the invention.

FIG. 43A shows an embodiment concerning dummy word lines in the case of the word line division system. In FIG. 43A, reference numeral 303 denotes a dummy main word line formed in the memory cell sub-array 1a in the same way as a main word line 45a. Numeral 303a denotes a dummy sub-word line formed by being branched off from the dummy main word line 303 in a sub-decoding circuit 304 formed on the dummy main word line 303. The other reference numerals which are the same as those already used denote identical or corresponding portions.

Conventionally, there have been cases where the timings at which the sense amplifiers are activated in the operation of the memory cell array are determined independently without being related to the word line structure. In such cases, time lags can occur among the word lines due to variations occurring in the processing steps, thereby giving rise to the phenomenon in which the sense timing is too early or late. In the case of DRAMs, in particular, a too early sense timing can lead to a malfunctioning and therefore constitutes a problem.

Figure 46:
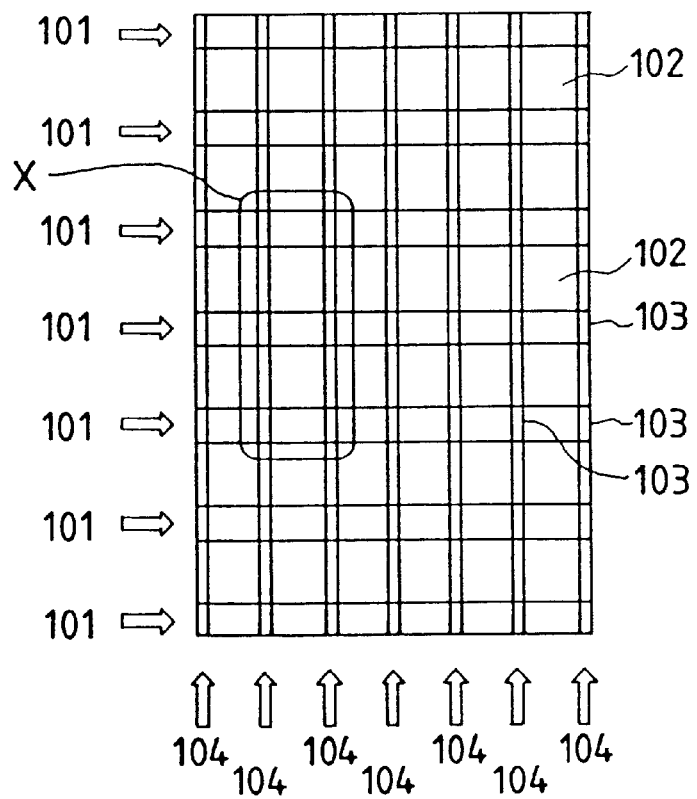
FIG. 46–49 shows a conventional semiconductor storage device.
Figure 47:
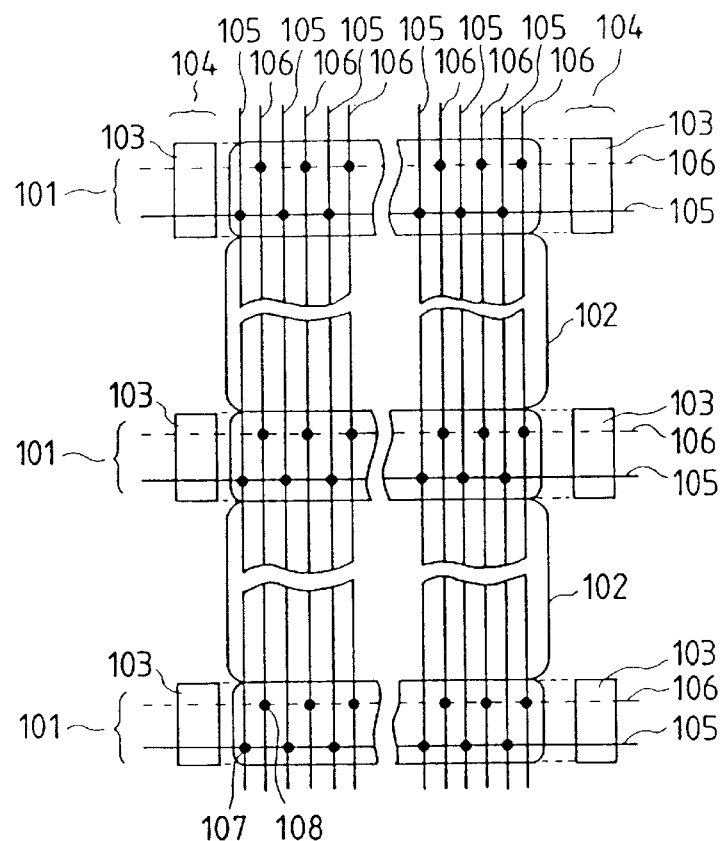

Accordingly, as shown in FIG. 43A, the dummy main word line 303 for generating timings for activating the sense amplifiers is formed in the same way as the ordinary main word line 45a. The dummy sub-word line 303a is provided by being branched off from the dummy main word line 303 in the sub-decoding circuit 304 formed on the dummy main word line 303. This dummy sub-word line 303a is in such a manner as to be activated simultaneously when any of the memory cells in the same memory cell sub-array 1a is activated. In addition, a sense-signal generating circuit 305 (shown in FIG. 46(b)) formed at an end of the dummy sub-word line 303a monitors a word line signal delay, and generates a sense-amplifier activation signal.

Figure 43B:
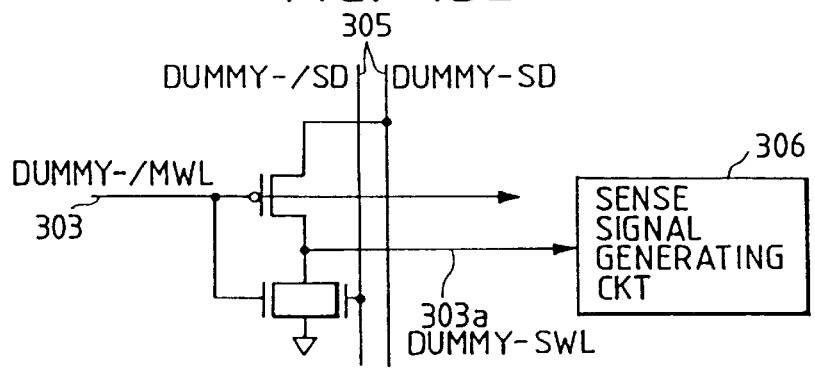

In FIG. 43B, reference numeral 305 denotes a sub-decoding signal line for transmitting a sub-decoding signal. Upon receiving the sense-amplifier activation signal from the sense-signal generating circuit 306, the sense amplifier connected to the memory cell located at the designated address can be activated. Accordingly, it is possible to overcome the problem of the sense timing which occurred in the operation of the conventional DRAMs in which the timings for activating the sense amplifiers are set independently of the word line characteristics, particularly the problem of the sense timing being too early, thereby making it possible to constantly effect the sensing operation at optimum timings.

15th Embodiment

Figure 44A:
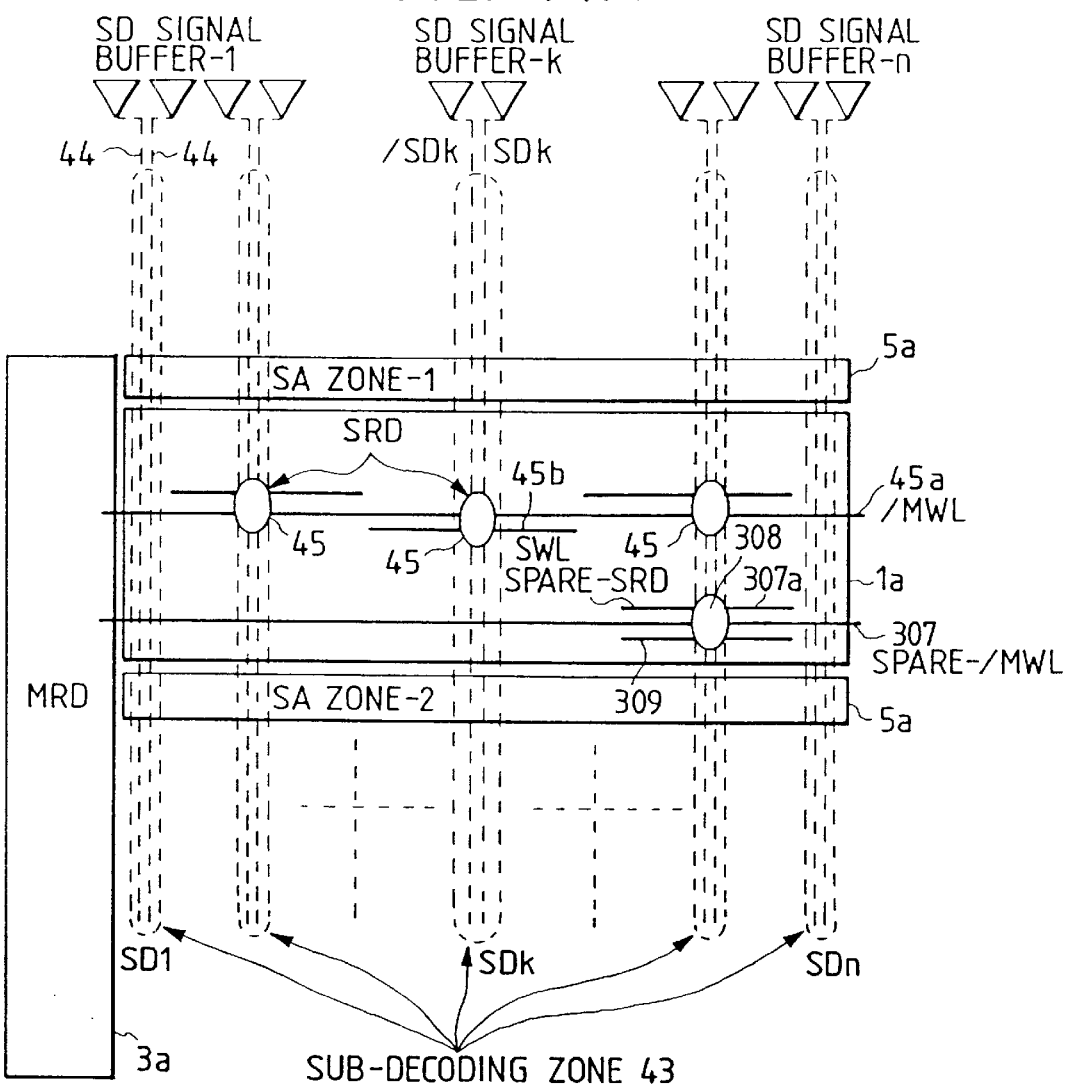
FIGS. 44A–45 show a semiconductor storage device according to a fifteenth embodiment of the invention.
Figure 44B:
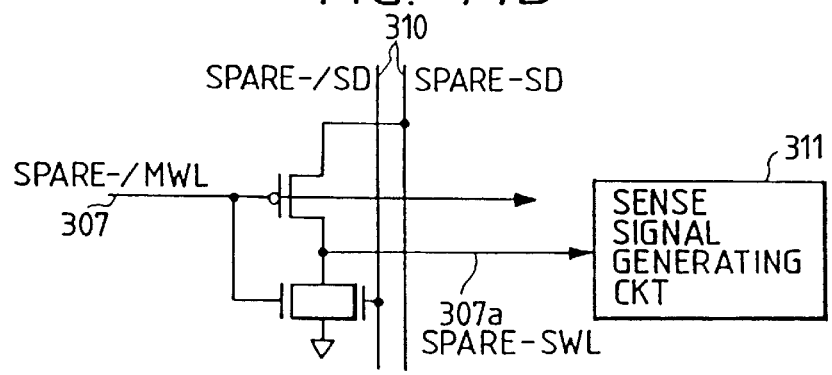

FIG. 44A is a schematic diagram of a semiconductor storage device having a spare main word line 307 formed in the same way as the main word line 45a so as to extend in the direction of the row of the memory cell sub-array 1a, i.e., an assembly of the memory cells arranged in the directions of the rows and columns; a plurality of spare sub-word lines 307a branched off from each of sub-decoding circuits 308 provided on the spare main word line 307; and a dummy sub-word line 309 branched off from a predetermined sub-decoding circuit 308 and arranged in parallel with the spare sub-word line 307a. The sub-decoding circuit 308 in terms of its configuration has a structure shown in FIG. 44B. In this drawing, numeral 310 denotes a sub-decoding signal line for transmitting a sub-decoding signal. The other reference numerals which are used in the drawing and are the same as those already used denote identical or corresponding portions.

Figure 45:
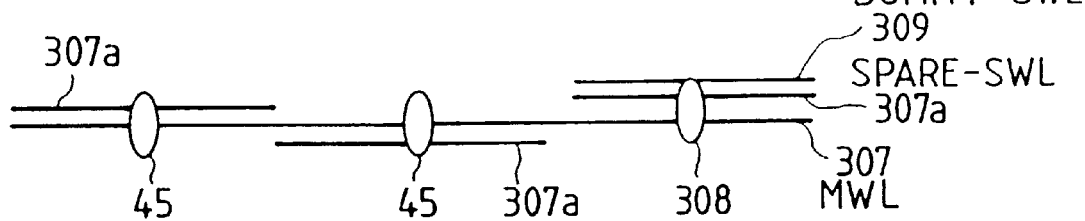

In this semiconductor storage device, there are a plurality of spare main word lines 307 in one chip. As shown in FIG. 45, the plurality of spare sub-word lines 307a are formed by being branched off from one of the spare main word lines 307, and one dummy sub-word line 309 extends in parallel with one of the spare sub-word lines 307a. At least one dummy sub-word line 309 is formed in one chip. This dummy sub-word line 309 is not directly connected to any of the memory cells in the chip, and when a memory cell in the chip is selected, the dummy sub-word line 309 is always activated simultaneously. A sense-signal generating circuit 311 formed at an end of the dummy sub-word line 309 monitors a word line signal delay, and after confirming the activation of the word line, the sense-signal generating circuit 311 generates a sense signal for activating the sense amplifier. Since one dummy sub-word line 309 for monitoring the word line delay is formed for one spare main word line 307, it is possible to obtain a word line combining a spare word line and a dummy word line. Consequently, it is possible to improve the accuracy of the semiconductor storage device with a smaller number of constituent lines.

In addition, in the case of a semiconductor storage device having a plurality of banks which can be operated simultaneously as in the case of the synchronous DRAM, it is necessary to form one dummy sub-word line for one bank in order to monitor the word line delay for each bank. Even in the case of such a semiconductor storage device having a plurality of banks capable of being operated simultaneously, it is possible to provide the word line which combines the spare word line and the dummy word line. Consequently, it is possible to improve the accuracy of the semiconductor storage device with a smaller number of constituent lines.

What is claimed is:

1. A semiconductor storage device comprising:
   a memory cell block in which a plurality of memory cells are arranged in row and column directions;
   a sense amplifier block including sense amplifiers for sensing and amplifying data of the memory cells, a plurality of said sense amplifiers simultaneously operating for writing data, said sense amplifiers being divided into groups of sense amplifiers; and
   a driver transistor formed in the sense amplifier block and connected between a power supply line extending along the row direction and one of the groups of sense amplifiers,
      wherein only one sense amplifier in said one of the groups belongs to said plurality of said sense amplifiers.

2. The semiconductor storage device according to claim 1, further comprising:
   sense amplifier drive lines arranged in the sense amplifier block,
      wherein of the sense amplifiers connected to one of the sense amplifier drive lines, only one sense amplifier belongs to said plurality of said sense amplifiers.

3. A semiconductor storage device comprising:
   a memory cell block in which a plurality of memory cells are arranged in row and column directions;
   a sense amplifier block including sense amplifiers for sensing and amplifying data of the memory cells, a plurality of said sense amplifiers simultaneously operating for writing data, said sense amplifiers being divided into groups of sense amplifiers; and
   a driver transistor formed in the sense amplifier block and connected between a power supply line and one of the groups of sense amplifiers,
      wherein only one sense amplifier in said one of the groups belongs to said plurality of said sense amplifiers.

4. A semiconductor storage device comprising:
   a memory cell block in which a plurality of memory cells are arranged in row and column directions;
   a sense amplifier block including sense amplifiers for sensing and amplifying data of the memory cells, a plurality of said sense amplifiers simultaneously operating for writing data; and
   sense amplifier drive lines arranged in the same amplifier block,
      wherein of the sense amplifiers connected to one of the sense amplifier drive lines, only one sense amplifier belongs to said plurality of said sense amplifiers.

* * * * *